United States Patent
Yamazaki et al.

(10) Patent No.: US 9,947,700 B2
(45) Date of Patent: Apr. 17, 2018

(54) IMAGING DEVICE AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Hajime Kimura, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 15/422,819

(22) Filed: Feb. 2, 2017

(65) Prior Publication Data

US 2017/0221943 A1    Aug. 3, 2017

(30) Foreign Application Priority Data

Feb. 3, 2016   (JP) .................................. 2016-019266
Feb. 5, 2016   (JP) .................................. 2016-020908

(51) Int. Cl.
  *H01L 27/146*     (2006.01)
  *H01L 29/786*     (2006.01)

(52) U.S. Cl.
  CPC .. *H01L 27/14603* (2013.01); *H01L 27/14616* (2013.01); *H01L 27/14634* (2013.01); *H01L 27/14636* (2013.01); *H01L 27/14645* (2013.01); *H01L 27/14621* (2013.01); *H01L 27/14627* (2013.01); *H01L 29/7869* (2013.01)

(58) Field of Classification Search
  CPC ......... H01L 27/14603; H01L 27/14645; H01L 27/14636; H01L 27/14616; H01L 27/14634; H01L 27/14627; H01L 27/14621; H01L 29/7869
  See application file for complete search history.

(56) References Cited

U.S. PATENT DOCUMENTS

| | | | |
|---|---|---|---|
| 7,674,650 B2 | 3/2010 | Akimoto et al. | |
| 8,378,391 B2 | 2/2013 | Koyama et al. | |
| 8,901,557 B2 | 12/2014 | Yamazaki | |
| 9,368,541 B2 | 6/2016 | Kurokawa et al. | |
| 9,401,382 B2 | 7/2016 | Sekine et al. | |
| 9,450,133 B2 | 9/2016 | Nakamura et al. | |
| 2009/0101948 A1* | 4/2009 | Park .................. | H01L 27/14609 257/292 |

FOREIGN PATENT DOCUMENTS

| | | |
|---|---|---|
| JP | 2007-096055 A | 4/2007 |
| JP | 2007-123861 A | 5/2007 |
| JP | 2011-119711 A | 6/2011 |

* cited by examiner

*Primary Examiner* — David Vu
(74) *Attorney, Agent, or Firm* — Husch Blackwell LLP

(57) ABSTRACT

A three-dimensionally integrated imaging device is provided. The imaging device includes a first layer that includes a first transistor including a metal oxide in a channel formation region, a first insulating layer, and a second insulating layer, and a second layer that includes a photodiode. A conductive layer in contact with the metal oxide is electrically connected to one of a cathode and an anode of the photodiode via a conductor that penetrates the first insulating layer and the second insulating layer.

18 Claims, 41 Drawing Sheets

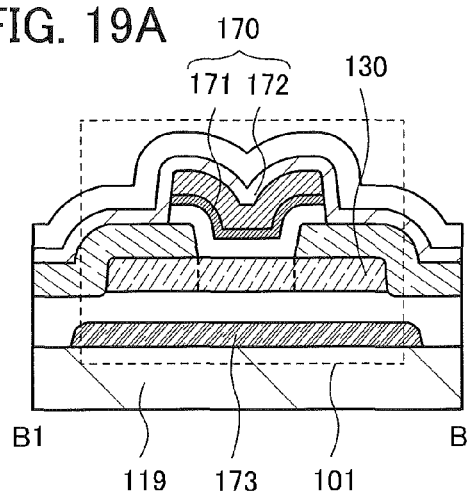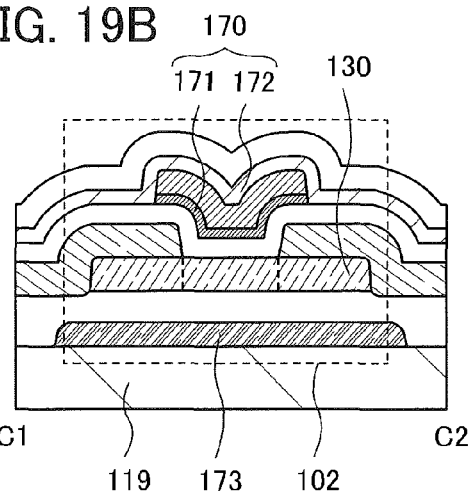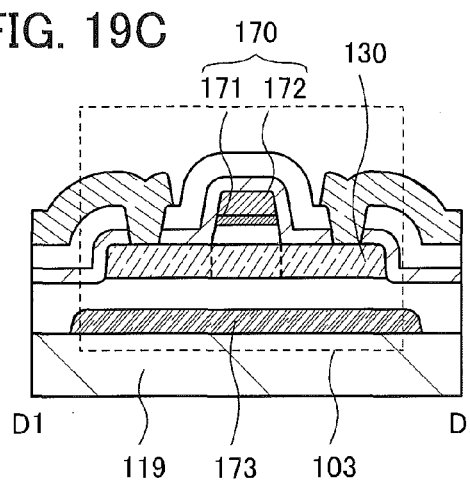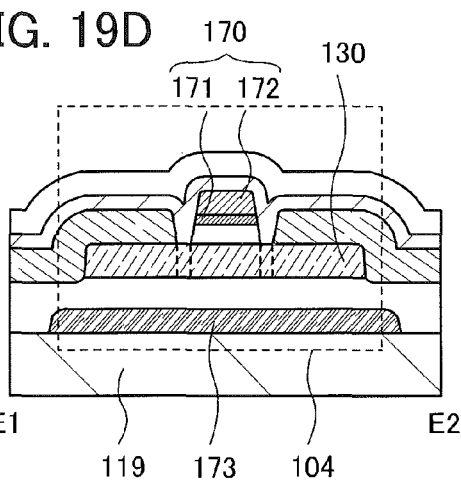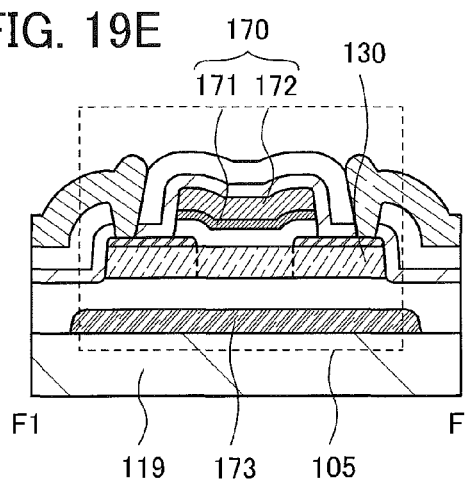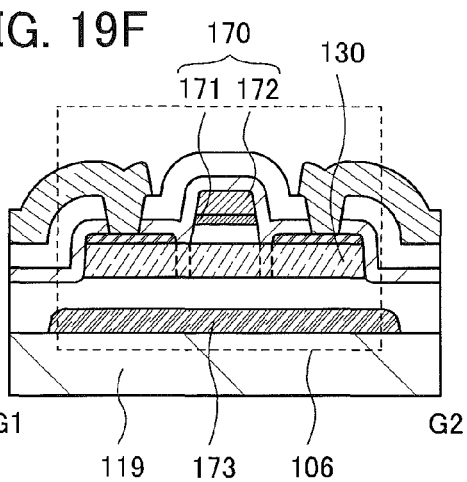

120,119    130

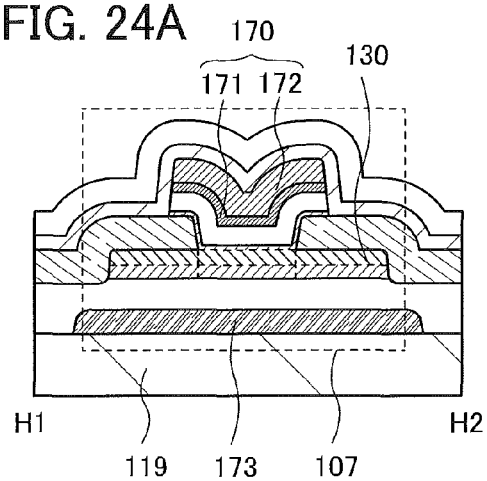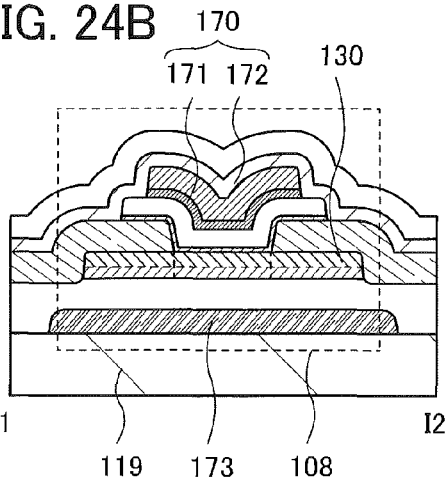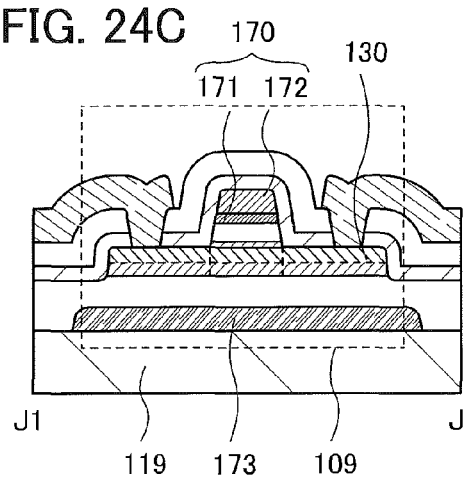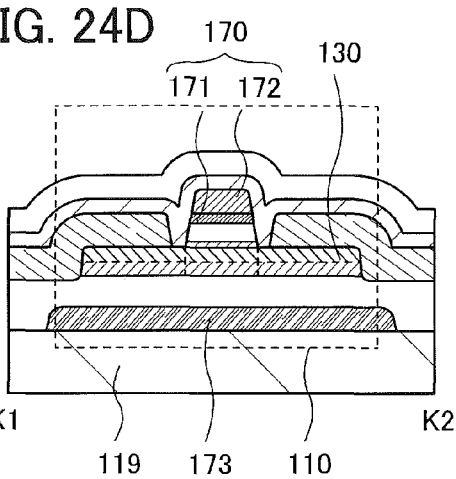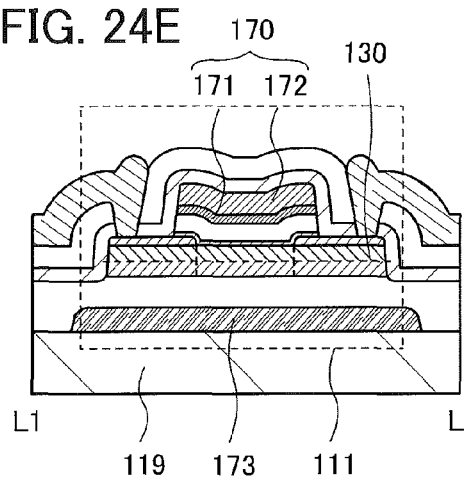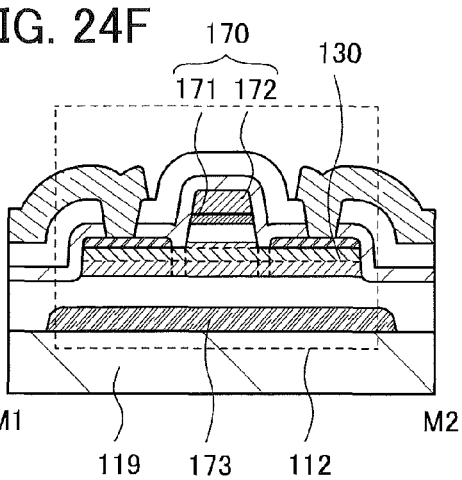

FIG. 26A
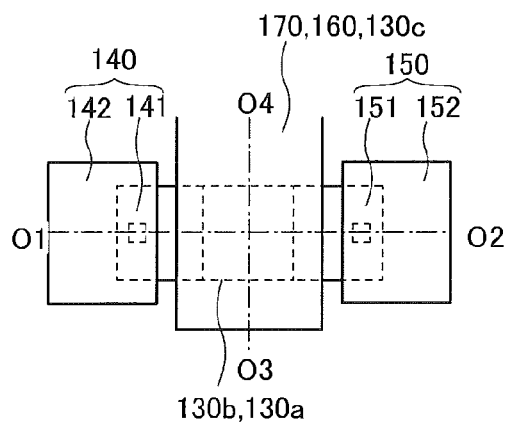
FIG. 26B
FIG. 26C
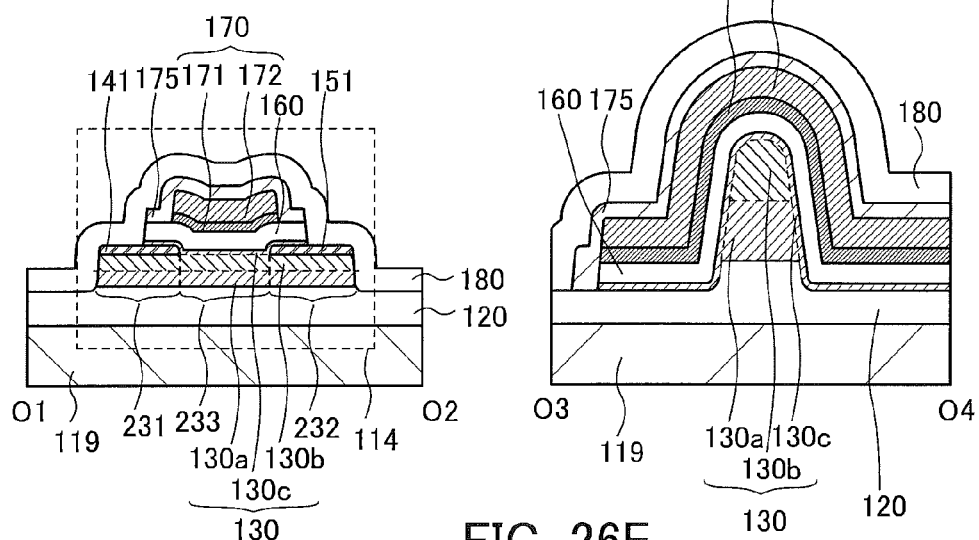
FIG. 26D
FIG. 26E
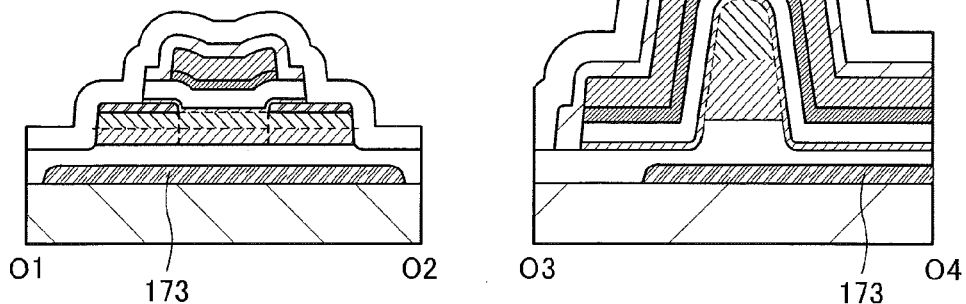

FIG. 27A
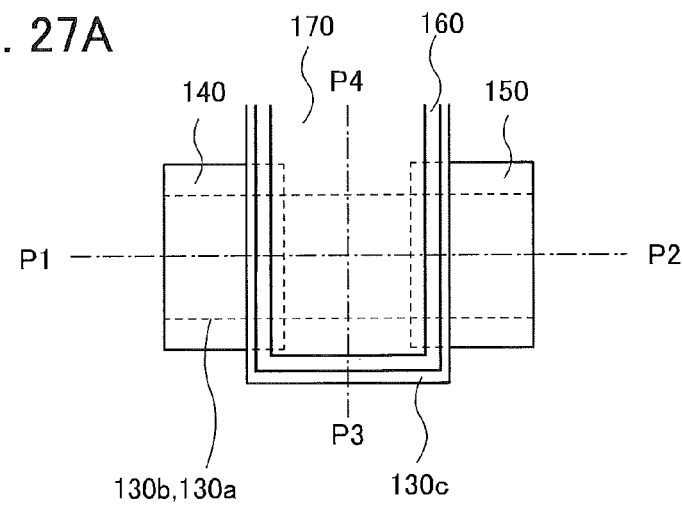
FIG. 27B
FIG. 27C
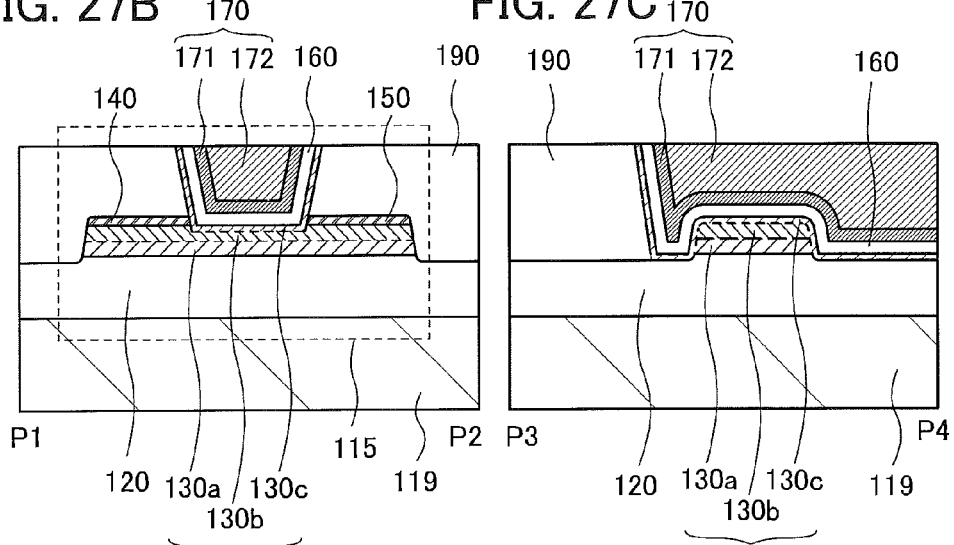
FIG. 27D
FIG. 27E
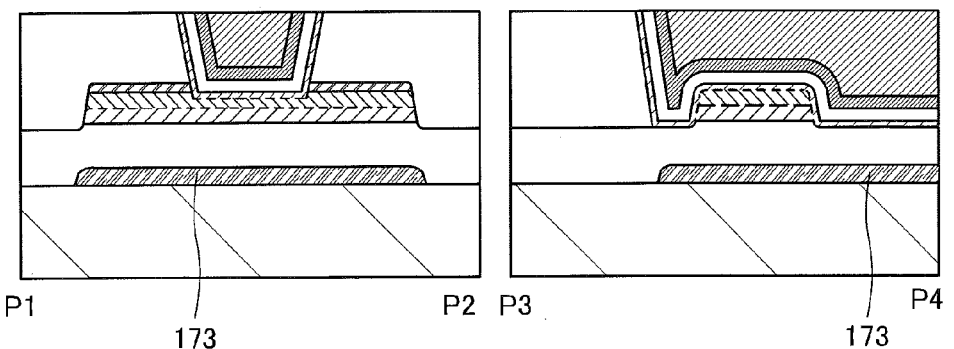

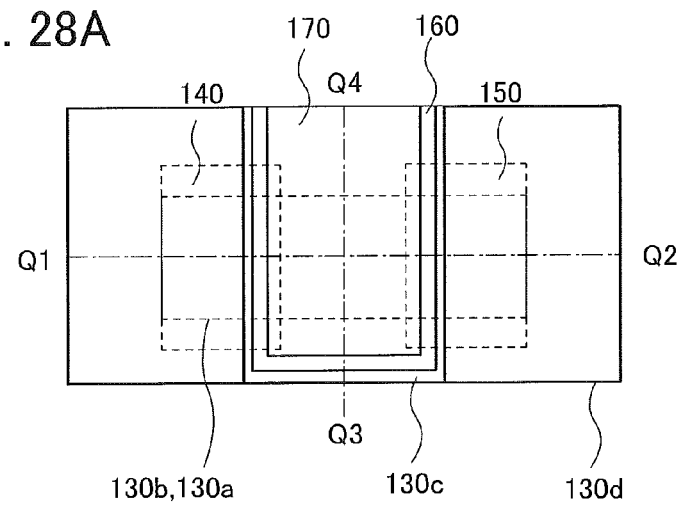
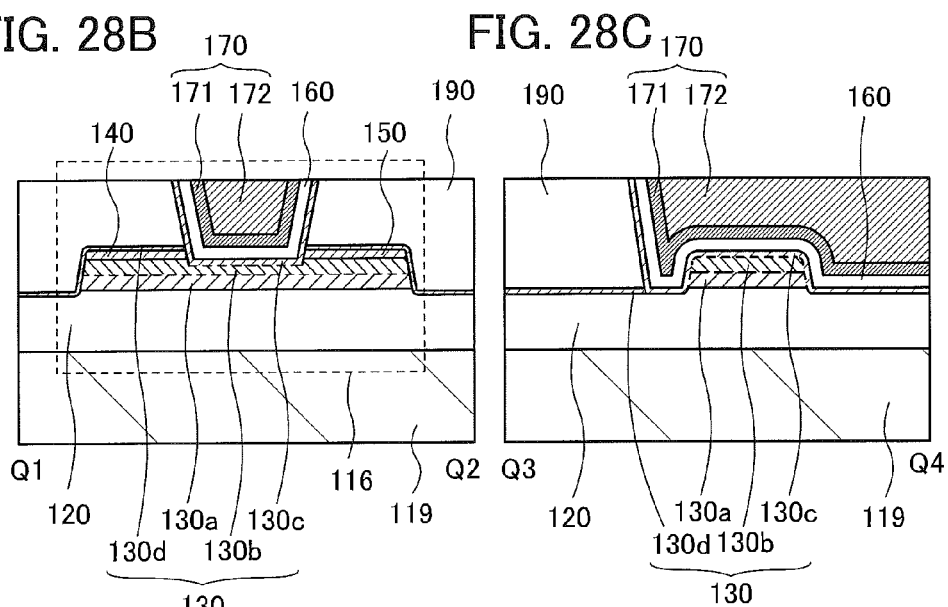
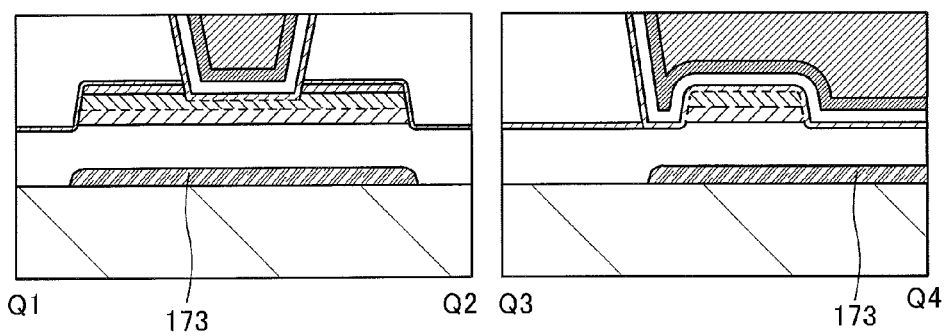

Crystal structure of InMZnO₄

FIG. 37A
FIG. 37B
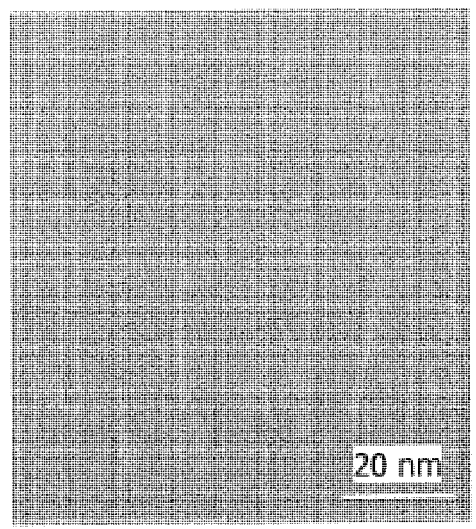
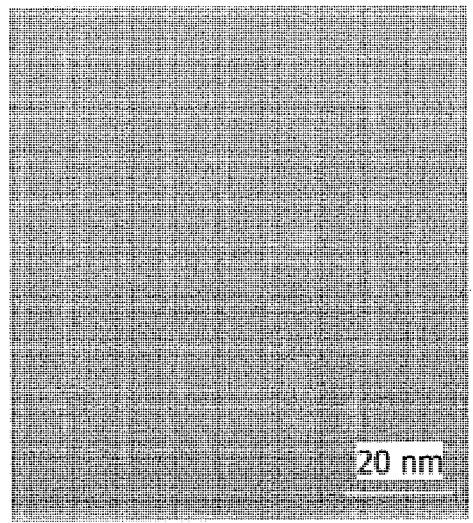

IMAGING DEVICE AND ELECTRONIC DEVICE

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

An oxide semiconductor has attracted attention as a semiconductor material applicable to the transistor. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119711

SUMMARY OF THE INVENTION

A semiconductor integrated circuit with high density and large capacitance has been developed; meanwhile, miniaturization of the semiconductor integrated circuit is required. Thus, two-dimensional integration has been shifted to three-dimensional integration. Although a manufacturing process of three-dimensional integration structure may be complicated, the degree of freedom of the materials and the design rule of layers can be increased. Therefore, a high-functional semiconductor integrated circuit that is difficult to be manufactured by two-dimensional integration can be manufactured.

A pixel circuit of an imaging device includes a photoelectric conversion element and a transistor for controlling the photoelectric conversion element. High photosensitivity is required for the photoelectric conversion element, and a low off-state current is required for the transistor so that noise can be reduced. By integrating the photoelectric conversion element and the transistor three-dimensionally and performing a manufacturing step using materials suitable for the photoelectric conversion element and the transistor, an imaging element with higher performance can be manufactured.

For example, a photodiode including a photoelectric conversion layer in a silicon substrate has high photosensitivity and thus is suitable for an imaging device; however, there is a problem in that a transistor formed in the same silicon substrate has relatively high off-state currents.

In view of the above, an object of one embodiment of the present invention is to provide an imaging device having a three-dimensional integration structure. Another object is to provide an imaging device that includes a photodiode provided in a silicon substrate and a transistor including an oxide semiconductor. Another object is to provide an imaging device capable of taking an image with little noise. Another object is to provide an imaging device with high resolution. Another object is to provide an imaging device with a high aperture ratio. Another object is to provide an imaging device that can be used in a wide temperature range. Another object is to provide an imaging device with high reliability. Another object is to provide a novel imaging device or the like.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is an imaging device including a first layer and a second layer. The first layer includes a first transistor including a metal oxide in a channel formation region, a first insulating layer, and a second insulating layer. The first transistor is provided between the first insulating layer and the second insulating layer. The first transistor includes a first conductive layer in contact with the metal oxide. The second layer includes a photodiode. The first conductive layer is electrically connected to one of a cathode and an anode of the photodiode via a conductor that penetrates the first insulating layer and the second insulating layer.

In the above embodiment, the photodiode may be formed in a single crystal silicon substrate.

In the above embodiment, the imaging device may include a third layer. The third layer includes a third insulating layer, a fourth insulating layer, and a second transistor including silicon in a channel formation region. The first transistor and the second transistor are placed so that a top surface of a gate of the first transistor faces a top surface of a gate of the second transistor. A second conductive layer is provided to have a region embedded in the third insulating layer. A source, a drain, or a gate of the second transistor is electrically connected to the second conductive layer via a conductor that penetrates the fourth insulating layer. A third conductive layer is provided on the light-receiving surface side of the photodiode in the single crystal silicon substrate. The second conductive layer is electrically connected to the third conductive layer via a conductor that penetrates the first to third insulating layers and the single crystal silicon substrate.

In the above embodiment, the first conductive layer may be electrically connected to the one of the cathode and the anode of the photodiode via the conductor that penetrates the first insulating layer, the metal oxide and the second insulating layer.

In the above embodiment, the first layer may include the first transistor, the second transistor, a third transistor, a fourth transistor, a first wiring, and a second wiring. The first transistor may be in a pixel circuit. The second transistor may be in a row driver. The third transistor may be in a column driver. The fourth transistor may be in an analog switch. A metal oxide may be included in a channel formation region of each of the second to fourth transistors.

In the above embodiment, an A/D converter may be included and the analog switch may be electrically connected to the first wiring. The analog switch may be electrically connected to the second wiring. The first wiring may be electrically connected to the pixel circuit. The second wiring may be electrically connected to the A/D converter. The A/D converter may include a transistor including silicon in a channel formation region.

In the above embodiment, the metal oxide may include In, Zn, and M (M is Al, Ga, Y, or Sn).

A module including the imaging device of one embodiment of the present invention and a lens is another embodiment of the present invention.

An electronic device including the imaging device of one embodiment of the present invention and a display device is another embodiment of the present invention.

One embodiment of the present invention can provide an imaging device having a three-dimensional integration structure. An imaging device that includes a photodiode provided in a silicon substrate and a transistor including an oxide semiconductor can be provided. An imaging device capable of taking an image with little noise can be provided. An imaging device with high resolution can be provided. An imaging device with a high aperture ratio can be provided. An imaging device that can be used in a wide temperature range can be provided. An imaging device with high reliability can be provided. A novel imaging device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

FIGS. 19A to 19F illustrate cross sections of transistors in the channel length direction.

FIGS. 24A to 24F illustrate cross sections of transistors in the channel length direction.

FIGS. 26A to 26E are a top view and cross-sectional views illustrating transistors.

FIGS. 27A to 27E are a top view and cross-sectional views illustrating transistors.

FIGS. 28A to 28E are a top view and cross-sectional views illustrating transistors.

FIGS. 37A and 37B are cross-sectional TEM images of an a-like OS.

DETAILED DESCRIPTION OF THE INVENTION

Figure 1A:
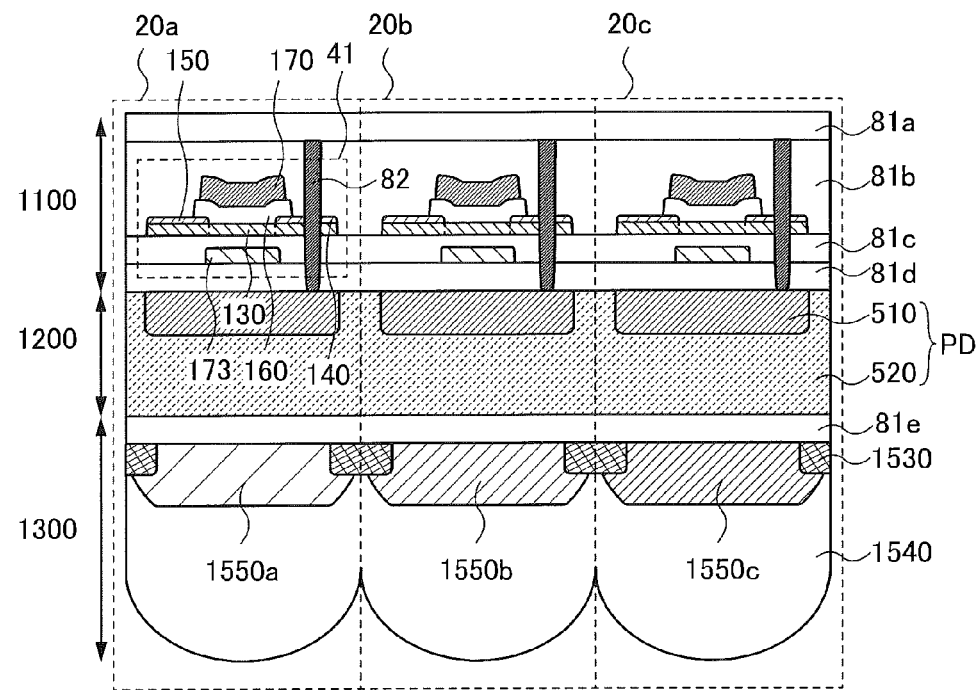
FIG. 1A illustrates a pixel of an imaging device.

Embodiments are described in detail with reference to the drawings. Note that the present invention is not limited to the following description and it is readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers that specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

Examples of the case where X and Y are electrically connected include the case where one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

Examples of the case where X and Y are functionally connected include the case where one or more circuits that allow functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expression include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least a first connection path on which Z1 is provided, the first connection path does not include a second connection path, the second connection path includes a connection path on which the transistor is provided, a drain (or a second terminal or the like) of the transistor is electrically connected to Y through at least a third connection path on which Z2 is provided, and the third connection path does not include the second connection path". Another examples of the expression include "a source (or a first terminal or the like) of a transistor is electrically connected to X through at least a first connection path on which Z1 is provided, the first connection path does not include a second connection path, the second connection path is a path between the source (or the first terminal or the like) and a drain (or a second terminal or the like) of the transistor, the drain (or the second terminal or the like) of the transistor is electrically connected to Y through at least a third connection path on which Z2 is provided, the third connection path does not include a fourth connection path, and the fourth connection path is a path between the drain (or a second terminal or the like) and the source (or the first terminal or the like) of the transistor. When the connection order in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (a voltage) is relative and is determined depending on the amount relative to a reference potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, a structure of an imaging device that is one embodiment of the present invention is described.

One embodiment of the present invention is an imaging device that includes a photoelectric conversion element and a transistor. By integrating the photoelectric conversion element and the transistor three-dimensionally and performing a manufacturing step using materials suitable for the photoelectric conversion element and the transistor, an imaging element with higher performance can be manufactured.

FIG. 1A is a cross-sectional view of a pixel 20 included in the imaging device of one embodiment of the present invention. The structure of three pixels (pixels 20a, 20b, and 20c) is shown in FIG. 1A.

Figure 1B:
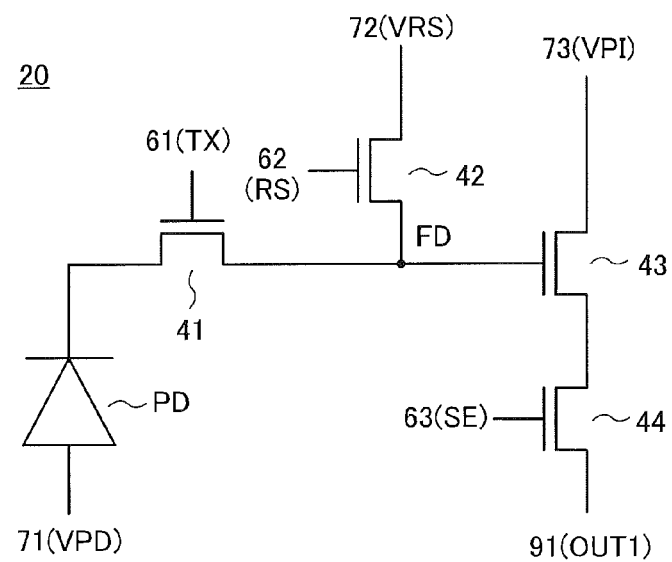
FIG. 1B is a circuit diagram thereof.

FIG. 1B is a circuit diagram of the pixel 20. Note that an example in which transistors are n-channel transistors is shown in this embodiment; however, one embodiment of the present invention is not limited to this, and some transistors may be replaced with p-channel transistors.

As illustrated in FIG. 1B, one electrode of a photoelectric conversion element PD is electrically connected to one of a source and a drain of a transistor 41. The other of the source and the drain of the transistor 41 is electrically connected to one of a source and a drain of a transistor 42. The other of the source and the drain of the transistor 41 is electrically connected to a gate of a transistor 43. One of a source and a drain of the transistor 43 is electrically connected to one of a source and a drain of a transistor 44.

Figure 2A:
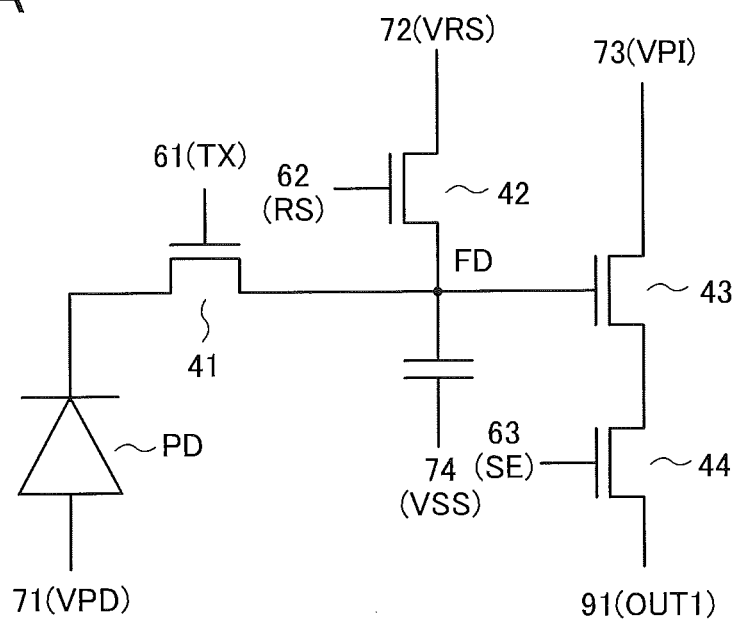
FIGS. 2A and 2B each illustrate a pixel circuit.

Here, a node FD to which the other of the source and the drain of the transistor 41, the one of the source and the drain of the transistor 42, and the gate of the transistor 43 are connected is a charge accumulation portion. Note that a capacitor may be connected to the node FD as illustrated in FIG. 2A.

The other electrode of the photoelectric conversion element PD is electrically connected to a wiring 71 (VPD). The other of the source and the drain of the transistor 42 is electrically connected to a wiring 72 (VRS). The other of the source and the drain of the transistor 43 is electrically connected to a wiring 73 (VPI). The other of the source and the drain of the transistor 44 is electrically connected to a wiring 91 (OUT1).

Note that the connection configuration between a component (e.g., a transistor or a photoelectric conversion element) and a wiring is an example. Components might be electrically connected to different wirings, or a plurality of components might be electrically connected to the same wiring.

The wiring 71 (VPD), the wiring 72 (VRS), and the wiring 73 (VPI) function as power supply lines. For example, the wiring 71 (VPD) functions as a low potential power supply line. The wiring 72 (VRS) and the wiring 73 (VPI) function as high potential power supply lines.

A gate of the transistor 41 is electrically connected to a wiring 61 (TX). A gate of the transistor 42 is electrically connected to a wiring 62 (RS). A gate of the transistor 44 is electrically connected to a wiring 63 (SE).

The wirings 61 (TX), 62 (RS), and 63 (SE) function as signal lines for controlling the conduction states of the transistors to which the respective wirings are connected.

The transistor 41 functions as a transistor for transferring the potential of a cathode of the photoelectric conversion element PD. The transistor 42 functions as a transistor for resetting the potential of the node FD. The transistor 43 functions as a transistor for outputting a signal corresponding to the potential of the node FD. The transistor 44 functions as a transistor for selecting the pixel 20.

Figure 2B:
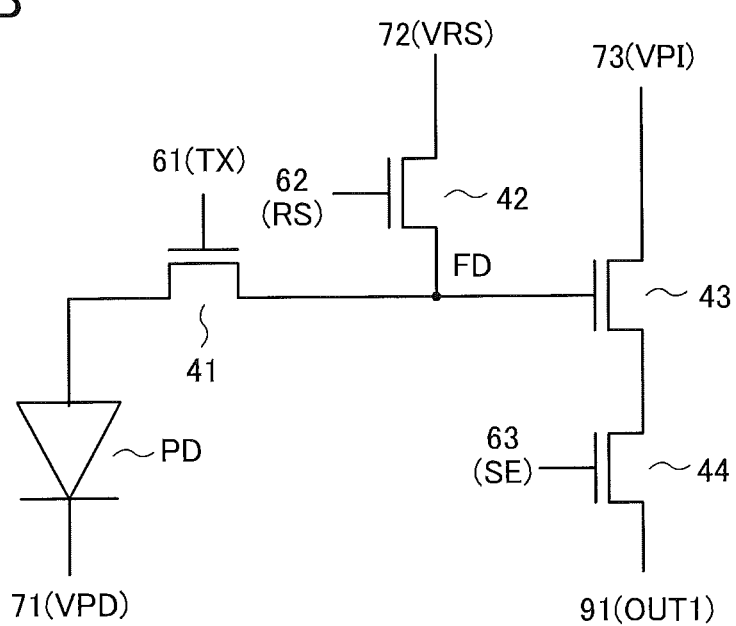

As illustrated in FIG. 2B, the direction of the photoelectric conversion element PD in the pixel 20 may be opposite to that in FIG. 1B. In this case, a region 510 can function as an anode (a p-type region) and a region 520 can function as a cathode (an n-type region). For example, an n-type single crystal silicon substrate is used, and the region 510 is made to be a p-type by adding a dopant such as boron to the region 510.

Note that the above structure of the pixel 20 is just an example, and some of the circuits, some of the transistors, some of the capacitors, some of the wirings, or the like are not included in some cases. Alternatively, a circuit, a transistor, a capacitor, a wiring, or the like that is not included in the above structure might be included. Alternatively, connection of some wirings might be different from the above connection.

As illustrated in FIG. 1A, the pixel 20 can include a layer 1100, a layer 1200, and a layer 1300. For example, the layer 1100 includes the transistors 41 to 44 in a pixel circuit, and the like. The layer 1200 includes the photoelectric conversion element PD and the like. The layer 1300 includes a color filter, a microlens array, and the like.

Note that as illustrated in a cross-sectional view described in this embodiment, insulating layers 81a to 81e, which each function as a protective film, an interlayer insulating film, or a planarization film, and the like are provided in the layers 1100 to 1300. For example, as each of the insulating layers 81a to 81e, an inorganic insulating film formed by a chemical vapor deposition (CVD) method or the like such as a silicon oxide film or a silicon oxynitride film can be used. Alternatively, an organic insulating film such as an acrylic resin film or a polyimide resin film may be used. Top surfaces of the insulating layers 81a to 81e and the like are preferably subjected to planarization treatment as necessary by a chemical mechanical polishing (CMP) method or the like.

The transistors 41 to 44 provided in the layer 1100 are each preferably a transistor in which an oxide semiconductor is included in a channel formation region (hereinafter, an OS transistor). The OS transistor has a lower off-state current than a transistor in which silicon is included in a channel formation region (hereinafter, a Si transistor). Thus, a global shutter system in which accumulation operation is performed in all the pixels at the same time can be used without a complicated circuit structure or a complicated operation method. Note that the imaging device of one embodiment of the present invention can also be operated in a rolling shutter system.

In this specification and the like, an oxide semiconductor may be referred to as a metal oxide.

The OS transistor has lower temperature dependence of change in electrical characteristics than the Si transistor, and thus can be used at an extremely wide range of temperatures. Therefore, an imaging device and a semiconductor device that include the OS transistors are suitable for use in automobiles, aircrafts, and spacecrafts.

Figure 3:
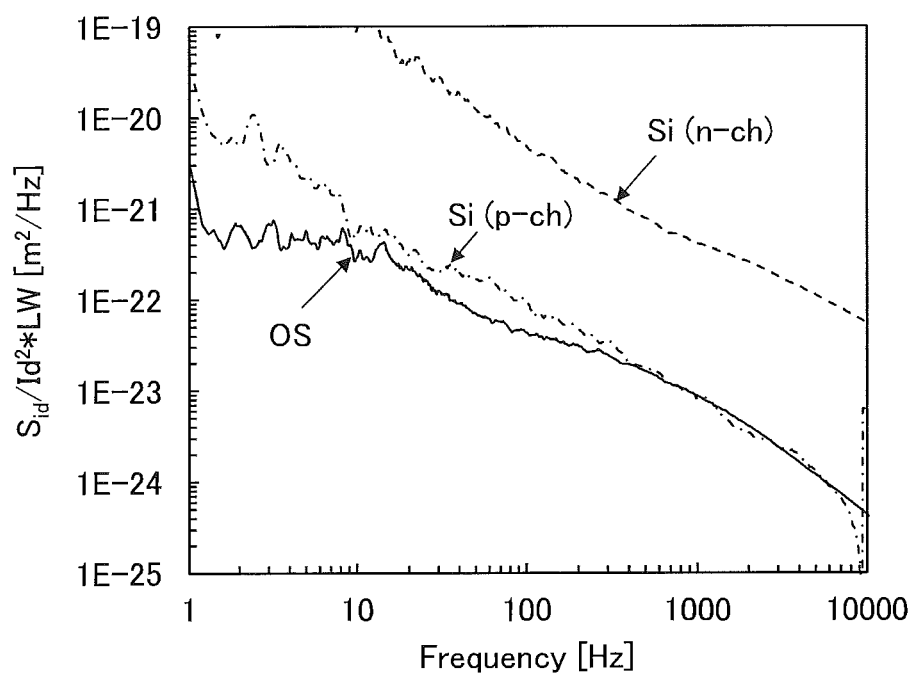
FIG. 3 shows the 1/f noise characteristics of an OS transistor.

The 1/f noise characteristics of the OS transistor are superior to those of the Si transistor. FIG. 3 shows the comparison data of the 1/f noise characteristics of an OS transistor, an n-channel (n-ch) Si transistor, and a p-channel (p-ch) Si transistor.

The vertical axis shows $S_{id}/Id^2 \cdot L \cdot W$ [m$^2$/Hz], which is a normalized value of the spectrum density of drain current by the drain current and the size of a channel of each of the transistors. The measurement is performed with a frequency between 1 Hz to 10 kHz. Note that L is a channel length of each of the transistors and W is a channel width of each of the transistors. In the OS transistor, L/W=30 nm/30 nm or L/W=30 nm/60 nm is satisfied. In the Si transistors, L/W=0.8 μm/10 μm is satisfied. The measurement conditions of the OS transistor are as follows: $V_d$=1.0 V and $I_d$=1 μA. The measurement conditions of the Si transistors are as follows: $V_d$=0.1 V and $I_d$=1 μA.

FIG. 3 shows the data of an OS transistor (L/W=30 nm/30 nm) in which an oxide semiconductor layer formed by a sputtering method using an IGZO target having an atomic ratio of In:Ga:Zn=4:2:4.1 is used for a channel formation region. The 1/f noise of the OS transistor is smaller than that of the n-channel Si transistor. Moreover, the 1/f noise of the OS transistor is smaller than that of the p-channel Si transistor with a frequency in the range of 1 Hz to 500 Hz inclusive and is substantially equal to that of the p-channel Si transistor with a frequency greater than 500 Hz. That is, the OS transistor has a smaller 1/f noise than the p-channel Si transistor in 60% or greater of the range of 1 Hz to 10 kHz inclusive in the logarithmic axis showing the frequency in FIG. 3.

Thus, the 1/f noise characteristics of the OS transistor formed using the IGZO target having the atomic ratio of In:Ga:Zn=4:2:4.1 are better than those of the Si transistors. Therefore, for example, when the OS transistor is used for a pixel of a CMOS image sensor, and the like, a clear image with less noise can be obtained as compared to the case where the Si transistors are used. An OS transistor formed using an IGZO target having an atomic ratio of In:Ga:Zn=3:1:4 or 5:1:6 may be used. Note that the above atomic ratios include atomic ratios in the vicinity thereof.

FIG. 1A shows the transistor 41 as an example. As illustrated in FIG. 1A, the transistor 41 can be a top-gate OS transistor for example. The OS transistor is provided over the insulating layer 81c formed over the layer 1200 and includes an oxide semiconductor layer 130, a conductive layer 140 functioning as one of a source electrode and a drain electrode, a conductive layer 150 functioning as the other of the source electrode and the drain electrode, an insulating layer 160 functioning as a gate insulating layer, and a conductive layer 170 functioning as a gate electrode. Note that the insulating layer 81c can also function as a gate insulating layer for a back gate that is described later.

FIG. 1A shows a structure in which the transistor 41 is provided with a conductive layer 173 functioning as a back gate electrode. Light transmitted through the layer 1200 might enter the layer 1100 and thus, the back gate electrode is preferably provided to block the light when the OS transistor provided in the pixel circuit is a top-gate transistor. Note that if the layer 1200 is thick enough and the amount of light transmitted therethrough is in an allowable range, the back gate electrode is not necessarily provided. Alternatively, when a light-blocking layer or the like is provided, the back gate electrode is not necessarily provided.

A photodiode provided in a single crystal silicon substrate can be used as the photoelectric conversion element PD provided in the layer 1200. The photodiode has excellent photoelectric conversion characteristics. Moreover, the photodiode can be fabricated relatively easily because the single crystal silicon substrate, which is a base material, functions as a photoelectric conversion layer. If necessary, the single crystal silicon substrate may be polished to have a thickness of 3 μm to 30 μm, for example.

Note that FIG. 1A illustrates a p-n junction photodiode as an example, and as illustrated in the circuit diagram of FIG. 1B, the region 510 can function as a cathode (an n-type region) and the region 520 can function as an anode (a p-type region). For example, a p-type single crystal silicon substrate is used, and the region 510 is made to be an n-type by adding a dopant such as phosphorus to the region 510.

Figure 4A:
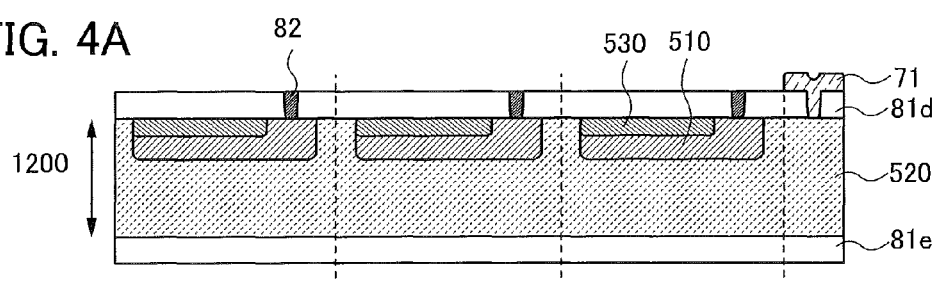
FIGS. 4A to 4E each illustrate a structure of a photoelectric conversion element.
Figure 4B:
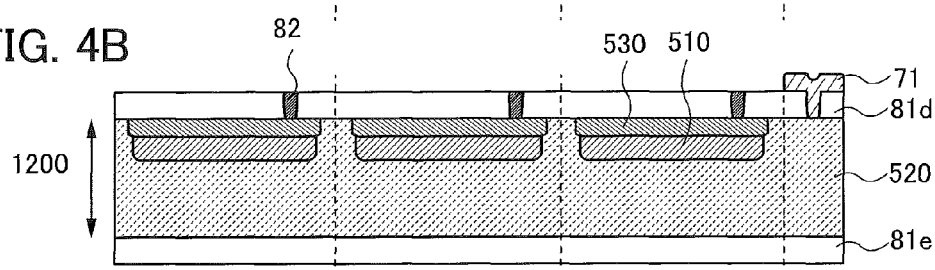

In the photodiode provided in the layer 1200, as illustrated in FIG. 4A, a region 530 having a conductivity opposite to that of the region 510 may be provided in part of a portion between the region 510 and the insulating layer 81d. Note that as illustrated in FIG. 4B, the region 530 may be provided in the whole portion between the region 510 and the insulating layer 81d. With such a structure, the photodiode is a buried type photodiode; thus, noise generated at the interface between the silicon and the insulating layer can be reduced.

Figure 4C:
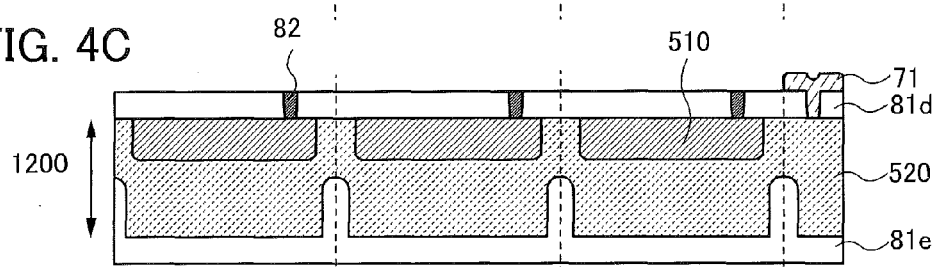

In the photodiode provided in the layer 1200, as illustrated in FIG. 4C, a partition may be provided between pixels. The partition can be formed by forming a groove between the pixels and forming the insulating layer 81e to fill the groove. With such a structure, entry of light from the oblique direction (stray light) can be prevented.

Note that a material that has a lower refractive index than silicon is preferably used for the partition. For example, the above-described material may be used for the insulating layer 81e. Alternatively, a material that easily absorbs light may be used for the partition. For example, it is also possible to use a resin to which a material such as a carbon-based black pigment (e.g., carbon black), a titanium-based black pigment (e.g., titanium black), an oxide of iron, a composite oxide of copper and chromium, or a composite oxide of copper, chromium, and zinc is added.

Figure 4D:
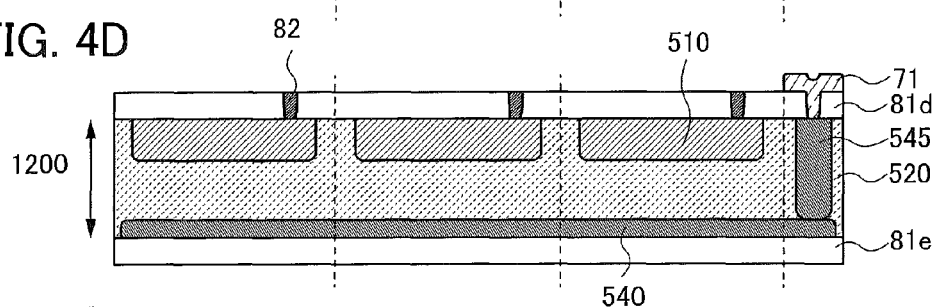

In the photodiode provided in the layer 1200, as illustrated in FIG. 4D, a region 540 may be provided between the region 520 and the insulating layer 81e. The region 540 has the same conductivity as the region 520 and has a higher dopant concentration than the region 520. With such a structure, carriers can be collected efficiently.

Figure 4E:
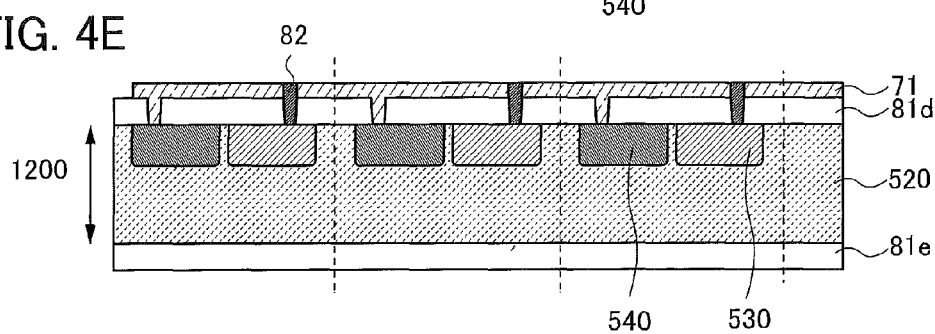

In the photodiode provided in the layer 1200, as illustrated in FIG. 4E, the region 540 may be provided adjacent to the region 530.

Note that in each of the structures in FIG. 1A and FIGS. 4A, 4B, and 4C, the wiring 71 may be electrically connected to the region 520 in every two or more pixels. In the structure in FIG. 4D, the wiring 71 may be electrically connected to the region 540 via a region 545 in every two or more pixels. Like the region 540, the region 545 has the same conductivity as the region 520 and has a higher dopant concentration than the region 520. In the structure in FIG. 4E, each region 540 is electrically connected to the wiring 71.

In the imaging device of one embodiment of the present invention, as illustrated in FIG. 1A, the one of the source and the drain of the transistor 41 is electrically connected to the one electrode of the photoelectric conversion element PD via a conductor 82. The conductor 82 is provided to penetrate the insulating layer 81b, the conductive layer 140, the oxide semiconductor layer 130, the insulating layer 81c, and the insulating layer 81d.

With such a structure, the above-described electrical connection can be obtained without bridge connection using a plurality of conductors 82, a connection wiring, and the like; thus, the process can be simplified. Furthermore, since an opening does not need to be provided in the insulating layers 81c and 81d and the like before the transistor 41 is formed, the occurrence of process failure due to a shape such as a step can be reduced.

Figure 5A:
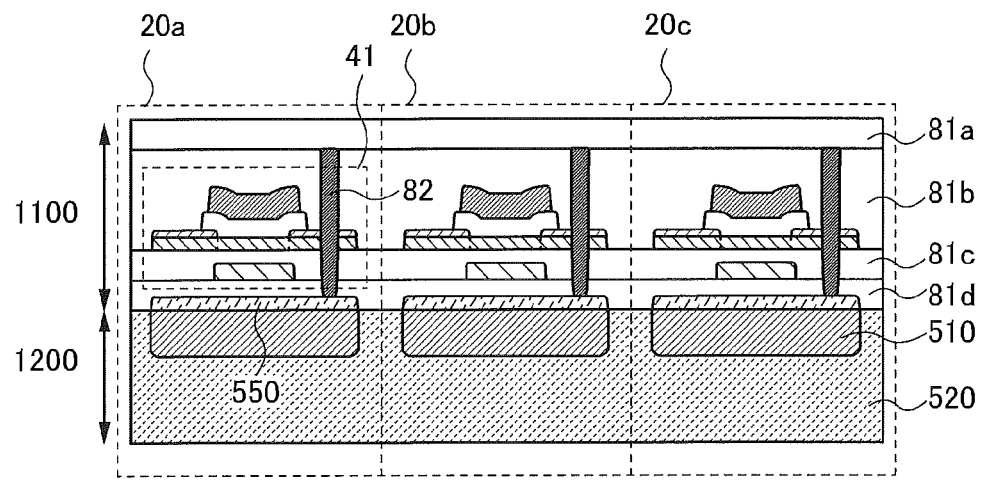
FIGS. 5A to 5C each illustrate a connection structure of a photoelectric conversion element and a transistor.

Note that the conductor 82 and the one electrode of the photoelectric conversion element PD may be electrically connected to each other via a conductive layer 550 as illustrated in FIG. 5A. For the conductive layer 550, for example, a metal layer such as W, Ta, Al, Ti, Ni, SUS, or Pd can be used. The conductive layer 550 serves as an electrode of the photoelectric conversion element PD and also serves as an etching stopper used in forming an opening in which the conductor 82 is to be formed. In addition, the conductive layer 550 also serves as a light-blocking layer for the transistor and a reflective electrode of the photoelectric conversion element PD.

Figure 5B:
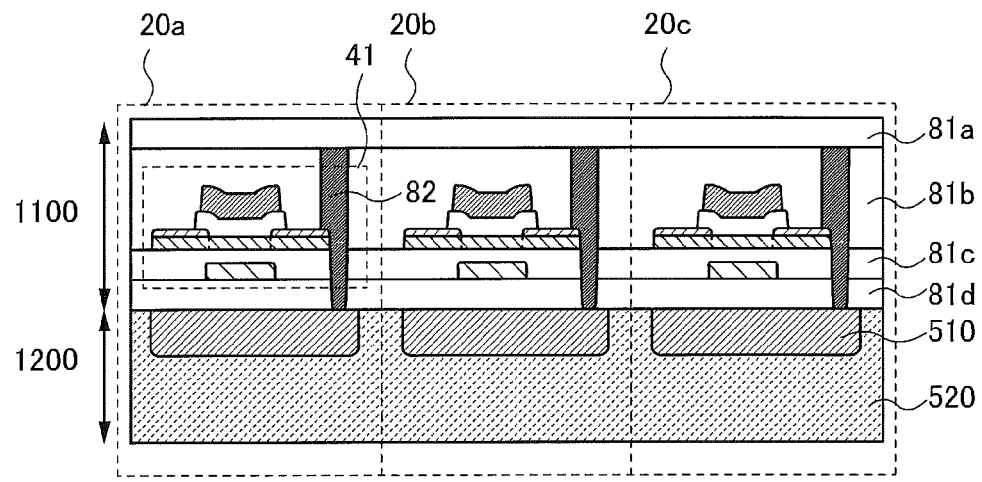

As illustrated in FIG. 5B, the electrical connection may be obtained not by making the conductor 82 penetrate the conductive layer 140 and the oxide semiconductor layer 130 but by making the conductor 82 in contact with the top surface and the side surface of the conductive layer 140 and the side surface of the oxide semiconductor layer 130. With such a structure, a load of an etching step of forming the opening can be reduced because a metal layer formed of a hardly-etched material is mainly used for the conductive layer 140.

Figure 5C:
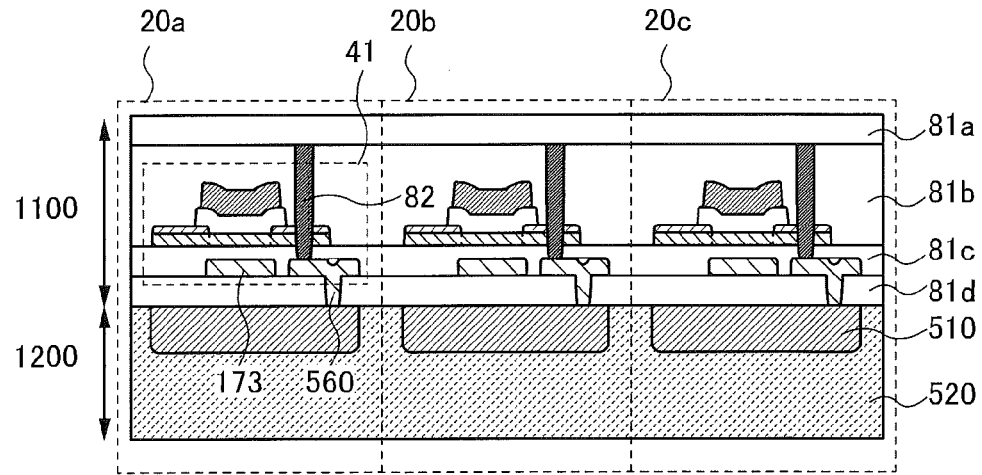

As illustrated in FIG. 5C, the conductor 82 may be electrically connected to a conductive layer 560 that is electrically connected to the one electrode of the photoelectric conversion element PD. The conductive layer 560 may be formed in the same step as the conductive layer 173 after an opening is formed in the insulating layer 81d. The conductive layer 560 serves as an etching stopper used in forming an opening in which the conductor 82 is to be formed.

For example, the back gate electrodes of the transistors 41 included in the pixels 20 can be a common electrode. In this case, the pixels 20 can have a structure illustrated in FIG. 6A. For example, the back gate electrodes of transistors provided in the layer 1100 except the transistors 41 can be a common back gate electrode. With the pixel 20 having any of these structures, the effect of blocking the entrance of light into the transistor by the conductive layer 173 can be improved.

Figure 6A:
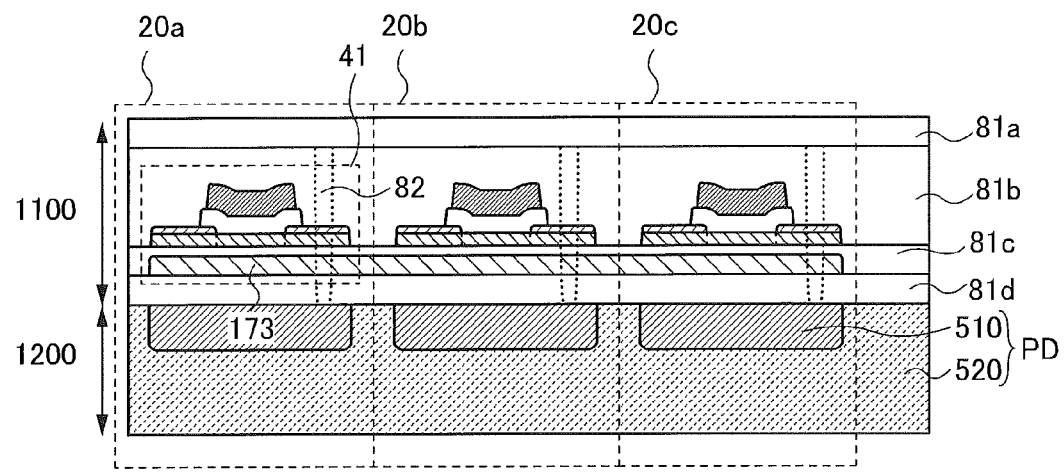
FIGS. 6A and 6B each illustrate a connection structure of a photoelectric conversion element and a transistor.
Figure 6B:
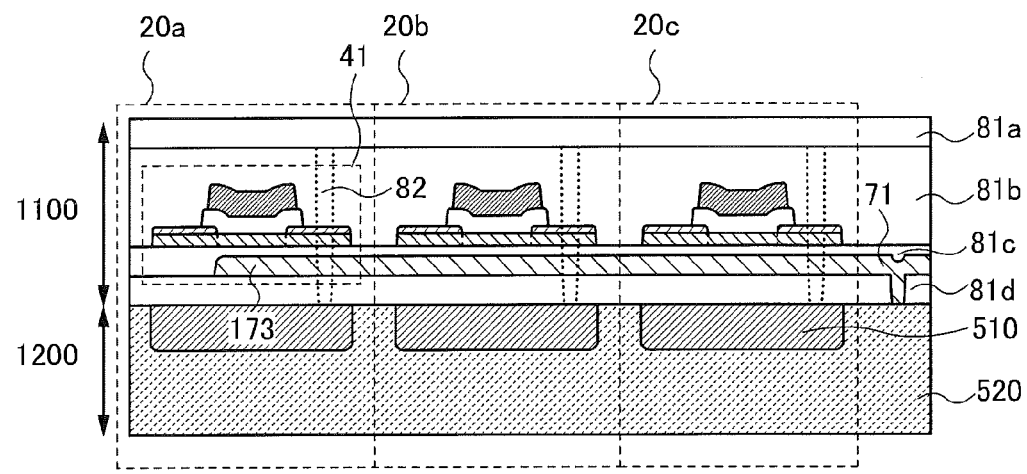

As illustrated in FIG. 6B, the conductive layer 173 may be electrically connected to the wiring 71. FIG. 6B illustrates a structure in which the conductive layer 173 included in the pixels 20a, 20b, and 20c is electrically connected to the wiring 71. With the structure, the potential of the wiring 71 and the back gate potential of the transistors included in the pixel 20 can be controlled simultaneously; thus, the operation of the pixel 20 can be controlled easily.

Note that in the pixel 20 having the structure illustrated in each of FIGS. 6A and 6B, the conductor 82 and the conductive layer 173 are not crossed.

Figure 7A:
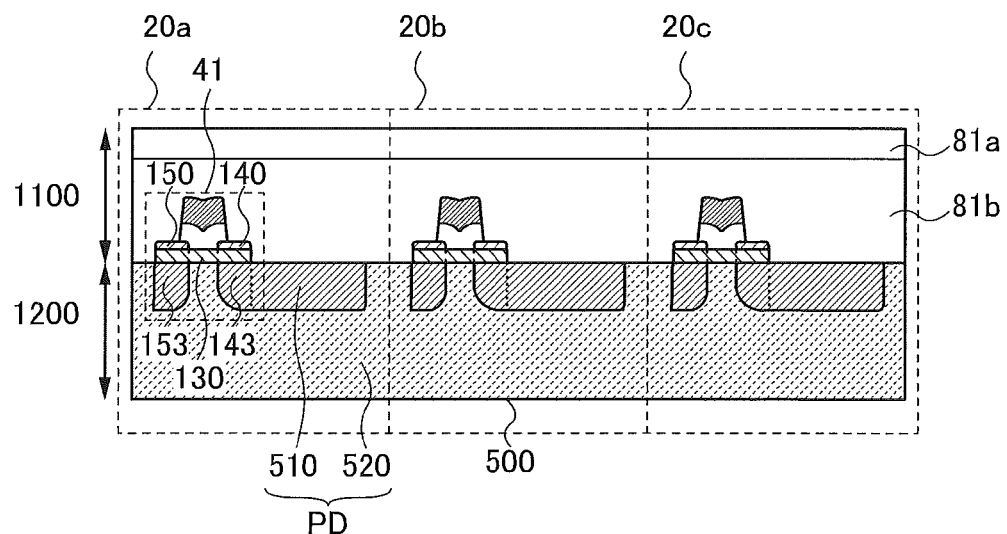
FIGS. 7A and 7B each illustrate a connection structure of a photoelectric conversion element and a transistor.

The pixel 20 can have a structure illustrated in FIG. 7A. In the pixel 20 having the structure, a region 143 and a region 153 are provided in a single crystal silicon substrate 500. Like the region 510, the regions 143 and 153 can be n-type regions formed by adding a dopant such as phosphorus, for example.

The oxide semiconductor layer 130 is provided in contact with the regions 143 and 153. The conductive layer 140 is provided to overlap with the region 143, and the conductive layer 150 is provided to overlap with the region 153. With the structure, the region 143 and a region between the conductive layer 140 and the region 143 function as the one of the source and the drain, and the region 153 and a region between the conductive layer 150 and the region 153 function as the other of the source and the drain. That is, in the transistor 41, a channel region is formed in the oxide semiconductor layer 130 and in the single crystal silicon substrate 500. Thus, the channel region of the transistor 41 has a stacked-layer structure of the oxide semiconductor and the silicon. Accordingly, the transistor 41 can have high on-state current.

The region 143 extends to be the region 510 and accordingly, the one of the source and the drain of the transistor 41 is electrically connected to the one electrode of the photoelectric conversion element PD. That is, a conductive layer or the like for electrically connecting the one of the source and the drain of the transistor 41 to the one electrode of the photoelectric conversion element PD does not need to be provided. Thus, a manufacturing process of an imaging device of one embodiment of the present invention can be simplified.

Figure 7B:
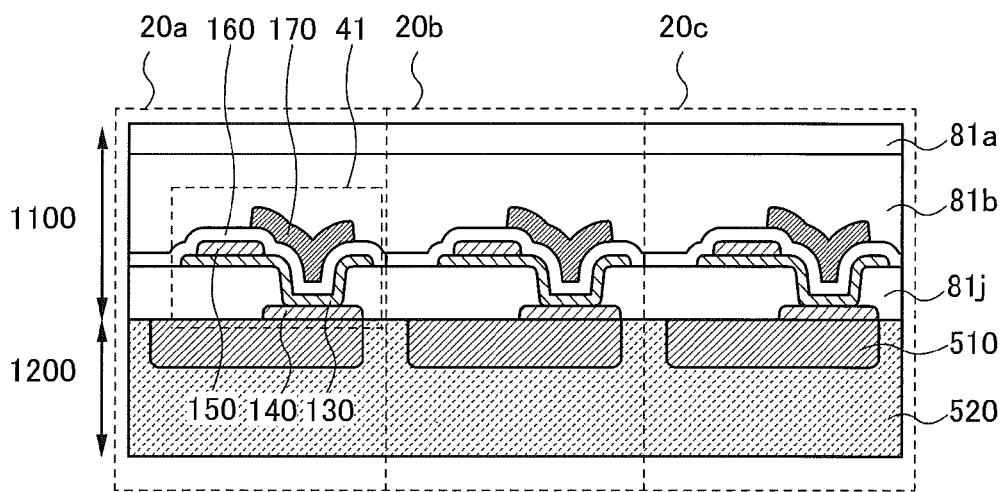

The OS transistor used for one embodiment of the present invention may have a structure illustrated in FIG. 7B. The transistor illustrated in FIG. 7B is in contact with the region 510 of the photoelectric conversion element PD. The transistor in FIG. 7B includes the conductive layer 140, the oxide semiconductor layer 130, the conductive layer 150, and the conductive layer 170. The conductive layer 140 functions as the one of the source electrode and the drain electrode. The oxide semiconductor layer 130 covers an opening provided in an insulating layer 81*j* to expose the region 510. The conductive layer 150 is provided over the oxide semiconductor layer 130 and functions as the other of the source electrode and the drain electrode. The conductive layer 170 overlaps with the oxide semiconductor layer 130 with the insulating layer 160 functioning as a gate insulating layer therebetween and functions as a gate electrode.

Such a structure can be referred to as a vertical transistor. In the vertical transistor, a region including a sidewall of the opening provided in the insulating layer 81*j* is a channel region; thus, the area occupied by the transistor can be reduced.

Note that in the pixel 20 having the structure illustrated in each of FIGS. 7A and 7B, the insulating layer 81*c* and the insulating layer 81*d* are not provided.

In the layer 1300, a light-blocking layer 1530, optical conversion layers 1550*a*, 1550*b*, and 1550*c*, a microlens array 1540, and the like can be provided.

The insulating layer 81*e* is formed in a region in contact with the layer 1200. As the insulating layer 81*e*, for example, a silicon oxide film with a high visible-light transmitting property can be used. In addition, a silicon nitride film may be stacked as a passivation film. In addition, a dielectric film of hafnium oxide or the like may be stacked as an anti-reflection film.

The light-blocking layer 1530 can be provided on the insulating layer 81*e*. The light-blocking layer 1530 is placed between adjacent pixels and has a function of blocking stray light entering from the oblique direction. The light-blocking layer 1530 can be formed of a metal layer of aluminum, tungsten, or the like, or a stack including the metal layer and a dielectric film functioning as an anti-reflection film.

The optical conversion layers 1550*a*, 1550*b*, and 1550*c* can be provided on the insulating layer 81*e* and the light-blocking layer 1530. For example, color filters of red (R), green (G), blue (B), yellow (Y), cyan (C), magenta (M), and the like are used for the optical conversion layers 1550*a*, 1550*b*, and 1550*c*, so that a color image can be obtained.

When a filter that blocks light having a wavelength shorter than or equal to that of visible light is used for each of the optical conversion layers, an infrared imaging device can be obtained. When a filter that blocks light having a wavelength shorter than or equal to that of near infrared light is used as each of the optical conversion layers, a far infrared imaging device can be obtained. When a filter that blocks light having a wavelength longer than or equal to that of visible light is used as each of the optical conversion layers, an ultraviolet imaging device can be obtained.

When a scintillator is used for each of the optical conversion layers, an imaging device that takes an image visualizing the intensity of radiation, which is used for an X-ray imaging device or the like, can be obtained. Radiation such as X-rays passes through an object to enter a scintillator, and then is converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator is formed of a substance that, when irradiated with radiation such as X-rays or gamma rays, absorbs energy of the radiation to emit visible light or ultraviolet light. For example, a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed can be used.

The microlens array 1540 can be provided on the optical conversion layers 1550*a*, 1550*b*, and 1550*c*. Light passing through each lens included in the microlens array 1540 passes through the optical conversion layers 1550*a*, 1550*b*, and 1550*c*, and the photoelectric conversion element PD is irradiated with the light.

Figure 8:
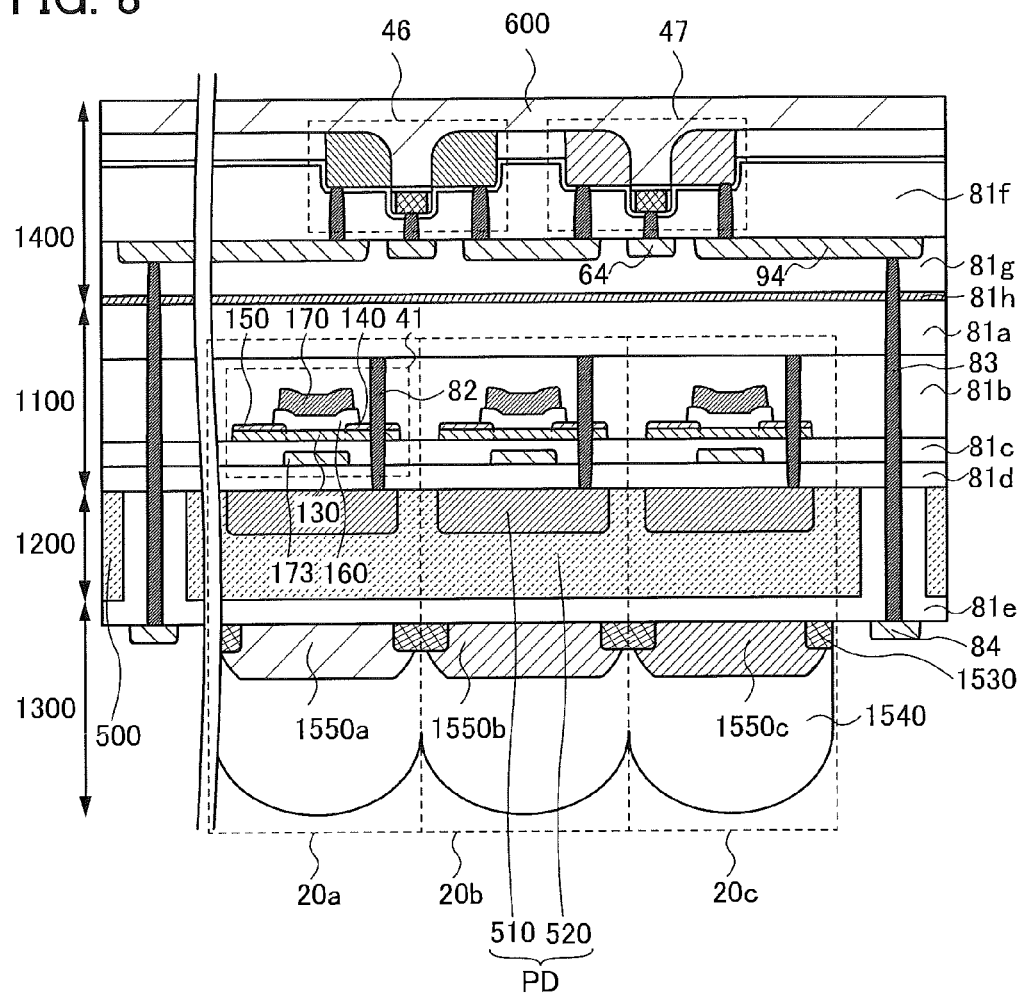
FIG. 8 illustrates a pixel of an imaging device.

As illustrated in FIG. 8, the pixel 20 can include a layer 1400 in addition to the layers 1100, 1200, and 1300. The layer 1400 includes an external circuit except the pixel circuit. Examples of the external circuit include a driver circuit such as a column driver or a row driver, a data converter circuit such as an A/D converter, a noise reduction circuit such as a correlated double sampling (CDS) circuit, and a control circuit of a whole imaging device.

The layer 1400 includes transistors 46 and 47 formed in a single crystal silicon substrate 600, insulating layers 81*f*, 81*g*, and 81*h* formed over the transistors 46 and 47, and the like.

Dangling bonds of silicon are terminated with hydrogen in insulating layers provided in the vicinities of the active regions of the transistors 46 and 47 and the like. Therefore, the hydrogen has an effect of improving the reliability of the transistors 46 and 47 and the like. Meanwhile, hydrogen in insulating layers that are provided in the vicinity of the oxide semiconductor layer that is the channel formation region of the transistor 41 and the like causes generation of carriers in the oxide semiconductor layer. Therefore, hydrogen might reduce the reliability of the transistor 41 and the like. For this reason, the insulating layer 81*h* that has a function of preventing diffusion of hydrogen is preferably provided between one layer including the Si transistor and another layer stacked thereover that includes the OS transistor. Hydrogen is confined in the one layer by the insulating layer 81*h*, whereby the reliability of the transistors 46 and 47 and the like can be improved. Furthermore, diffusion of hydrogen from the one layer to the other layer is inhibited, so that the reliability of the transistor 41 and the like can also be improved.

A conductive layer 64 and a conductive layer 94 are each formed to have a region embedded in the insulating layer 81*g*. The conductive layer 64 is electrically connected to a gate of the transistor 47 via a conductive layer provided to fill an opening formed in the insulating layer 81*f*. The conductive layer 94 is electrically connected to one of a source and a drain of the transistor 47 via a conductive layer provided to fill an opening formed in the insulating layer 81*f*.

The transistors 46, 47, and 41 are placed so that the top surfaces of a gate of the transistor 46 and the gate of the transistor 47 face the top surface of a gate of the transistor 41. A conductive layer 84 is provided so that the conductive layer 84 is in contact with the insulating layer 81*e* and does not overlap with the microlens array 1540. That is, the conductive layer 84 is provided on the light-receiving surface side of the photoelectric conversion element PD in the single crystal silicon substrate 500.

The conductive layer 94 is electrically connected to the conductive layer 84 via a conductor 83. Note that the conductor 83 does not overlap with the microlens array 1540. The conductor 83 is provided to fill an opening formed in the insulating layers 81a to 81e, 81g, and 81h and the single crystal silicon substrate 500. That is, the conductor 83 is provided to penetrate the layers 1100 and 1200 outside a region including the pixels 20. With the structure, a manufacturing process of an imaging device of one embodiment of the present invention can be simplified.

Note that the opening provided in the single crystal silicon substrate 500 is filled with the insulating layer 81e, and the conductor 83 is provided in contact with the insulating layer 81e. That is, the conductor 83 is not in contact with the single crystal silicon substrate 500. With the structure, the conductor 83 and the photoelectric conversion element PD can be prevented from being electrically connected to each other.

Figure 9:
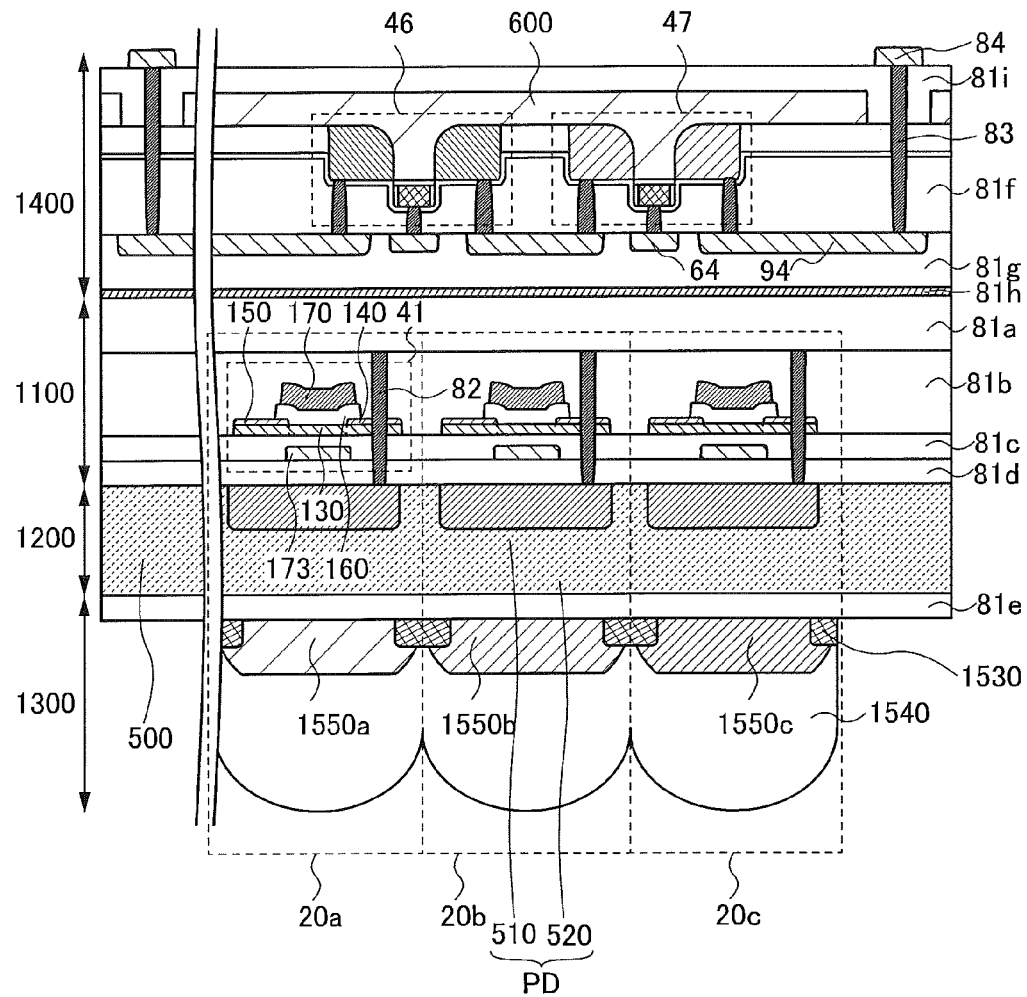
FIG. 9 illustrates a pixel of an imaging device.

The imaging device of one embodiment of the present invention can also have a structure in FIG. 9. In the imaging device having the structure, the conductor 83 is provided to fill an opening formed in the insulating layer 81f and the single crystal silicon substrate 600. That is, the conductor 83 is provided to penetrate the layer 1400 outside a region including the pixels 20.

Figure 10A:
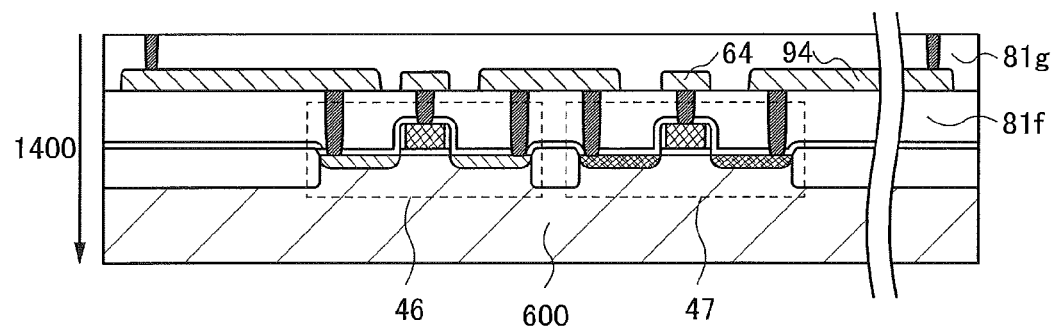
FIGS. 10A and 10B each illustrate a peripheral circuit of an imaging device.
Figure 10B:
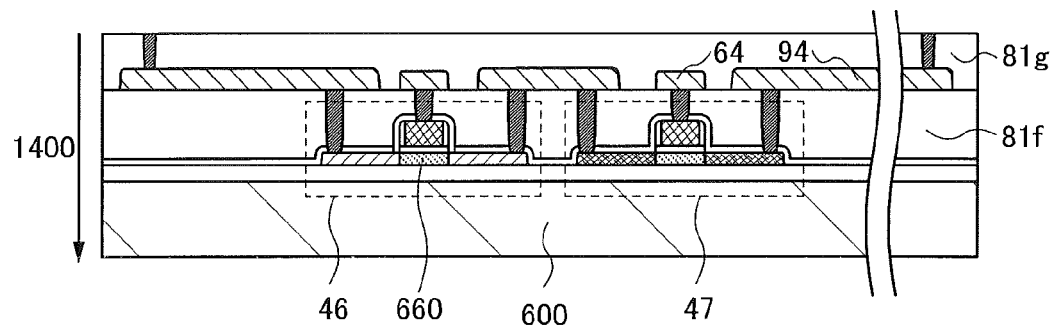

Although the transistors 46 and 47 are fin-type transistors in FIG. 8 and FIG. 9, the transistors may be planar transistors as illustrated in FIG. 10A. Alternatively, as illustrated in FIG. 10B, transistors each including a channel formation region 660 formed using a silicon thin film may be used. The channel formation region 660 can be formed using polycrystalline silicon or single crystal silicon of a silicon-on-insulator (SOI) structure.

Figure 11A:
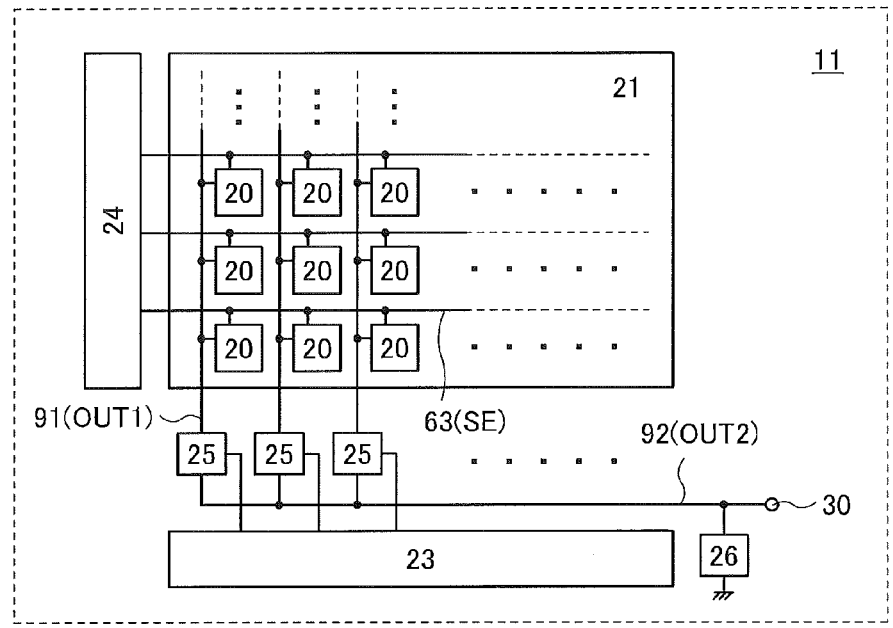
FIGS. 11A to 11C are a block diagram of an imaging element, a block diagram of an A/D converter, and a connection between the imaging element and the A/D converter.

FIG. 11A is a block diagram of an imaging element 11 of one embodiment of the present invention. The imaging element 11 includes a pixel array 21, a column driver 23, a row driver 24, analog switches 25, a current supply circuit 26, and a terminal 30.

The pixel array 21 includes the pixels 20 arranged in a matrix and a variety of wirings. In FIG. 11A, the wirings 63 (SE) and the wirings 91 (OUT1) are illustrated and other wirings are not illustrated.

Each of the column driver 23 and the row driver 24 can include a shift register circuit and can include OS transistors having the same conductivity. Moreover, the OS transistors can be used for the analog switches 25 and the current supply circuit 26. That is, a circuit for outputting image data to the outside can be provided in the layer 1100.

Note that in the configuration illustrated in FIG. 11A, data output to the terminal 30 via a wiring 92 (OUT2) is analog data. To convert the analog data into digital data, the analog data is output to an A/D converter provided outside the imaging element 11.

Figure 11B:
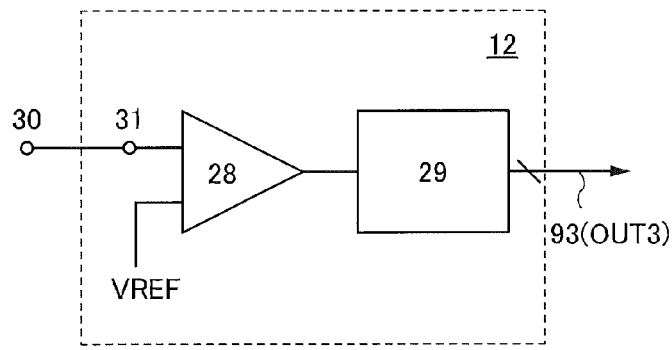

FIG. 11B is a block diagram illustrating an example of an A/D converter 12.

The A/D converter 12 includes a comparator 28, a counter circuit 29, and the like, and can output digital data of a plurality of bits to a wiring 93.

In the comparator 28, a signal potential input from the terminal 30 to a terminal 31 is compared with a reference potential (VREF) that is swept to be increased or decreased. Then, in accordance with the output of the comparator 28, the counter circuit 29 operates to output a digital signal to the wiring 93 (OUT3).

Here, the A/D converter 12 preferably includes Si transistors that can form a CMOS circuit for high speed operation and low power consumption.

Figure 11C:
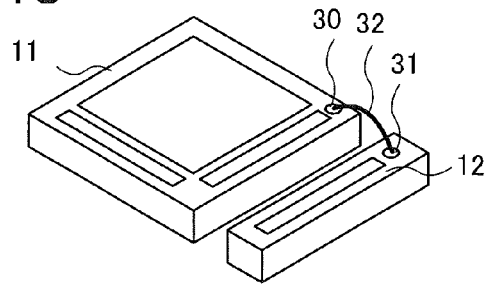

To connect the imaging element 11 and the A/D converter 12, for example, as illustrated in FIG. 11C, the terminal 30 may be connected to the terminal 31 by a wire bonding method or the like using a wire.

Here, the shift register composed of OS transistors having the same conductivity is described with reference to FIGS. 12A to 12C.

Figure 12A:
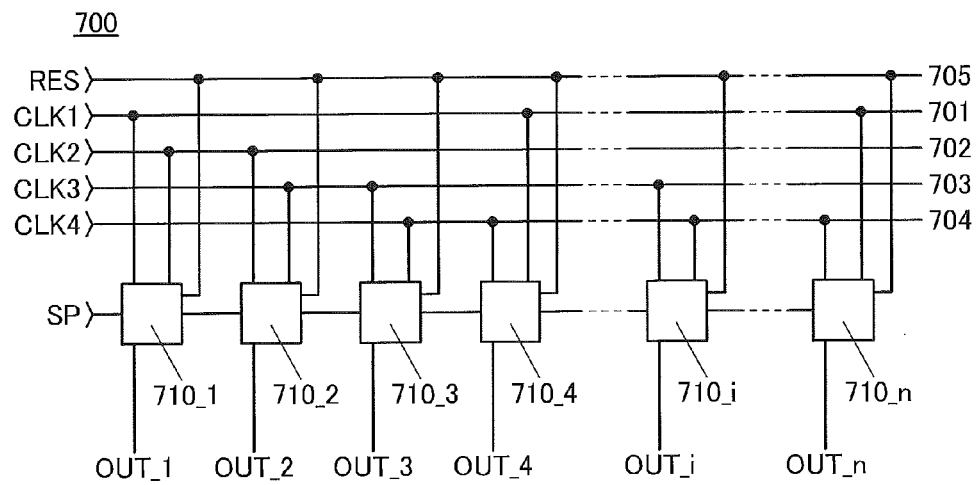
FIGS. 12A to 12C illustrate a structure of a shift register.

A shift register 700 illustrated in FIG. 12A includes n pulse output circuits 710 (n is a natural number of 2 or more). In this specification and the like, the pulse output circuit 710 in a first stage and the pulse output circuit 710 in an n-th stage are referred to as a pulse output circuit 710_1 and a pulse output circuit 710_n, respectively, in some cases. Furthermore, the pulse output circuit 710 in an i-th stage (i is a natural number of greater than or equal to 1 and less than or equal to n) is referred to as a pulse output circuit 710_i in some cases. A terminal, an output signal OUT, and the like of the pulse output circuit 710 are referred in a manner similar to the above in some cases. For example, an output signal OUT of the pulse output circuit 710_i is referred to as an output signal OUT_i in some cases.

The shift register 700 includes a wiring 705 through which a reset signal RES is supplied and wirings 701 to 704 through which clock signals are supplied. The wirings 701 to 704 are supplied with first to fourth clock signals CLK1 to CLK4, respectively.

The clock signal is a signal that changes between H and L potentials at regular intervals, and the first to fourth clock signals CLK1 to CLK4 are delayed by ¼ period sequentially. In this embodiment, control or the like of the pulse output circuit is performed with the first to fourth clock signals CLK1 to CLK4.

Figure 12B:
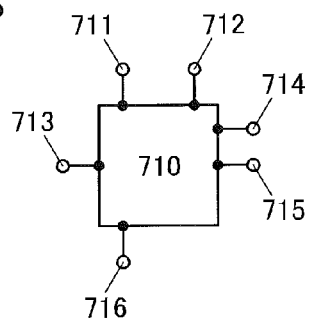

The pulse output circuits 710 each include terminals 711 to 716 (see FIG. 12B). The terminals 711 and 712 are each electrically connected to one of the wirings 701 to 704. For example, in FIG. 12A, the terminals 711 and 712 of the pulse output circuit 710_1 are electrically connected to the wirings 701 and 702, respectively. The terminals 711 and 712 of a pulse output circuit 710_2 are electrically connected to the wirings 702 and 703, respectively. The terminals 714 are electrically connected to the wiring 705.

A start signal SP is supplied to the terminal 713 of the pulse output circuit 710_1 and an output signal OUT_1 is output from the terminal 716 thereof. The terminal 713 of the pulse output circuit 710_i is electrically connected to the terminal 715 of the pulse output circuit 710_i−1 (pulse output circuit 710 in an i−1-th stage). The terminal 715 of the pulse output circuit 710_i is electrically connected to the terminal 713 of a pulse output circuit 710_i+1. An output signal OUT_i is output from the terminal 716 of the pulse output circuit 710_i. An output signal OUT_n is output from the terminal 716 of the pulse output circuit 710_n in the n-th stage.

Note that the pulse output circuit 710_n does not necessarily include the terminal 715. When the pulse output circuit 710_n includes the terminal 715, the terminal 715 (terminal 715_n) may be electrically connected to the terminal 713 (terminal 713_1) of the pulse output circuit 710_1 in the first stage.

Figure 12C:
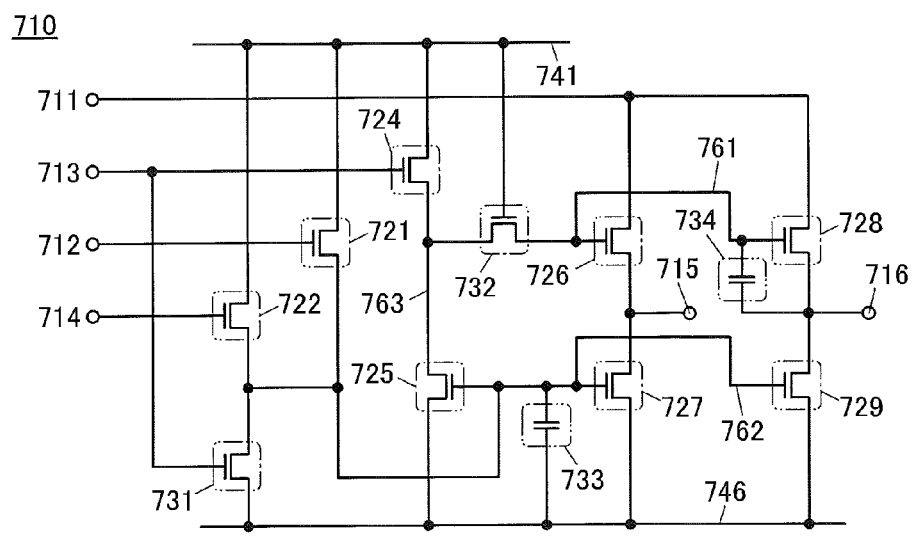

Next, the configuration of the pulse output circuit 710 is described (see FIG. 12C). The pulse output circuit 710 includes a transistor 721, a transistor 722, transistors 724 to 729, a transistor 731, a transistor 732, a capacitor 733, and a capacitor 734.

One of a source and a drain of the transistor 721 is electrically connected to a wiring 741, the other of the source and the drain of the transistor 721 is electrically connected to a node 762, and a gate of the transistor 721 is electrically connected to the terminal 712. One of a source and a drain of the transistor 722 is electrically connected to the wiring 741, the other of the source and the drain of the transistor 722 is electrically connected to the node 762, and a gate of the transistor 722 is electrically connected to the terminal 714. One of a source and a drain of the transistor 724 is electrically connected to the wiring 741, the other of the source and the drain of the transistor 724 is electrically connected to a node 763, and a gate of the transistor 724 is electrically connected to the terminal 713. One of a source and a drain of the transistor 725 is electrically connected to the node 763, the other of the source and the drain of the transistor 725 is electrically connected to a wiring 746, and a gate of the transistor 725 is electrically connected to the node 762. One of a source and a drain of the transistor 726 is electrically connected to the terminal 711, the other of the source and the drain of the transistor 726 is electrically connected to the terminal 715, and a gate of the transistor 726 is electrically connected to a node 761. One of a source and a drain of the transistor 727 is electrically connected to the terminal 715, the other of the source and the drain of the transistor 727 is electrically connected to the wiring 746, and a gate of the transistor 727 is electrically connected to the node 762. One of a source and a drain of the transistor 728 is electrically connected to the terminal 711, the other of the source and the drain of the transistor 728 is electrically connected to the terminal 716, and a gate of the transistor 728 is electrically connected to the node 761. One of a source and a drain of the transistor 729 is electrically connected to the terminal 716, the other of the source and the drain of the transistor 729 is electrically connected to the wiring 746, and a gate of the transistor 729 is electrically connected to the node 762. One of a source and a drain of the transistor 731 is electrically connected to the node 762, the other of the source and the drain of the transistor 731 is electrically connected to the wiring 746, and a gate of the transistor 731 is electrically connected to the terminal 713. One of a source and a drain of the transistor 732 is electrically connected to the node 763, the other of the source and the drain of the transistor 732 is electrically connected to the node 761, and a gate of the transistor 732 is electrically connected to the wiring 741. One electrode of the capacitor 733 is electrically connected to the node 762, and the other electrode of the capacitor 733 is electrically connected to the wiring 746.

Figure 13A:
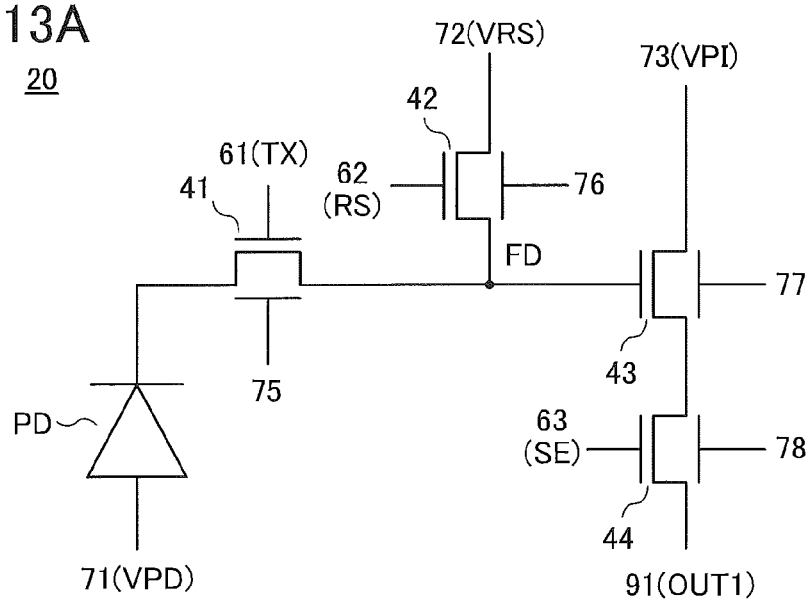
FIGS. 13A to 13C each illustrate a pixel circuit.

The transistors 41 to 44 in the pixel 20 may each have a back gate as illustrated in FIG. 13A. FIG. 13A illustrates a configuration of applying a constant potential to the back gates, which enables control of the threshold voltages.

Figure 13B:
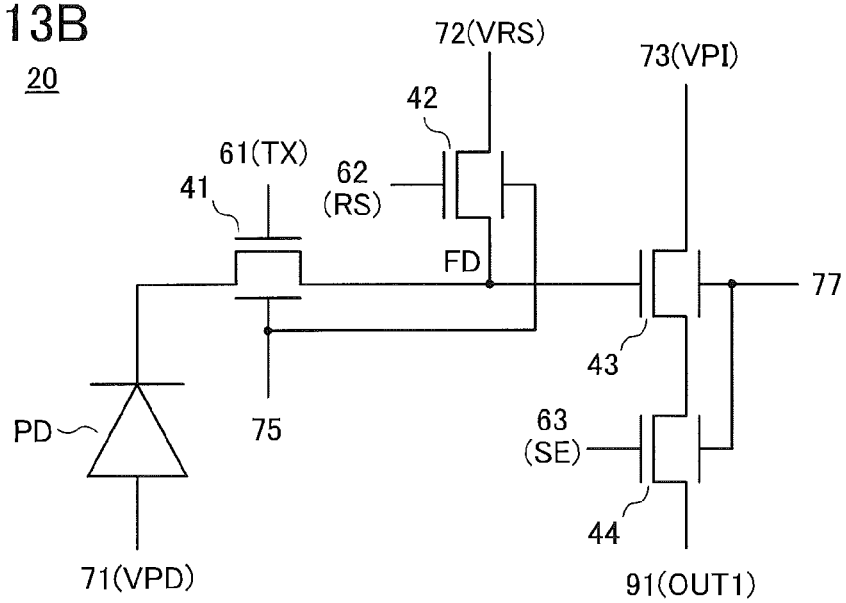

Wirings 75 to 78 connected to the respective back gates can be supplied with a different potential separately. Alternatively, as illustrated in FIG. 13B, the wirings connected to the back gates of the transistors 41 and 42 may be electrically connected to each other. The wirings connected to the back gates of the transistors 43 and 44 may be electrically connected to each other.

In n-channel transistors, the threshold voltage is shifted in a positive direction when a potential lower than a source potential is applied to a back gate. In contrast, the threshold voltage is shifted in a negative direction when a potential higher than a source potential is applied to a back gate. Therefore, in the case where the on/off state of each of the transistors is controlled by the predetermined gate voltage, the off-state current can be reduced when a potential lower than a source potential is applied to a back gate and the on-state current can be reduced when a potential higher than a source potential is applied to a back gate.

The node FD is desired to have high potential retention capability in the circuits in FIG. 1B, FIGS. 4A and 4B, and FIGS. 13A and 13B, so that OS transistors with a low off-state current are preferably used for the transistors 41 and 42 as described above. The off-state current can be reduced when a potential lower than a source potential is applied to the back gates of the transistors 41 and 42. Therefore, the node FD can have high potential retention capability.

As described above, transistors with a high on-state current are preferably used for the transistors 43 and 44. The on-state current can be increased when a potential higher than a source potential is applied to the back gates of the transistors 43 and 44.

Therefore, a reading potential output to the wiring 91 (OUT1) can be defined immediately, that is, the transistors 43 and 44 can be operated at high frequency.

Figure 13C:
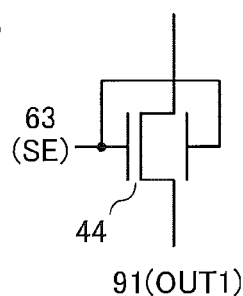

Note that the same potential may be applied to a front gate and the back gate of the transistor 44 as illustrated in FIG. 13C.

Besides power supply potentials, a plurality of potentials such as a signal potential and a potential applied to the back gate are used inside an imaging device. Supply of a plurality of potentials from the outside of an imaging device increases the number of terminals and the like; thus, an imaging device preferably has a power supply circuit generating a plurality of potentials inside the imaging device.

Figure 14:
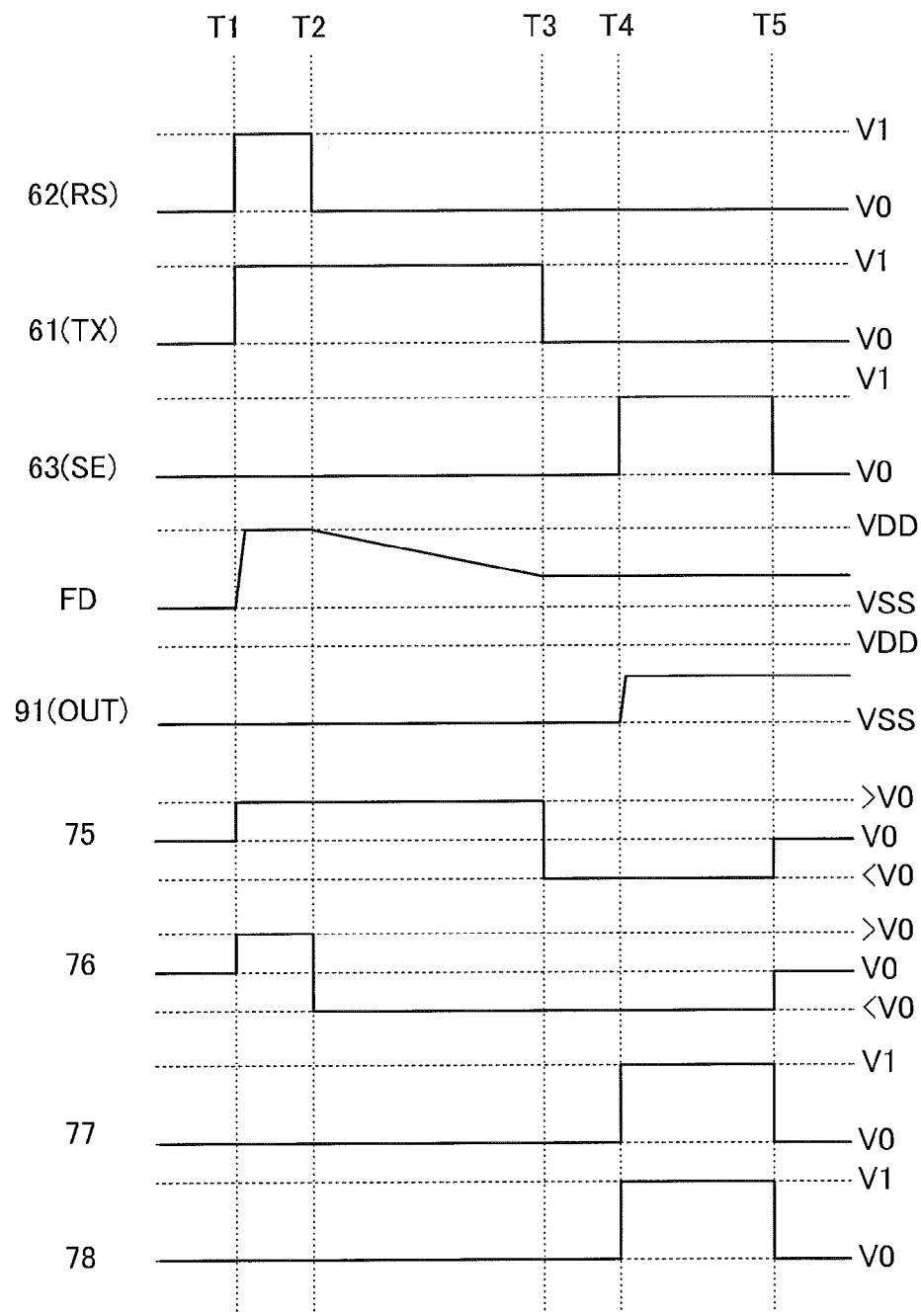
FIG. 14 is a timing chart showing the operation of a pixel circuit.

The operation of the pixel in FIG. 13A is described using a timing chart in FIG. 14. In the timing chart, "V1" can be a potential higher than a reference potential, such as a high power supply potential (VDD). "V0" can be a reference potential (source potential) such as 0 V, a potential GND, and a low power supply potential (VSS).

First, at Time T1, the transistors 41 and 42 are turned on and the node FD is reset to a reset potential (e.g., VDD) when the potentials of the wiring 62 (RS) and the wiring 61 (TX) are set to "V1" (reset operation). At this time, the on-state current of the transistors 41 and 42 is increased when the potentials of the wirings 75 and 76 are set to potentials higher than "V0" (>"V0"), so that the reset operation can be performed immediately.

At Time T2, the transistor 42 is turned off and the reset operation is terminated to start accumulation operation when the potential of the wiring 62 (RS) is set to "V0". At this time, the off-state current of the transistor 42 can be reduced and supply of charge to the node FD by leakage current can be prevented when the potential of the wiring 76 is set to a potential lower than "V0". Alternatively, at Time T2, the potential of the wiring 75 may be "V0".

At Time T3, the transistor 41 is turned off and the potential of the node FD is defined and held (holding operation) when the potential of the wiring 61 (TX) is set to "V0". At this time, the off-state current of the transistor 41 can be reduced and leakage of charge from the node FD by leakage current can be prevented when the potential of the wiring 75 is set to a potential lower than "V0" (<"V0").

At Time T4, the transistor 44 is turned on and the potential of the wiring 91 (OUT1) changes depending on a current flowing through the transistor 43 when the potential of the wiring 63 (SE) is set to "V1" (reading operation). At this time, the on-state current of the transistors 43 and 44 is increased and the potential of the wiring 91 (OUT1) can be defined immediately when the potentials of the wirings 77 and 78 are set to potentials higher than "V0" (>"V0").

At Time 5, the transistor 44 is turned off when the potential of the wiring 63 (SE) is set to "V0", so that the reading operation is completed. Note that the potentials of the wirings 75 and 76 are preferably held lower than "V0" (<"V0") so that the potential of the node FD does not change until the reading operation is completed. Alternatively, the potentials of the wirings 75 and 76 may be changed at the same timing in the above description.

Through the above steps, a signal based on the potential of the node FD can be read. Note that the pixel 20 in FIG. 1B may be operated without controlling the wirings 75 to 78 in the timing chart in FIG. 14. The pixel 20 in FIG. 13B may be operated without controlling the wirings 76 and 78 in the timing chart in FIG. 14.

Figure 15A:
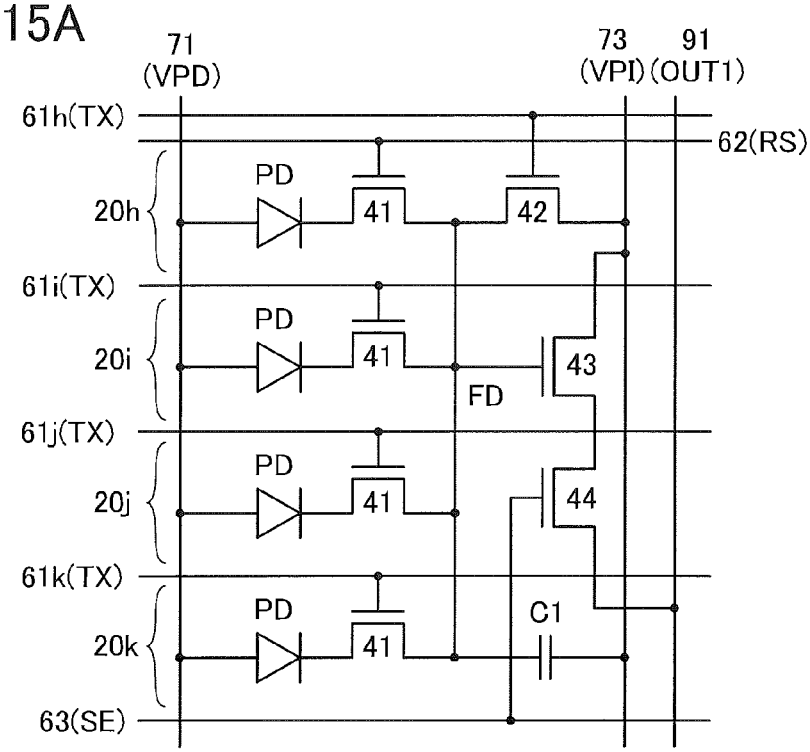
FIGS. 15A and 15B each illustrate a pixel circuit.
Figure 15B:
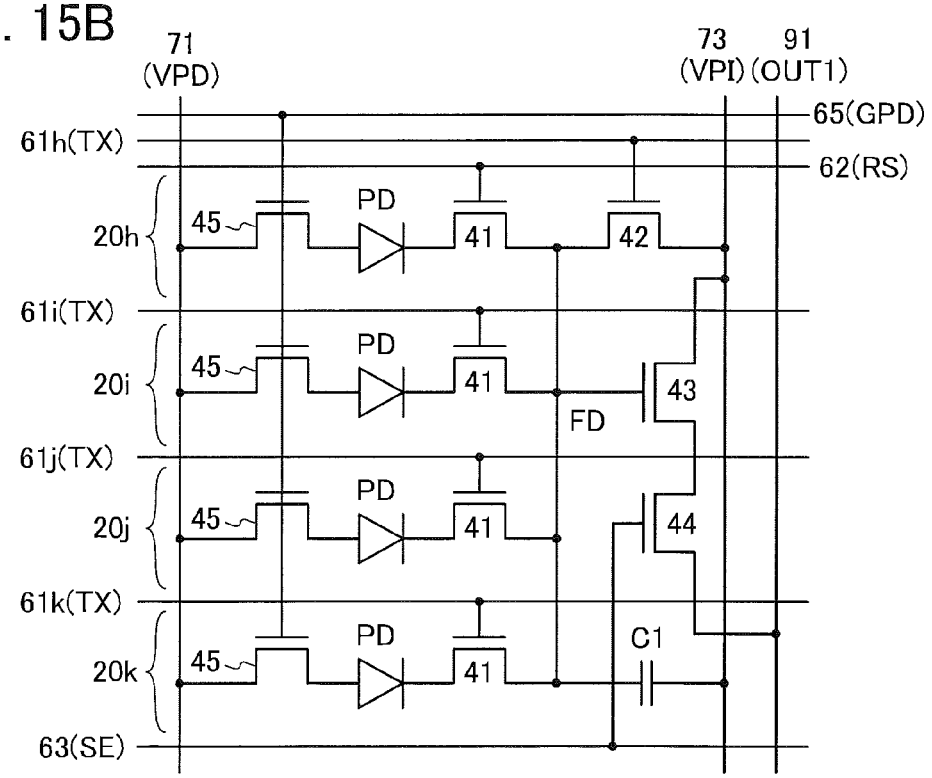

In a pixel circuit of one embodiment of the present invention, transistors may be shared among a plurality of pixels as illustrated in FIGS. 15A and 15B.

FIG. 15A illustrates a pixel in which transistors are shared among a plurality of pixels. In the pixel, pixels 20h to 20k each include the photoelectric conversion element PD and the transistor 41 and share the transistors 42 to 44 and a capacitor C1. The operation of each of the transistors 41 included in the pixels 20h to 20k is controlled by wirings 61h to 61k. With this circuit configuration, reset operation, accumulation operation, holding operation, and reading operation can be sequentially performed by each pixel. This configuration is mainly suitable for imaging using a rolling shutter system.

FIG. 15B illustrates a pixel in which transistors are shared among a plurality of pixels. In the pixel, the pixels 20h to 20k include the photoelectric conversion element PD, the transistor 41, and a transistor 45 individually and share the transistors 42 to 44 and the capacitor C1. A potential can be held in the cathode of the photoelectric conversion element PD by providing the transistor 45, whose operation is controlled by the potential of a wiring 65 (GPD), between the photoelectric conversion element PD and the wiring 71 (VPD). This configuration is suitable for imaging using a global shutter system, in which reset operation, accumulation operation, and holding operation are sequentially performed in all the pixels at the same time and reading operation is performed by each pixel.

In the pixel circuits illustrated in FIGS. 15A and 15B, the plurality of pixels (the pixels 20h to 20k) aligned in the direction in which the wiring 91 (OUT1) extends (hereinafter, referred to as a vertical direction) share the transistors; however, a plurality of pixels aligned in the direction in which the wiring 63 (SE) extends (hereinafter, referred to as a horizontal direction) may share transistors. Alternatively, a plurality of pixels aligned in the horizontal and vertical directions may share transistors.

Alternatively, the number of pixels that share transistors is not limited to four, and may be two, three, or five or more.

Although the wiring 72 (VRS) and the wiring 73 (VPI) illustrated in FIG. 1B are merged into one wiring and the wiring 72 (VRS) is omitted in a configuration in FIGS. 15A and 15B, the wiring 72 (VRS) may be included. In addition, although the other electrode of the capacitor C1 is connected to the wiring 73 (VPI), the other electrode of the capacitor C1 may be connected to the wiring 71 (VPD).

This embodiment can be combined with any of the structures described in the other embodiments as appropriate.

Embodiment 2

In this embodiment, an OS transistor that can be used in one embodiment of the present invention is described with reference to drawings. In the drawings in this embodiment, some components are enlarged, reduced in size, or omitted for easy understanding.

Figure 16A:
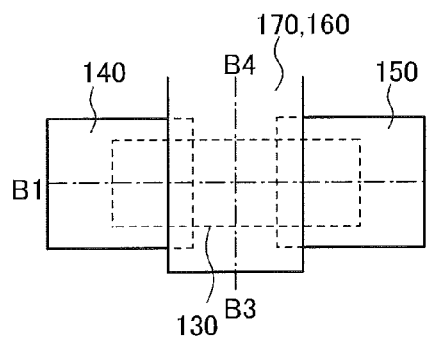
FIGS. 16A to 16F are top views and cross-sectional views illustrating transistors.
Figure 16B:
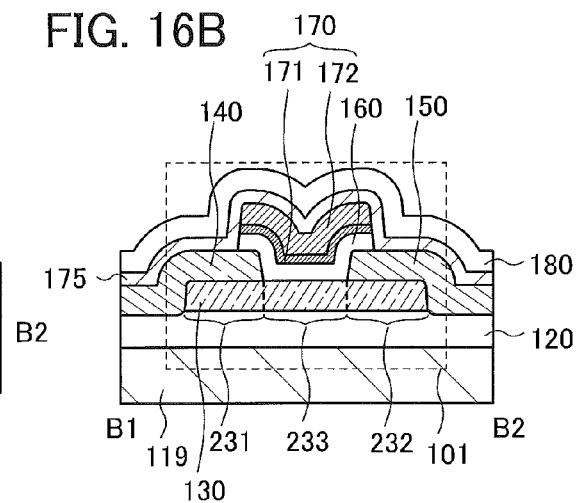
Figure 18A:
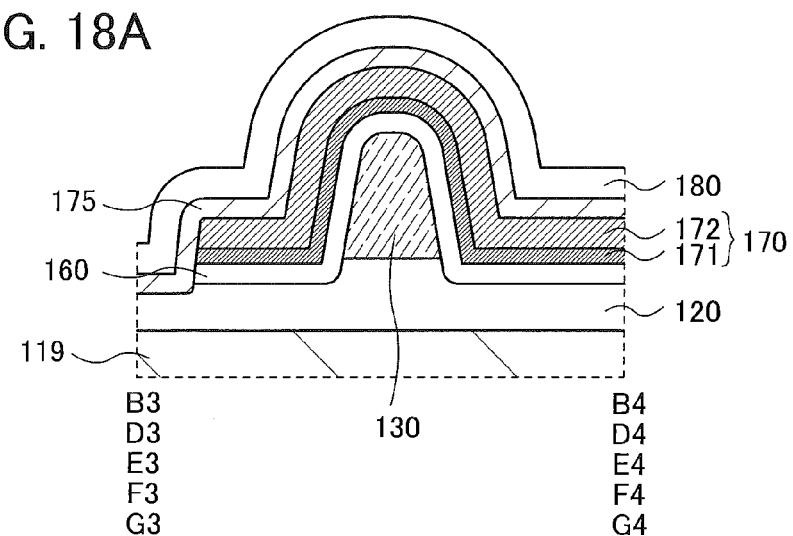
FIGS. 18A to 18D illustrate cross sections of transistors in the channel width direction.

FIGS. 16A and 16B are a top view and a cross-sectional view illustrating a transistor 101 of one embodiment of the present invention. FIG. 16A is the top view, and FIG. 16B illustrates a cross section in the direction of dashed-dotted line B1-B2 in FIG. 16A. A cross section in the direction of dashed-dotted line B3-B4 in FIG. 16A is illustrated in FIG. 18A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 119; the oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; the conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 16B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of opposite polarity is used or when the direction of current flow is changed in a circuit operation, for example. Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same can apply to other transistors described in this embodiment.

Each of the conductive layers 140 and 150 is a single layer in the drawing, but also may be a stack of two or more layers. The same can apply to other transistors described in this embodiment.

The insulating layer 175 mainly functions as a blocking layer that reduces diffusion of impurities from the outside to the oxide semiconductor layer 130. By selecting an appropriate material, the insulating layer 175 also has a function of preventing the conductive layer 170 from being oxidized and functions as a source for supplying hydrogen for lowering the resistance of part of the oxide semiconductor layer 130.

Figure 16C:
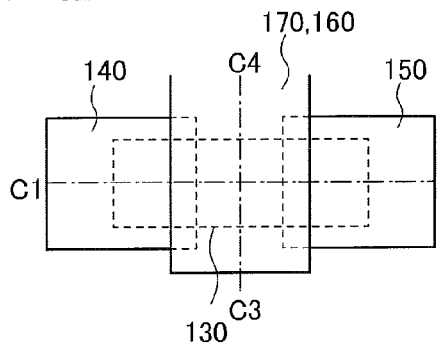
Figure 16D:
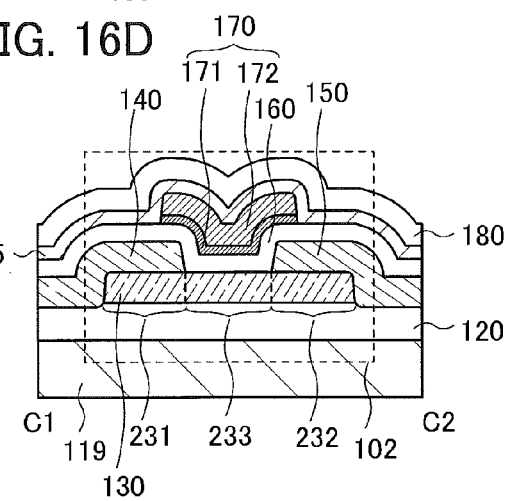
Figure 18B:
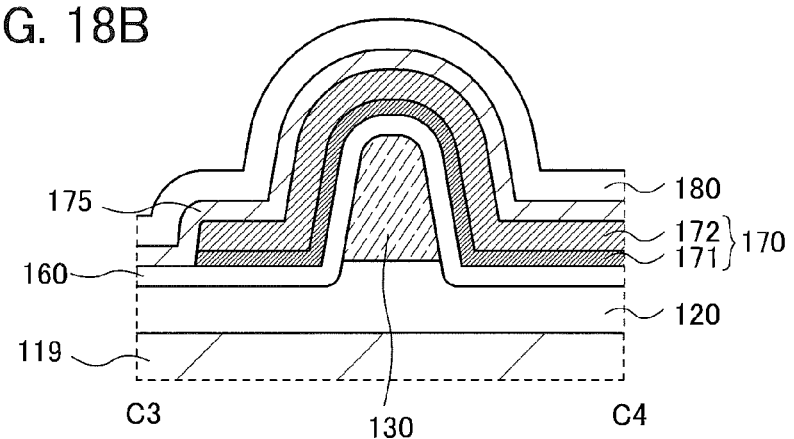

The transistor in one embodiment of the present invention may have a structure illustrated in FIGS. 16C and 16D. FIG. 16C is a top view of a transistor 102. A cross section in the direction of dashed-dotted line C1-C2 in FIG. 16C is illustrated in FIG. 16D. A cross section in the direction of dashed-dotted line C3-C4 in FIG. 16C is illustrated in FIG. 18B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of a low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 16E:
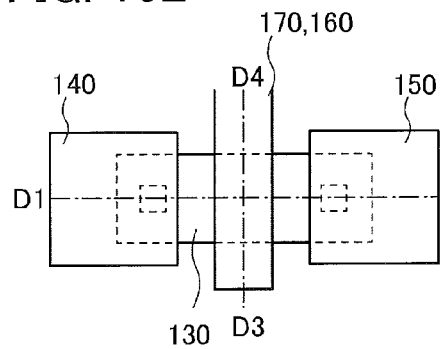
Figure 16F:
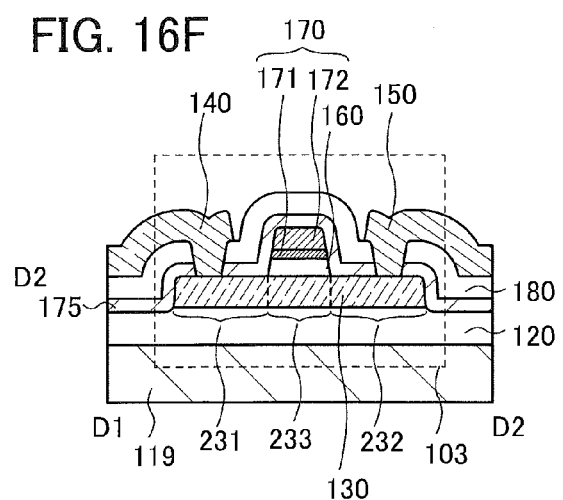

The transistor in one embodiment of the present invention may have a structure illustrated in FIGS. 16E and 16F. FIG. 16E is a top view of a transistor 103. A cross section in the direction of dashed-dotted line D1-D2 in FIG. 16E is illustrated in FIG. 16F. A cross section in the direction of dashed-dotted line D3-D4 in FIG. 16E is illustrated in FIG. 18A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 119; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 16F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 17A:
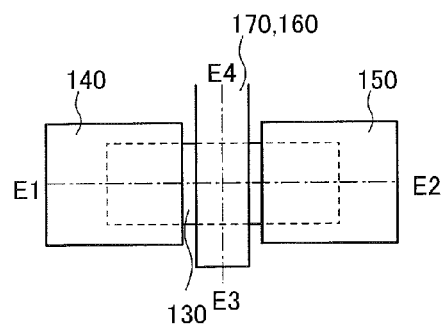
FIGS. 17A to 17F are top views and cross-sectional views illustrating transistors.
Figure 17B:
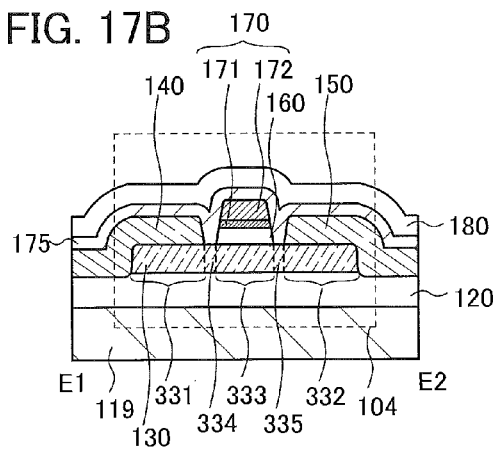

The transistor in one embodiment of the present invention may have a structure illustrated in FIGS. 17A and 17B. FIG. 17A is a top view of a transistor 104. A cross section in the direction of dashed-dotted line E1-E2 in FIG. 17A is illustrated in FIG. 17B. A cross section in the direction of dashed-dotted line E3-E4 in FIG. 17A is illustrated in FIG. 18A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 are in contact with the oxide semiconductor layer 130 so as to cover end portions of the oxide semiconductor layer 130.

In FIG. 17B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 17C:
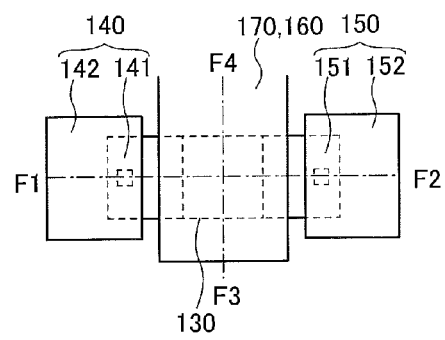
Figure 17D:
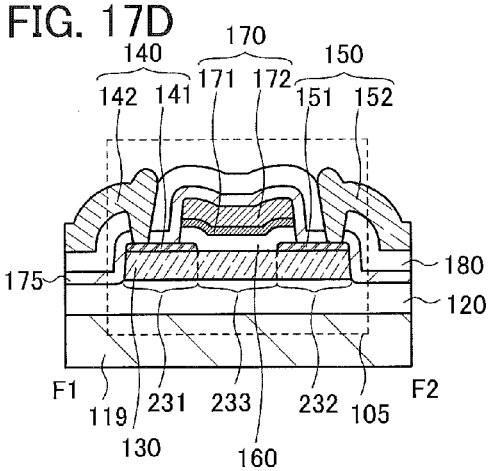

The transistor in one embodiment of the present invention may have a structure illustrated in FIGS. 17C and 17D. FIG. 17C is a top view of a transistor 105. A cross section in the direction of dashed-dotted line F1-F2 in FIG. 17C is illustrated in FIG. 17D. A cross section in the direction of dashed-dotted line F3-F4 in FIG. 17C is illustrated in FIG. 18A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 119; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that the openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 17E:
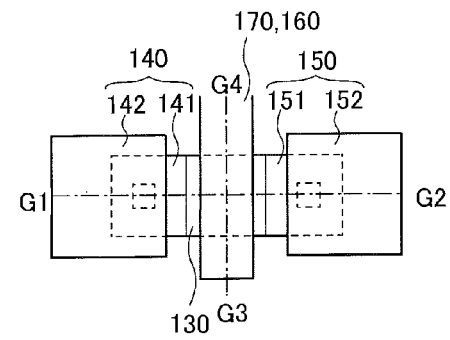
Figure 17F:
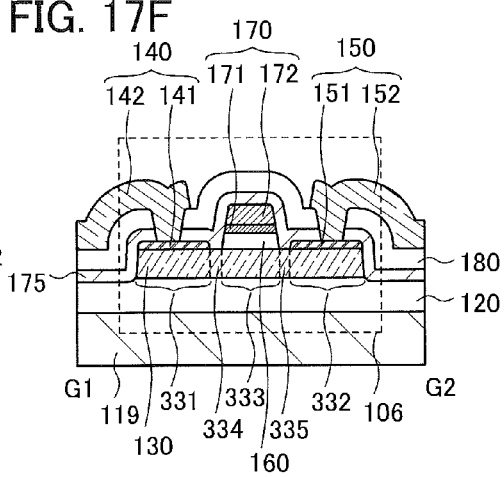

The transistor in one embodiment of the present invention may have a structure illustrated in FIGS. 17E and 17F. FIG. 17E is a top view of a transistor 106. A cross section in the direction of dashed-dotted line G1-G2 in FIG. 17E is illustrated in FIG. 17F. A cross section in the direction of dashed-dotted line G3-G4 in FIG. 17E is illustrated in FIG. 18A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 119; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 18C:
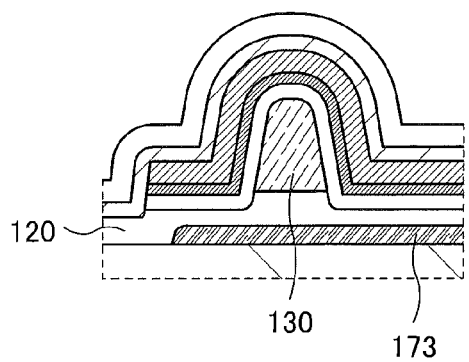
Figure 18D:
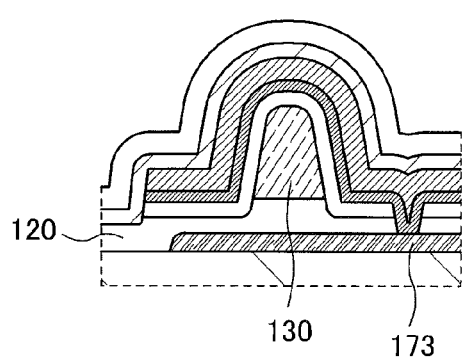

The transistor in one embodiment of the present invention may include the conductive layer 173 between the oxide semiconductor layer 130 and the substrate 119 as illustrated in cross-sectional views in the channel length direction in FIGS. 19A to 19F and cross-sectional views in the channel width direction in FIGS. 18C and 18D. When the conductive layer is used as a second gate electrode layer (back gate), the on-state current can be increased or the threshold voltage can be controlled. In the cross-sectional views in FIGS. 19A to 19F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 18D, the conductive layers 170 and 173 may be electrically connected to each other through a contact hole.

Although the transistors 101 to 106 in FIGS. 16A to 16F and FIGS. 17A to 17F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 20B and 20C or FIGS. 20D and 20E.

Figure 20A:
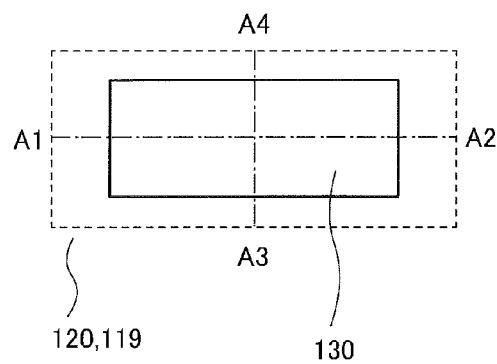
FIGS. 20A to 20E are a top view and cross-sectional views illustrating semiconductor layers.
Figure 20B:
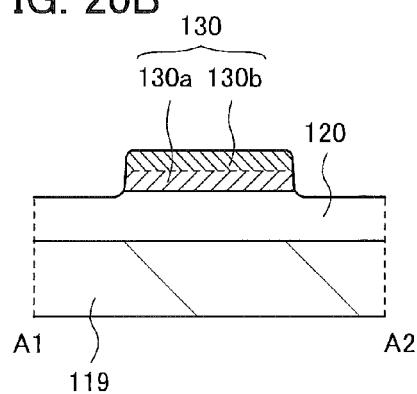
Figure 20D:
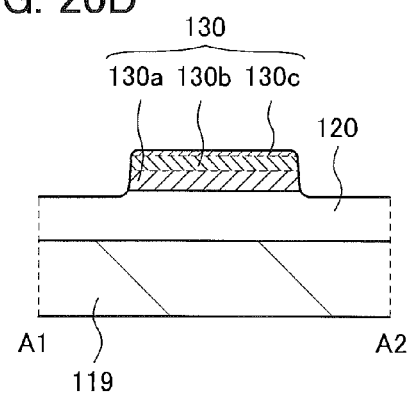
Figure 20C:
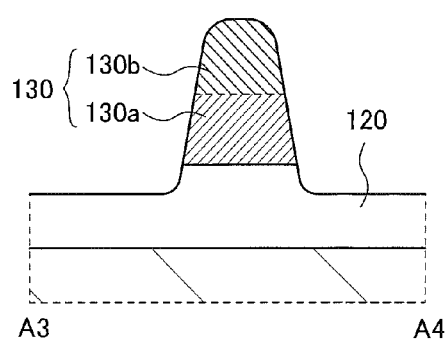
Figure 20E:
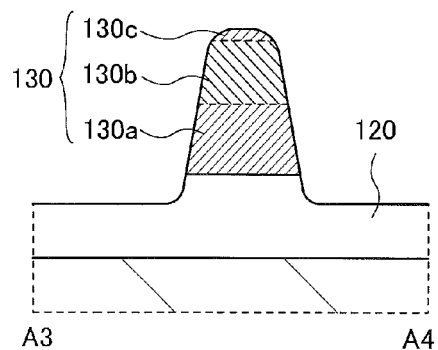

FIG. 20A is a top view of the oxide semiconductor layer 130, and FIGS. 20B and 20C are cross-sectional views of the oxide semiconductor layer 130 with a two-layer structure. FIGS. 20D and 20E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 21A:
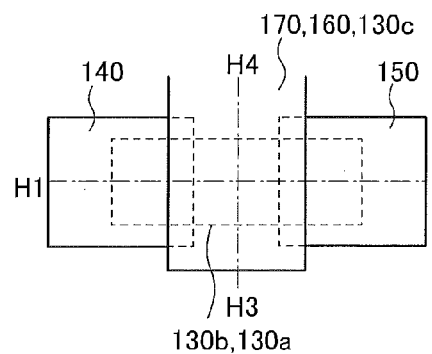
FIGS. 21A to 21F are top views and cross-sectional views illustrating transistors.
Figure 21B:
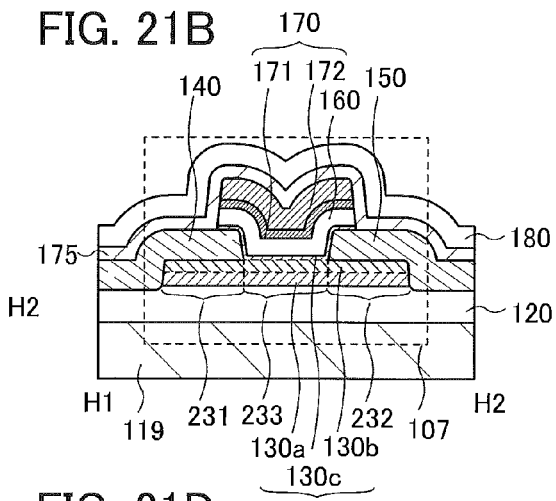
Figure 23A:
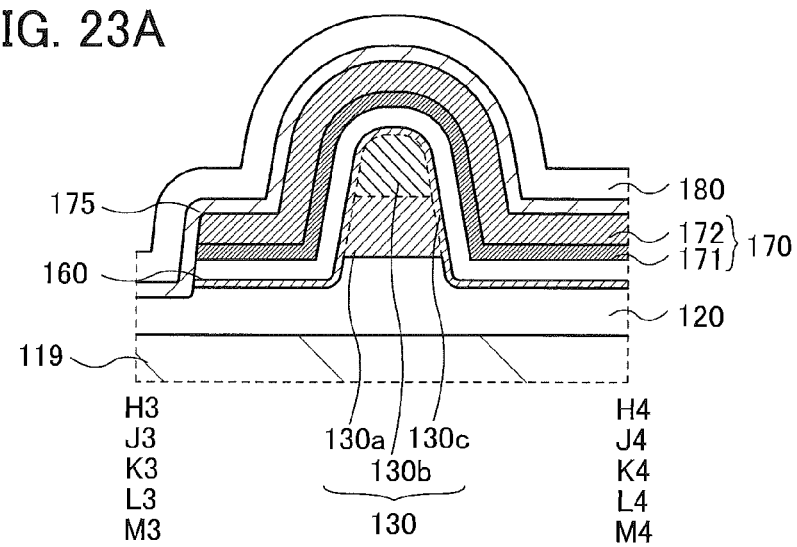
FIGS. 23A to 23D illustrate cross sections of transistors in the channel width direction.

The transistor in one embodiment of the present invention may have a structure illustrated in FIGS. 21A and 21B. FIG. 21A is a top view of a transistor 107. A cross section in the direction of dashed-dotted line H1-H2 in FIG. 21A is illustrated in FIG. 21B. A cross section in the direction of dashed-dotted line H3-H4 in FIG. 21A is illustrated in FIG. 23A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 119; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 21C:
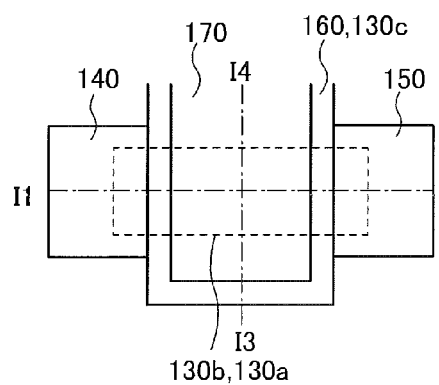
Figure 21D:
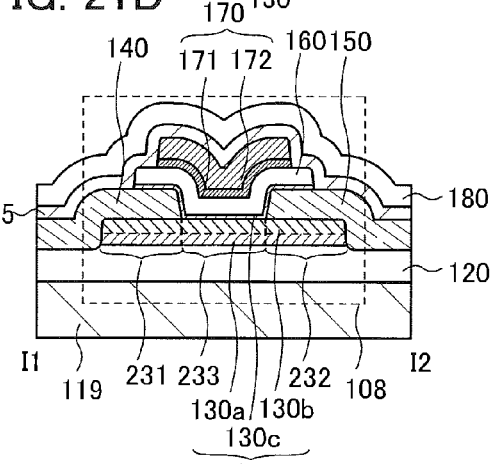
Figure 23B:
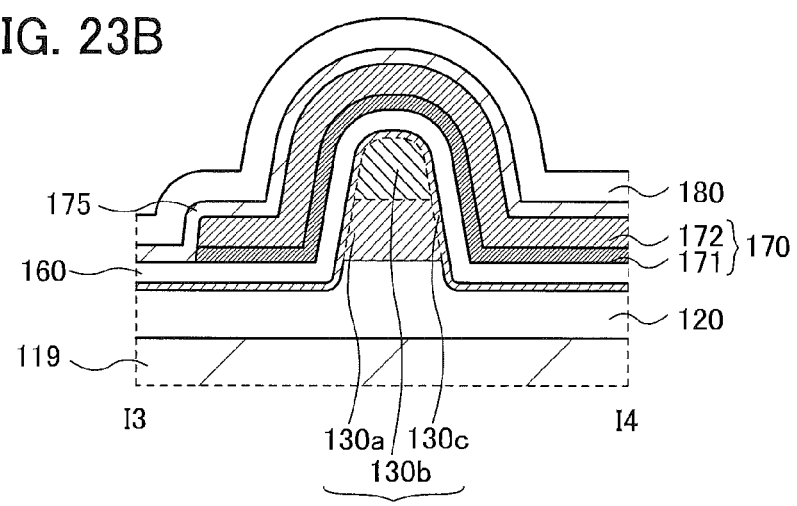

The transistor in one embodiment of the present invention may have a structure illustrated in FIGS. 21C and 21D. FIG. 21C is a top view of a transistor 108. A cross section in the direction of dashed-dotted line I1-I2 in FIG. 21C is illustrated in FIG. 21D. A cross section in the direction of dashed-dotted line I3-I4 in FIG. 21C is illustrated in FIG. 23B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 21E:
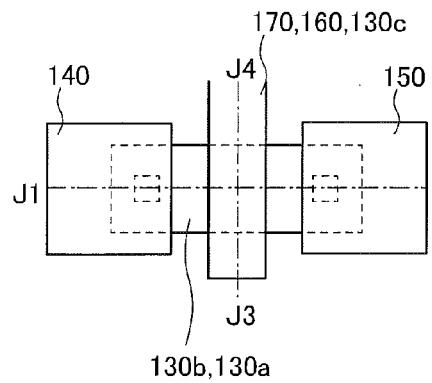
Figure 21F:
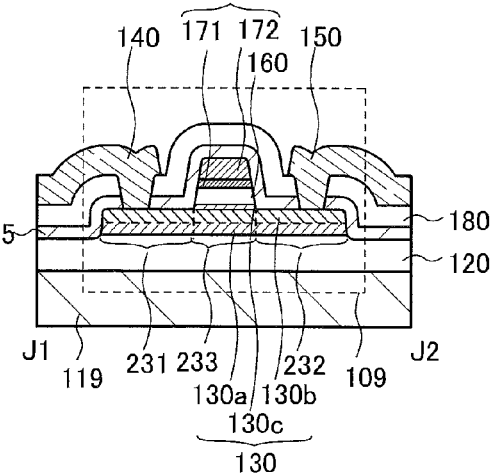

The transistor in one embodiment of the present invention may have a structure illustrated in FIGS. 21E and 21F. FIG. 21E is a top view of a transistor 109. A cross section in the direction of dashed-dotted line J1-J2 in FIG. 21E is illustrated in FIG. 21F. A cross section in the direction of dashed-dotted line J3-J4 in FIG. 21E is illustrated in FIG. 23A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 119; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 22A:
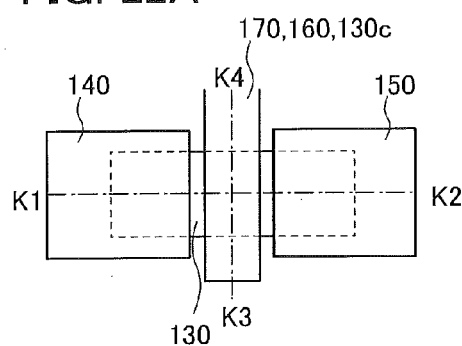
FIGS. 22A to 22F are top views and cross-sectional views illustrating transistors.
Figure 22B:
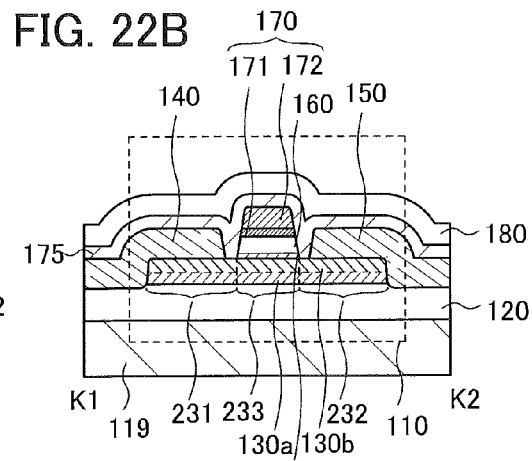

The transistor in one embodiment of the present invention may have a structure illustrated in FIGS. 22A and 22B. FIG. 22A is a top view of a transistor 110. A cross section in the direction of dashed-dotted line K1-K2 in FIG. 22A is illustrated in FIG. 22B. A cross section in the direction of dashed-dotted line K3-K4 in FIG. 22A is illustrated in FIG. 23A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 22C:
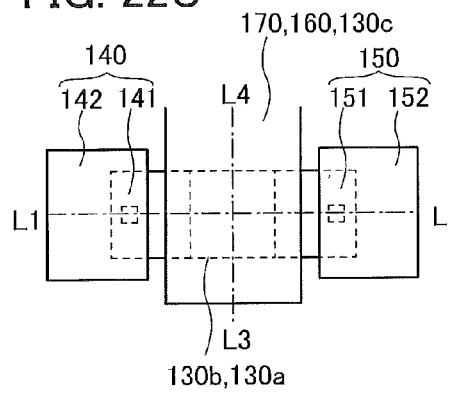
Figure 22D:
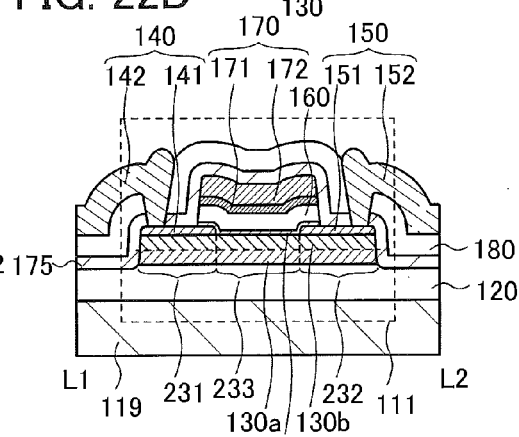

The transistor in one embodiment of the present invention may have a structure illustrated in FIGS. 22C and 22D. FIG. 22C is a top view of a transistor 111. A cross section in the direction of dashed-dotted line L1-L2 in FIG. 22C is illustrated in FIG. 22D. A cross section in the direction of dashed-dotted line L3-L4 in FIG. 22C is illustrated in FIG. 23A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 119; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 22E:
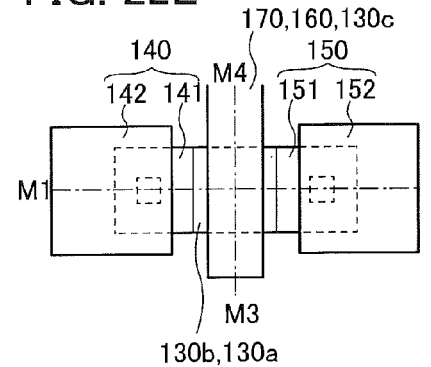
Figure 22F:
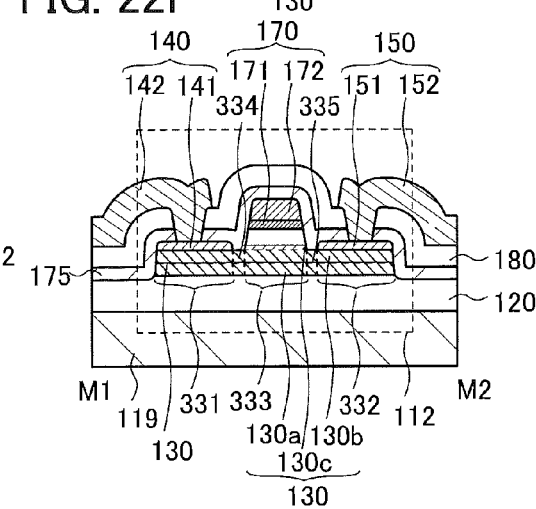

The transistor in one embodiment of the present invention may have a structure illustrated in FIGS. 22E and 22F. FIG. 22E is a top view of a transistor 112. A cross section in the direction of dashed-dotted line M1-M2 in FIG. 22E is illustrated in FIG. 22F. A cross section in the direction of dashed-dotted line M3-M4 in FIG. 22E is illustrated in FIG. 23A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 23C:
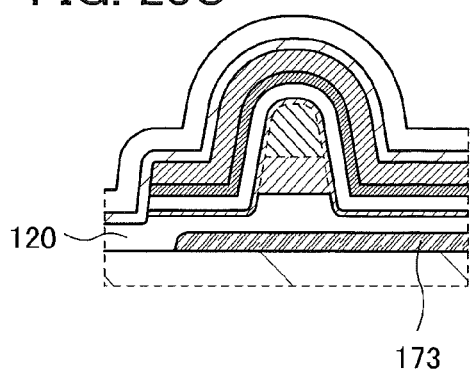
Figure 23D:
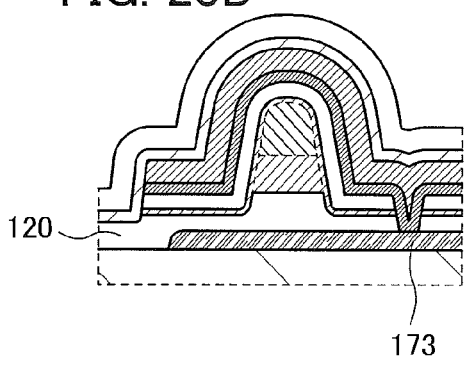

The transistor in one embodiment of the present invention may include the conductive layer 173 between the oxide semiconductor layer 130 and the substrate 119 as illustrated in cross-sectional views in the channel length direction in FIGS. 24A to 24F and cross-sectional views in the channel width direction in FIGS. 23C and 23D. When the conductive layer is used as a second gate electrode layer (back gate), the on-state current can be further increased or the threshold voltage can be controlled. In the cross-sectional views in FIGS. 24A to 24F, the width of the conductive layer 173 may be shorter than that of the oxide semiconductor layer 130. Moreover, the width of the conductive layer 173 may be shorter than that of the conductive layer 170.

Figure 25A:
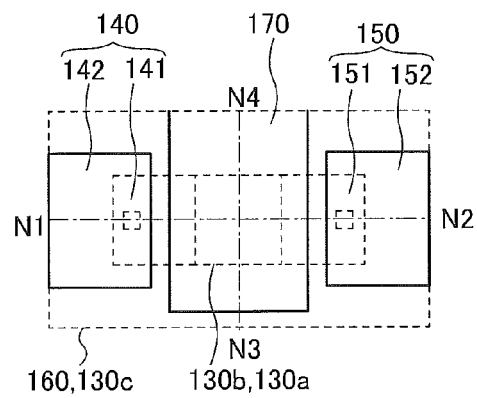
FIGS. 25A to 25E are a top view and cross-sectional views illustrating transistors.
Figure 25B:
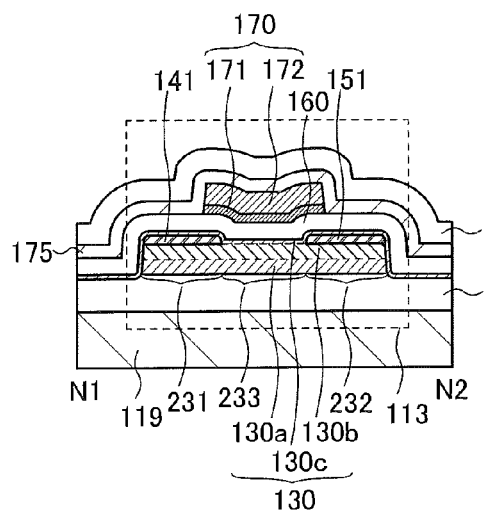
Figure 25C:
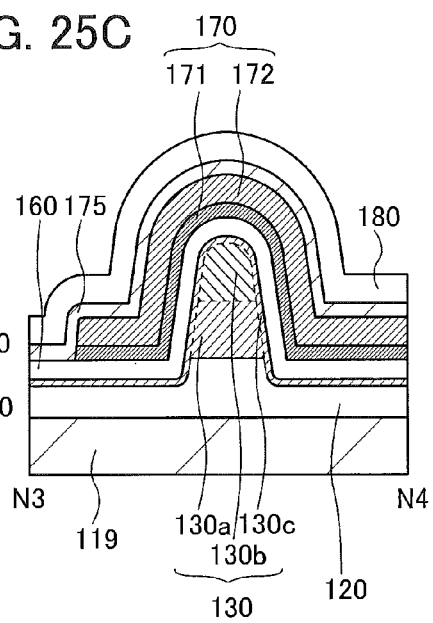

The transistor in one embodiment of the present invention can have a structure illustrated in FIGS. 25A to 25C. FIG. 25A is a top view and FIG. 25B is a cross-sectional view taken along dashed-dotted line N1-N2 in FIG. 25A. FIG. 25C is a cross-sectional view taken along dashed-dotted line N3-N4 in FIG. 25A. Note that for simplification of the drawing, some components are not illustrated in the top view in FIG. 25A.

A transistor 113 has the same structure as the transistor 111 except that the oxide semiconductor layer 130c and the insulating layer 160 cover the conductive layer 141 and the conductive layer 151. With the structure, the oxide semiconductor layer 130c serves as a blocking layer, and thus diffusion of impurities such as hydrogen, water, and halogen from the insulating layer 175 to the oxide semiconductor layer 130b can be reduced. Note that the structure of the transistor 113 can be applied to a transistor having other structure of one embodiment of the present invention.

Figures 25D, 25E:
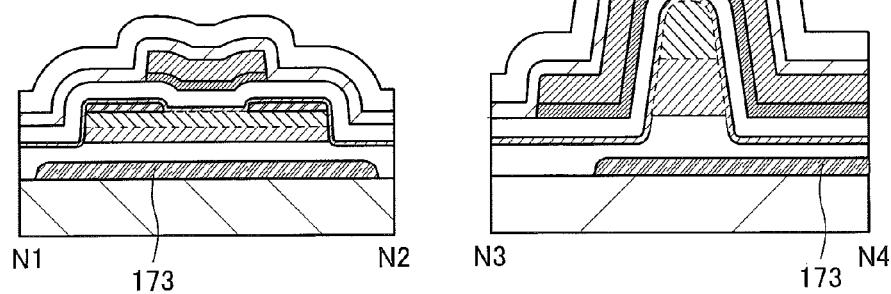

Note that as illustrated in the cross-sectional views of FIGS. 25D and 25E, the conductive layer 173 functioning as a second gate electrode layer (back gate) may be provided between the oxide semiconductor layer 130 and the substrate 119.

The transistor in one embodiment of the present invention can have a structure illustrated in FIGS. 26A to 26C. FIG. 26A is a top view and FIG. 26B is a cross-sectional view taken along dashed-dotted line O1-O2 in FIG. 26A. FIG. 26C is a cross-sectional view taken along dashed-dotted line O3-O4 in FIG. 26A. Note that for simplification of the drawing, some components are not illustrated in the top view in FIG. 26A.

A transistor 114 has the same structure as the transistor 111 except that side surfaces of the oxide semiconductor layer 130a, the oxide semiconductor layer 130b, the conductive layer 141, and the conductive layer 151 are not in contact with the insulating layer 175. That is, the side surfaces of the oxide semiconductor layer 130a, the oxide semiconductor layer 130b, the conductive layer 141, and the conductive layer 151 are in contact with the insulating layer 180.

With the structure, oxygen contained in the insulating layer 180 can be supplied efficiently to the oxide semiconductor layer 130b while the insulating layer 175 can prevent the conductive layer 170 from being oxidized.

Note that as illustrated in the cross-sectional views of FIGS. 26D and 26E, the conductive layer 173 functioning as the second gate electrode layer (back gate) may be provided between the oxide semiconductor layer 130 and the substrate 119.

The transistor in one embodiment of the present invention can have a structure illustrated in FIGS. 27A to 27C. FIG. 27A is a top view and FIG. 27B is a cross-sectional view taken along dashed-dotted line P1-P2 in FIG. 27A. FIG. 27C is a cross-sectional view taken along dashed-dotted line P3-P4 in FIG. 27A. Note that for simplification of the drawing, some components are not illustrated in the top view in FIG. 27A.

A transistor 115 illustrated in FIGS. 27A to 27C includes the substrate 119, the insulating layer 120 over the substrate 119, the oxide semiconductor layer 130 (the oxide semiconductor layer 130a, the oxide semiconductor layer 130b, and the oxide semiconductor layer 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening that is provided in an insulating layer 190 over the transistor 115 and reaches the oxide semiconductor layers 130a and 130b. For the insulating layer 190, a material similar to that of the insulating layer 180 can be used, for example.

The transistor 115 has a smaller region in which a conductor serving as a source electrode or a drain electrode overlaps with a conductor serving as a gate electrode than the other transistors described above; thus, the parasitic capacitance in the transistor 115 can be reduced. Therefore, the transistor 115 is suitable for a component of a circuit for which high-speed operation is needed. As illustrated in FIG. 27B, a top surface of the transistor 115 is preferably planarized by a chemical mechanical polishing (CMP) method or the like, but is not necessarily planarized.

Note that as illustrated in the cross-sectional views of FIGS. 27D and 27E, the conductive layer 173 functioning as the second gate electrode layer (back gate) may be provided between the oxide semiconductor layer 130 and the substrate 119.

The transistor in one embodiment of the present invention can have a structure illustrated in FIGS. 28A to 28C. FIG. 28A is a top view and FIG. 28B is a cross-sectional view taken along dashed-dotted line Q1-Q2 in FIG. 28A. FIG. 28C is a cross-sectional view taken along dashed-dotted line Q3-Q4 in FIG. 28A. Note that for simplification of the drawing, some components are not illustrated in the top view in FIG. 28A.

A transistor 116 has the same structure as the transistor 115 except that an oxide semiconductor layer 130d is formed in contact with the insulating layer 120, the oxide semiconductor layer 130a, the oxide semiconductor layer 130b, the oxide semiconductor layer 130c, the conductive layer 140, and the conductive layer 150, and the insulating layer 190 is formed in contact with the oxide semiconductor layer 130c and the oxide semiconductor layer 130d. For the oxide semiconductor layer 130d, a material similar to that of the oxide semiconductor layer 130c can be used, for example. With the structure, the oxide semiconductor layer 130d serves as a blocking layer, and thus diffusion of impurities such as hydrogen, water, and halogen from the insulating layer 190 to the oxide semiconductor layer 130b can be reduced.

Note that as illustrated in the cross-sectional views of FIGS. 28D and 28E, the conductive layer 173 functioning as the second gate electrode layer (back gate) may be provided between the oxide semiconductor layer 130 and the substrate 119.

Figure 29A:
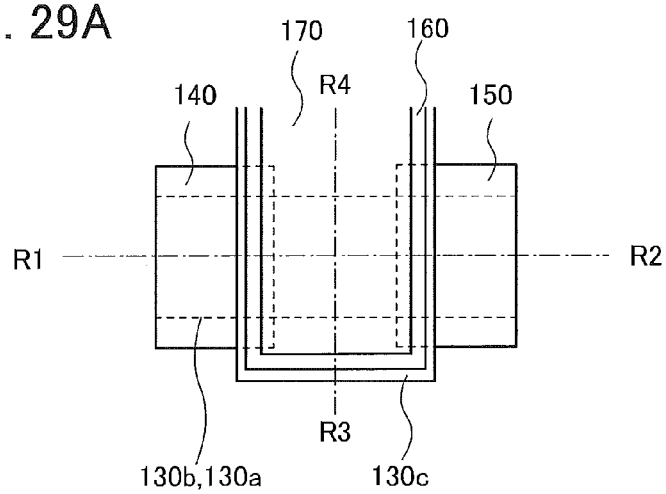
FIGS. 29A to 29E are a top view and cross-sectional views illustrating transistors.
Figure 29B:
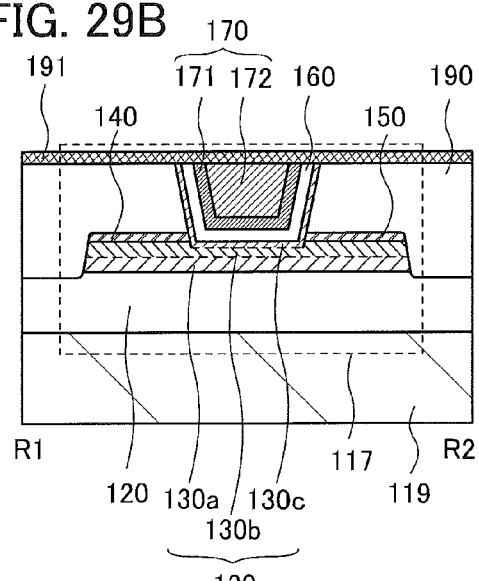
Figure 29C:
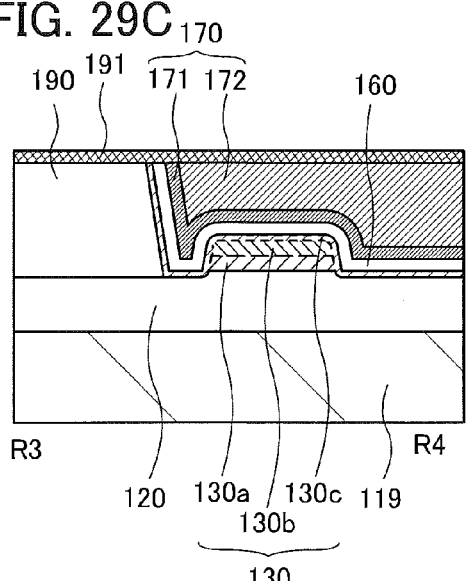

The transistor in one embodiment of the present invention can have a structure illustrated in FIGS. 29A to 29C. FIG. 29A is a top view and FIG. 29B is a cross-sectional view taken along dashed-dotted line R1-R2 in FIG. 29A. FIG. 29C is a cross-sectional view taken along dashed-dotted line R3-R4 in FIG. 29A. Note that for simplification of the drawing, some components are not illustrated in the top view in FIG. 29A.

A transistor 117 has the same structure as the transistor 115 except that an insulating layer 191 is provided to cover the oxide semiconductor layer 130c, the insulating layer 160, the conductive layer 170, and the insulating layer 190. For the insulating layer 191, a material similar to that of the insulating layer 175 can be used, for example. With the structure, the oxidization of the conductive layer 170 can be prevented. Furthermore, oxygen contained in the insulating layer 190 can be supplied efficiently to the oxide semiconductor layer 130b.

Figure 29D:
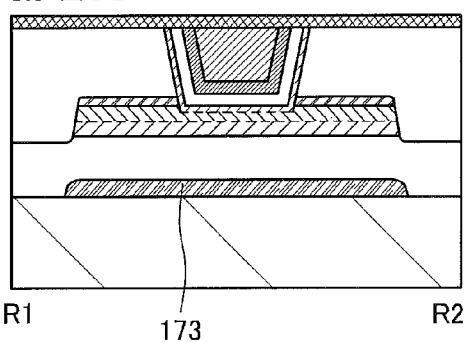
Figure 29E:
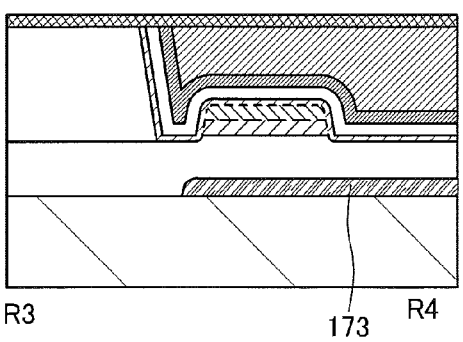

Note that as illustrated in the cross-sectional views of FIGS. 29D and 29E, the conductive layer 173 functioning as the second gate electrode layer (back gate) may be provided between the oxide semiconductor layer 130 and the substrate 119.

Figure 30A:
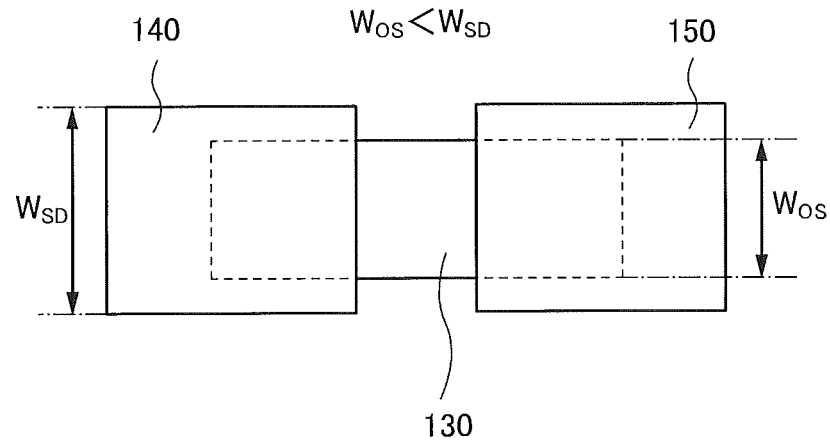
FIGS. 30A to 30C are top views illustrating transistors.
Figure 30B:
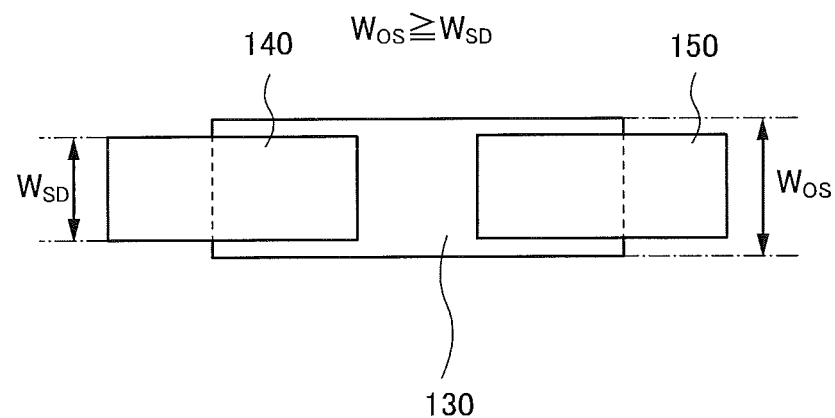
Figure 30C:
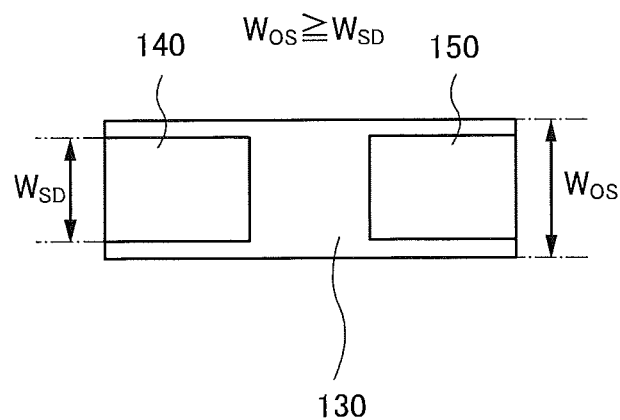

As shown in the top views in FIGS. 30A and 30B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire the oxide semiconductor layer 130, so that electrical characteristics of the transistor can be improved. As illustrated in FIG. 30C, the conductive layers 140 and 150 may be formed only in a region that overlaps with the oxide semiconductor layer 130.

In the transistor in one embodiment of the present invention (any of the transistors 101 to 114), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Thus, increasing the thickness of the oxide semiconductor layer 130b improves the on-state current in some cases.

A semiconductor device using a transistor with any of the above structures can have favorable electrical characteristics.

The structure described in this embodiment can be combined with any of the structures described in the other embodiments as appropriate.

Embodiment 3

In this embodiment, components of the transistors described in Embodiment 2 are described in detail.

As the substrate 119, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n-type conductivity is preferably used. Alternatively, an SOI substrate including an n$^-$-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 119. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film in which the amount of released oxygen when converted into oxygen atoms is greater than or equal to $1.0 \times 10^{19}$ atoms/cm$^3$ in TDS analysis. In the TDS analysis, the film surface temperature is higher than or equal to 100° C. and lower than or equal to 700° C., or higher than or equal to 100° C. and lower than or equal to 500° C. In the case where the substrate 119 is provided with another device, the insulating layer 120 also has a function of an interlayer insulating film. In that case, the insulating layer 120 is preferably subjected to planarization treatment such as CMP treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

The oxide semiconductor layer 130 can have a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b are sequentially stacked from the insulating layer 120 side is used. In such a case, the oxide semiconductor layers 130a and 130b can be replaced with each other.

For the oxide semiconductor layer 130b, for example, an oxide semiconductor whose electron affinity (an energy difference between a vacuum level and the conduction band minimum) is higher than those of the oxide semiconductor layers 130a and 130c is used.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer such as Al, Ga, Y, or Sn in addition to In and Zn.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys or conductive nitrides of any of these metal materials can be used. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack of any of the above materials. The insulating layer 160 may contain La, N, Zr, or the like as an impurity.

An example of a stacked-layer structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have a larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film that releases ammonia more than nitrogen oxide in TDS; the amount of released ammonia is typically greater than or equal to $1 \times 10^{18}$ cm$^{-3}$ and less than or equal to $5 \times 10^{19}$ cm$^{-3}$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the conductive layer 170, an oxide conductive layer of an In—Ga—Zn oxide, zinc oxide, indium oxide, tin oxide, indium tin oxide, or the like may be used.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, miniaturization of a transistor tends to cause deterioration of electrical characteristics of the transistor. For example, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source gas that is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide)hafnium) are used.

For example, in the case where an aluminum oxide film is formed by a deposition apparatus using ALD, two kinds of gases, i.e., $H_2O$ as an oxidizer and a source gas that is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O layer is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas that is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structure described in this embodiment can be combined with any of the structures described in the other embodiments as appropriate.

Embodiment 4

In this embodiment, the material of an oxide semiconductor that can be used for one embodiment of the present invention is described.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor according to the present invention are described with reference to FIGS. 31A, 31B, and 31C. Note that the proportion of oxygen atoms is not shown in FIGS. 31A to 31C. The terms of the atomic ratio of indium, the element M, and zinc contained in the oxide semiconductor are denoted by [In], [M], and [Zn], respectively.

Figure 31A:
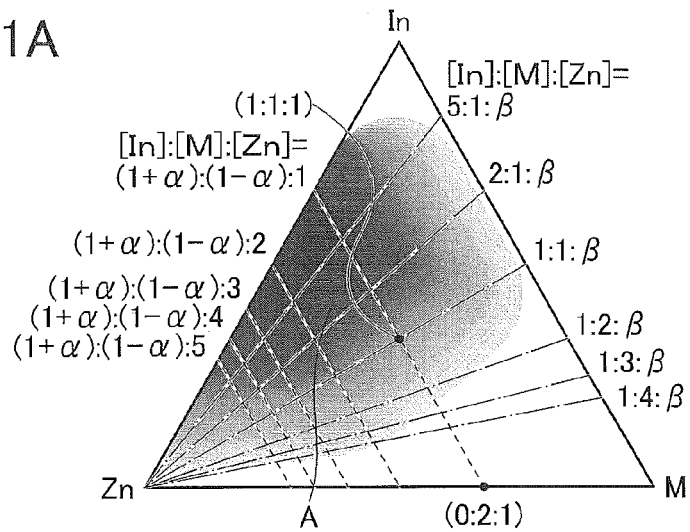
FIGS. 31A to 31C each show the range of the atomic ratio of an oxide semiconductor.
Figure 31B:
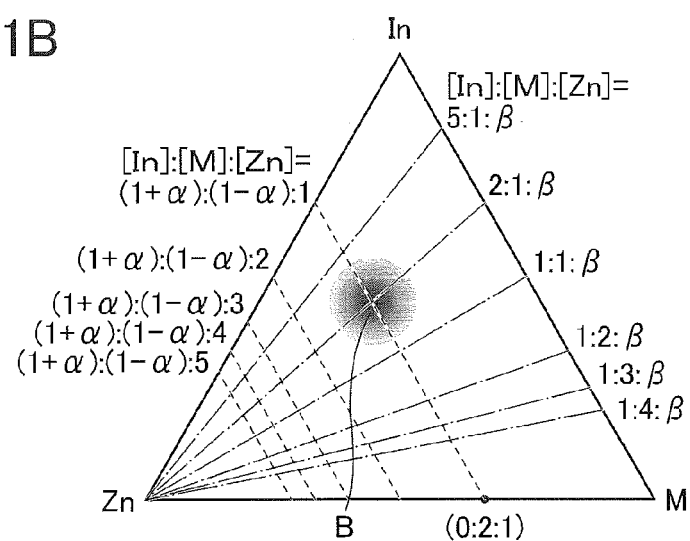
Figure 31C:
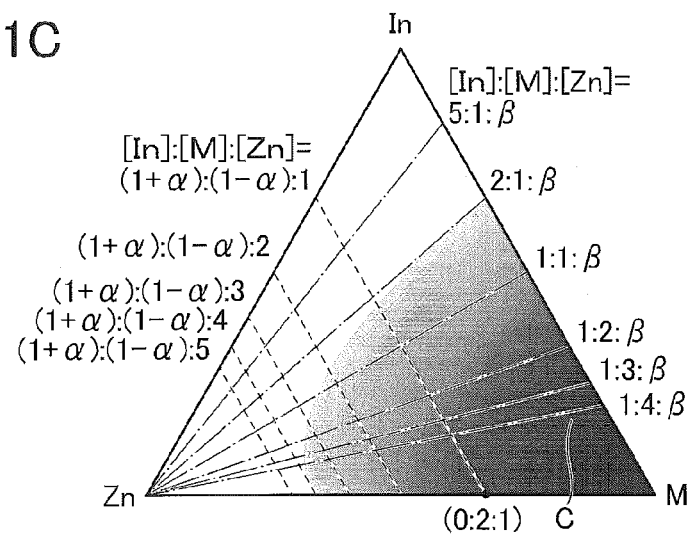

In FIGS. 31A to 31C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The oxide semiconductor illustrated in FIGS. 31A to 31C with an atomic ratio of [In]:[M]:[Zn]=0:2:1 or an atomic ratio that is in the neighborhood is likely to have a spinel crystal structure.

FIGS. 31A and 31B show examples of the preferred ranges of the atomic ratio of indium, the element M, and zinc contained in an oxide semiconductor of one embodiment of the present invention.

Figure 32:
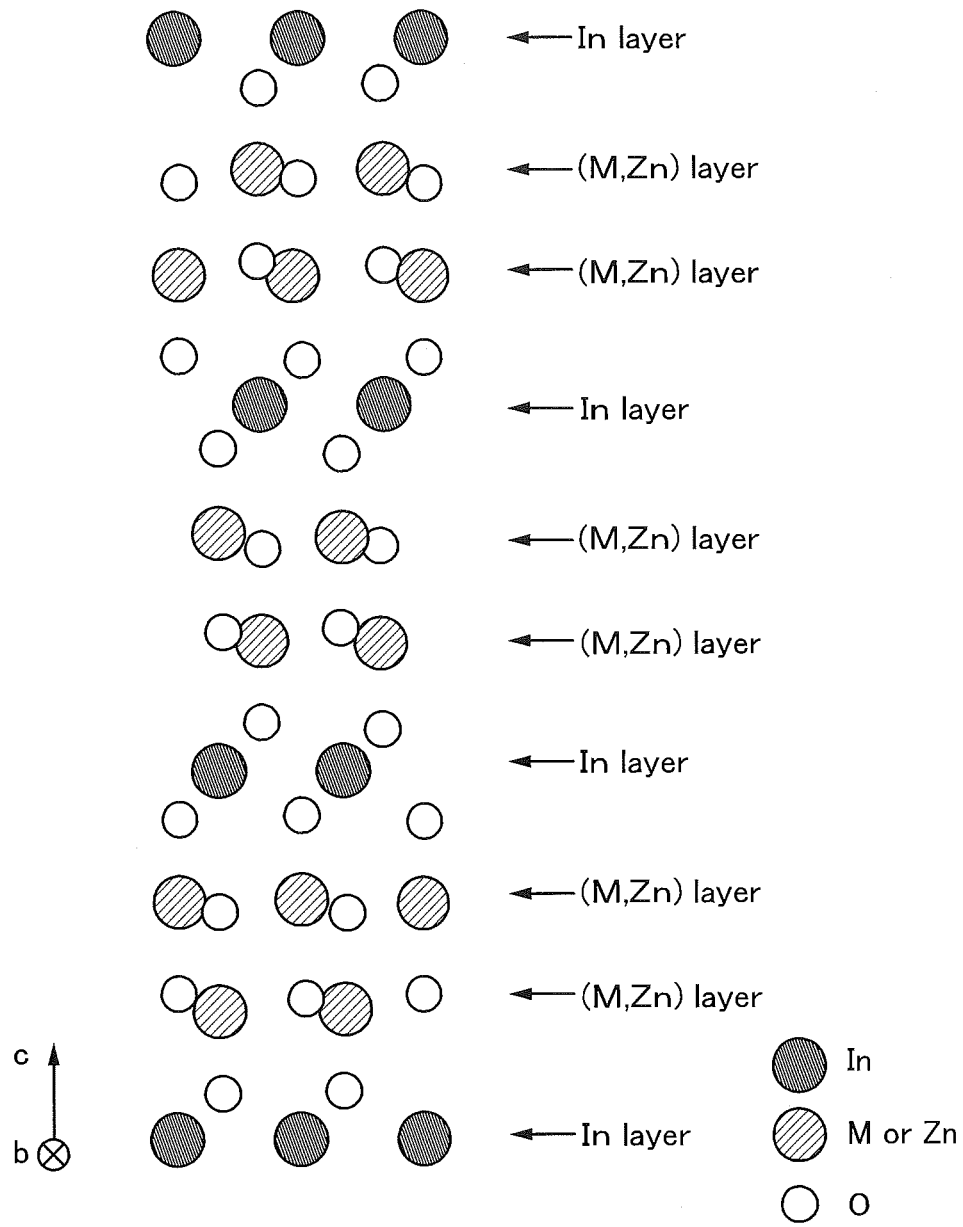
FIG. 32 illustrates a crystal of $InMZnO_4$.

FIG. 32 shows an example of the crystal structure of $InMZnO_4$ whose atomic ratio [In]:[M]:[Zn] is 1:1:1. Note that FIG. 32 illustrates the crystal structure of $InMZnO_4$ observed from a direction parallel to a b-axis. Note that a metal element in a layer that contains M, Zn, and oxygen (hereinafter, referred to as an "(M,Zn) layer") in FIG. 32 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter, referred to as an In layer) for every two (M,Zn) layers that contain the element M, zinc, and oxygen, as illustrated in FIG. 32.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 31C), insulation performance becomes better.

Accordingly, an oxide semiconductor of one embodiment of the present invention preferably has an atomic ratio represented by a region A in FIG. 31A. With the atomic ratio, a layered structure with high carrier mobility and a few grain boundaries is easily obtained.

A region B in FIG. 31B represents an atomic ratio of [In]:[M]:[Zn]=4:2:3 to 4:1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, the transistor whose channel region is formed in the oxide semiconductor having a high density of trap states has unstable electrical characteristics in some cases.

In order to obtain stable electrical characteristics of the transistor, it is effective to reduce the concentration of impurities in the oxide semiconductor. In order to reduce the concentration of impurities in the oxide semiconductor, the concentration of impurities in a film that is adjacent to the oxide semiconductor is preferably reduced. As examples of the impurities, hydrogen, nitrogen, alkali metal, alkaline earth metal, iron, nickel, silicon, and the like are given.

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally on. Therefore, it is preferable to reduce the concentration of alkali metal or alkaline earth metal of the oxide semiconductor. Specifically, the oxide semiconductor is formed to have a region where the concentration of alkali metal or alkaline earth metal measured by SIMS is controlled to be lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible. For example, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on. Accordingly, it is preferable that hydrogen in the oxide semiconductor be reduced as much as possible. Specifically, the hydrogen concentration of the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

Next, the case where the oxide semiconductor has a two-layer structure or a three-layer structure is described. A band diagram of a stacked-layer structure of an oxide semiconductor S1, an oxide semiconductor S2, and an oxide semiconductor S3 and insulators that are in contact with the stacked-layer structure and a band diagram of a stacked-layer structure of the oxide semiconductor S2 and the oxide semiconductor S3 and insulators that are in contact with the stacked-layer structure are described with reference to FIGS. 33A and 33B. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 33A:
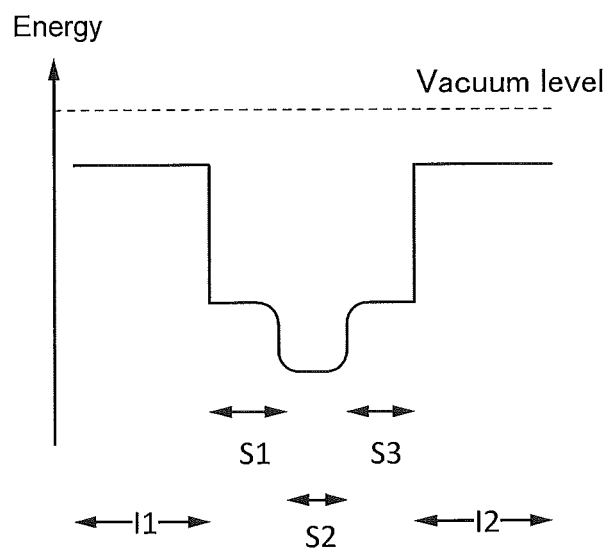
FIGS. 33A and 33B are each a band diagram of a stacked-layer structure of oxide semiconductors.
Figure 33B:
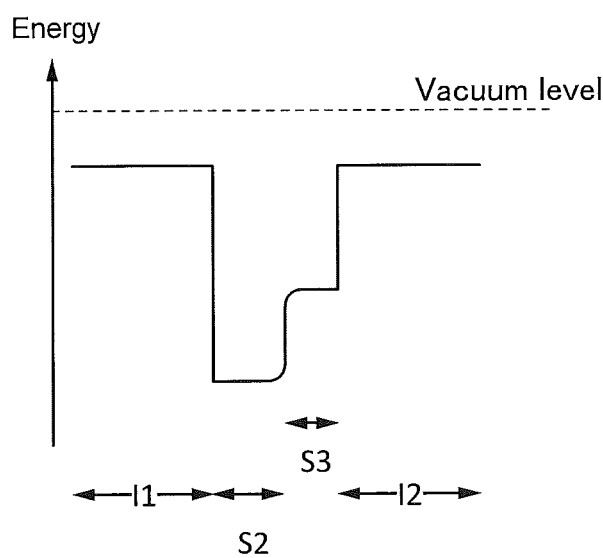

FIG. 33A is an example of a band diagram of a stacked structure of an insulator I1, the oxide semiconductor S1, the oxide semiconductor S2, the oxide semiconductor S3, and an insulator I2 in a film thickness direction. FIG. 33B is an example of a band diagram of a stacked structure of the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinity of each of the oxide semiconductors S1 and S3, and the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As illustrated in FIGS. 33A and 33B, the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 31C can be used as the oxide semiconductors S1 and S3. Note that the region C in FIG. 31C represents the atomic ratio of [In]:[M]:[Zn]=0:1:0 or the vicinity thereof.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

The structure described in this embodiment can be combined with any of the structures described in the other embodiments as appropriate.

Embodiment 5

The structure of an oxide semiconductor that can be used for one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle formed between two straight lines is greater than or equal to 85° and less than or equal to 95°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

First, a CAAC-OS is described.

A CAAC-OS is one of oxide semiconductors having a plurality of c-axis aligned crystal parts (also referred to as pellets).

Figure 34A:
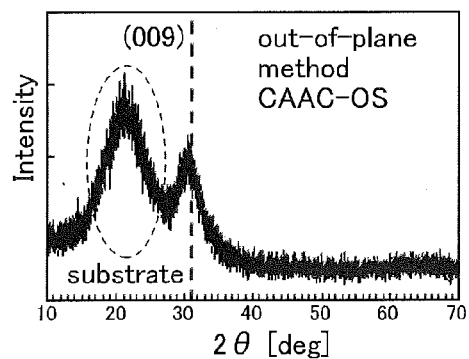
FIGS. 34A to 34E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31 as illustrated in FIG. 34A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure classified into the space group Fd-3m. Therefore, it is preferred that the CAAC-OS do not show the peak at a $2\theta$ of around 36°.

Figure 34B:
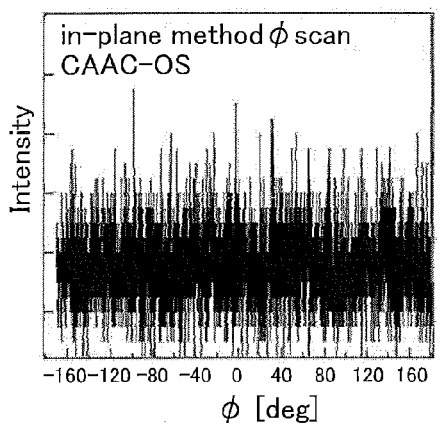
Figure 34C:
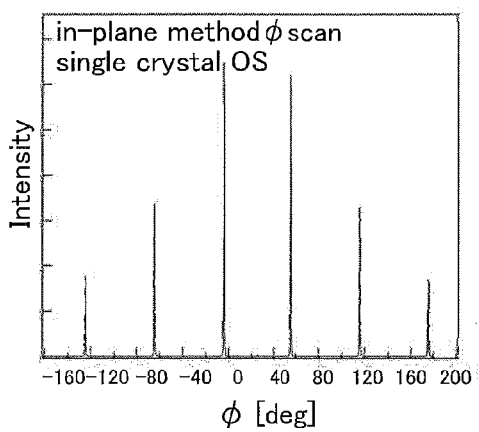

On the other hand, in structural analysis of the CAAC-OS by an in-plane method in which an X-ray is incident on the CAAC-OS in a direction parallel to the formation surface, a peak appears at a $2\theta$ of around 56°. This peak is attributed to the (110) plane of the $InGaZnO_4$ crystal. When analysis ($\varphi$ scan) is performed with $2\theta$ fixed at around 56° and with the sample rotated using a normal vector to the sample surface as an axis (0 axis), as illustrated in FIG. 34B, a peak is not clearly observed. In contrast, in the case where single crystal $InGaZnO_4$ is subjected to $\varphi$ scan with $2\theta$ fixed at around 56°, as illustrated in FIG. 34C, six peaks that are derived from crystal planes equivalent to the (110) plane are observed. Accordingly, the structural analysis using XRD shows that the directions of a-axes and b-axes are irregularly oriented in the CAAC-OS.

Figure 34D:
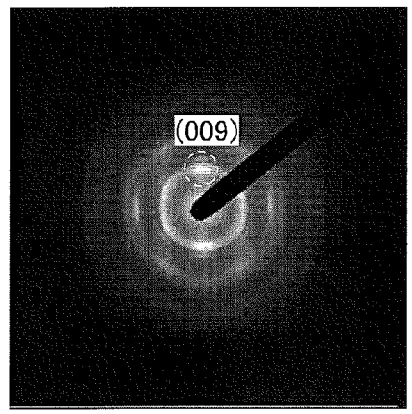
Figure 34E:
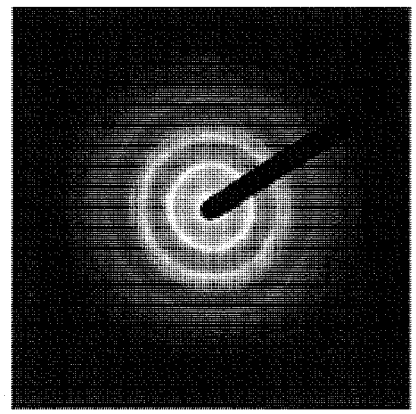

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) illustrated in FIG. 34D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 34E shows a diffraction pattern obtained in such a manner that an electron beam with a probe diameter of 300 nm is incident on the same sample in a direction perpendicular to the sample surface. As illustrated in FIG. 34E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 34E is probably derived from the (010) plane, the (100) plane, and the like of the $InGaZnO_4$ crystal. The second ring in FIG. 34E is probably derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 35A:
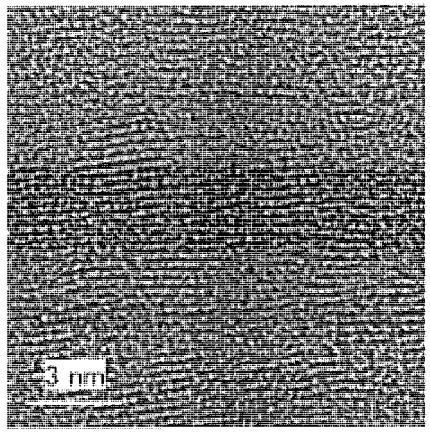
FIGS. 35A to 35E show a cross-sectional TEM image and plan-view TEM images of a CAAC-OS and images obtained through analysis thereof.

FIG. 35A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 35A shows pellets in which metal atoms are arranged in a layered manner. FIG. 35A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 35B:
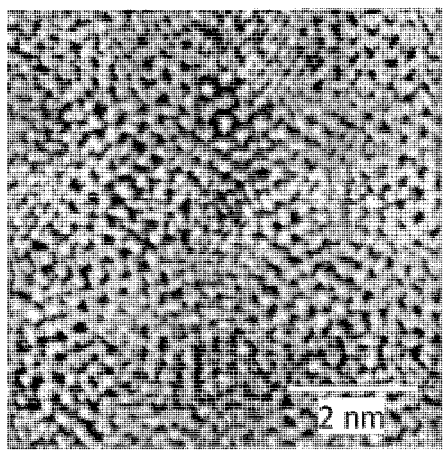
Figure 35C:
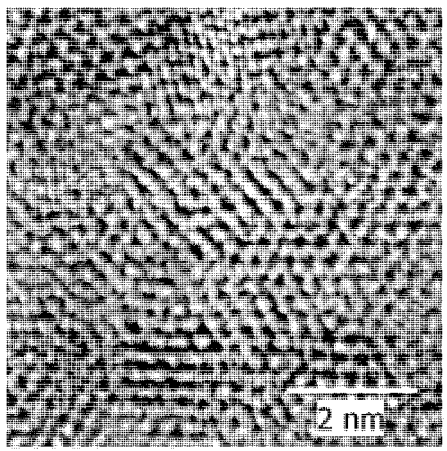
Figure 35D:
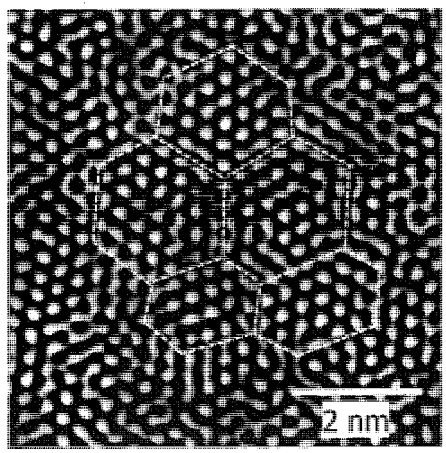
Figure 35E:
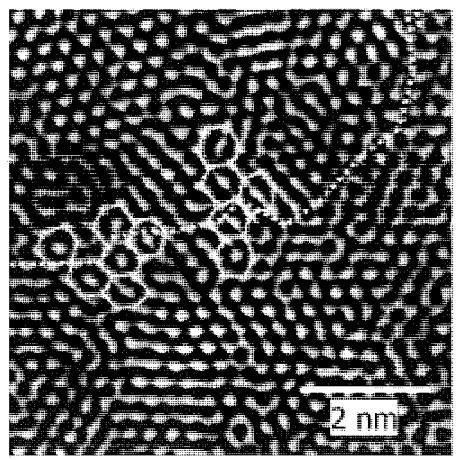

FIGS. 35B and 35C show Cs-corrected high-resolution TEM images of a plane of the CAAC-OS observed from a direction substantially perpendicular to the sample surface. FIGS. 35D and 35E are images obtained through image processing of FIGS. 35B and 35C. The method of image processing is as follows. The image in FIG. 35B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 35D, a portion where a lattice arrangement is broken is shown by a dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 35E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the arrangement of oxygen atoms in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 36A:
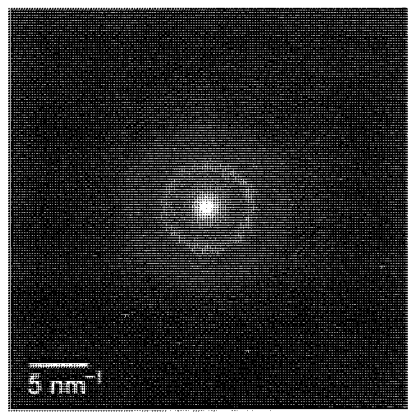
FIGS. 36A to 36D show electron diffraction patterns and a cross-sectional TEM image of an nc-OS.
Figure 36B:
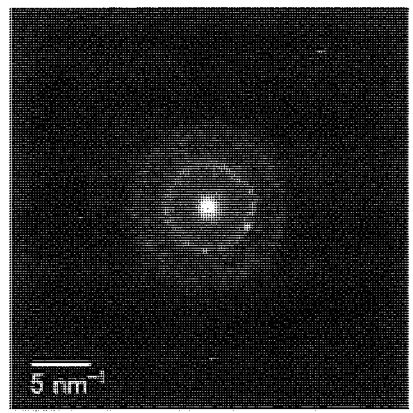

For example, when an electron beam with a probe diameter of 50 nm is incident on a 34-nm-thick region of a thinned nc-OS including an InGaZnO$_4$ crystal in a direction parallel to the formation surface, a ring-shaped diffraction pattern (nanobeam electron diffraction pattern) illustrated in FIG. 36A is observed. FIG. 36B shows a diffraction pattern obtained when an electron beam with a probe diameter of 1 nm is incident on the same sample. As illustrated in FIG. 36B, a plurality of spots are observed in a ring-like region. In other words, ordering in an nc-OS is not observed with an electron beam with a probe diameter of 50 nm but is observed with an electron beam with a probe diameter of 1 nm.

Figure 36C:
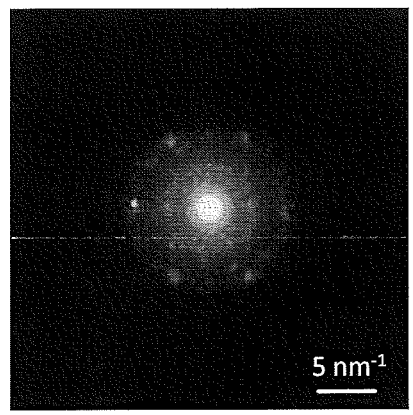

Furthermore, an electron diffraction pattern in which spots are arranged in an approximately regular hexagonal shape is observed in some cases as illustrated in FIG. 36C when an electron beam with a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 36D:
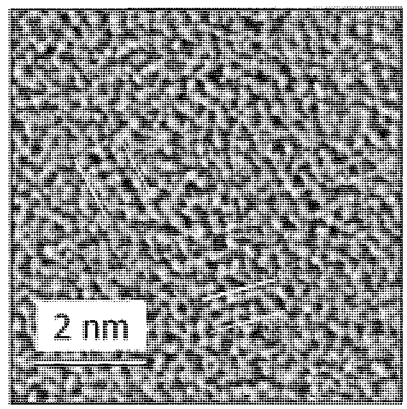

FIG. 36D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 36D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary cannot be clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS is an oxide semiconductor having a structure between those of the nc-OS and the amorphous oxide semiconductor.

FIGS. 37A and 37B are high-resolution cross-sectional TEM images of an a-like OS. FIG. 37A is the high-resolution cross-sectional TEM image of the a-like OS at the start of electron irradiation. FIG. 37B is the high-resolution cross-sectional TEM image of a-like OS after electron (e$^-$) irradiation at $4.3 \times 10^8$ e$^-$/nm$^2$. FIGS. 37A and 37B show that stripe-like bright regions extending vertically are observed in the a-like OS from the start of electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The spacing between these adjacent layers is equivalent to the lattice spacing on the (009) plane (also referred to as d value). The value is calculated to 0.29 nm from crystal structure analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 38:
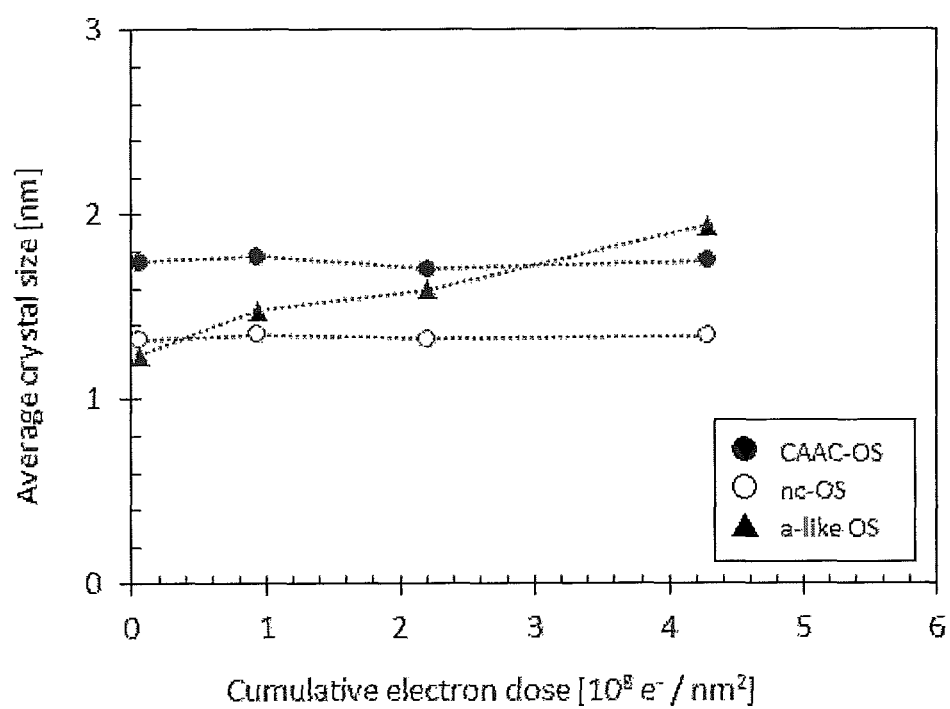
FIG. 38 shows a change of crystal parts of an In—Ga—Zn oxide owing to electron irradiation.

FIG. 38 shows a change in the average size of crystal parts (at 22 to 30 points) in each sample. Note that the crystal part size corresponds to the length of a lattice fringe. FIG. 38 indicates that the crystal part size in the a-like OS increases with an increase in the cumulative electron dose in obtaining TEM images, for example. As illustrated in FIG. 38, a crystal part of approximately 1.2 nm (also referred to as an initial nucleus) at the start of TEM observation grows to a size of approximately 1.9 nm at a cumulative electron (e$^-$) dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e/nm$^2$. As illustrated in FIG. 38, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e$^-$/(nm$^2$·s); and the diameter of the irradiation region was 230 nm.

In this manner, growth of the crystal part in the a-like OS is induced by electron irradiation in some cases. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Next, the carrier density of an oxide semiconductor is described below.

Examples of a factor affecting the carrier density of an oxide semiconductor include oxygen vacancy (V$_O$) and impurities in the oxide semiconductor.

As the amount of oxygen vacancy in the oxide semiconductor increases, the density of defect states increases when hydrogen is bonded to the oxygen vacancy (this state is also referred to as V$_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region is described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the I$_d$–V$_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The structure described in this embodiment can be combined with any of the structures described in the other embodiments as appropriate.

Embodiment 6

Described below is the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1−x0)}$O$_3$(ZnO)$_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS that is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including GaO$_{X3}$ as a main component and a region including In$_{X2}$Zn$_{Y2}$O$_{Z2}$ or InO$_{X1}$ are unevenly distributed and mixed.

The CAC-OS has a structure different from that of an IGZO compound in which metal elements are evenly distributed, and has characteristics different from those of the IGZO compound. That is, in the CAC-OS, regions including GaO$_{X3}$ or the like as a main component and regions including In$_{X2}$Zn$_{Y2}$O$_{Z2}$ or InO$_{X1}$ as a main component are separated to form a mosaic pattern.

The conductivity of a region including In$_{Z2}$Zn$_2$O$_{Z2}$ or InO$_{X1}$ as a main component is higher than that of a region including GaO$_{X3}$ or the like as a main component. In other words, when carriers flow through regions including $In_{x2}Zn_{y2}O_{Z2}$ or $InO_{X1}$ as a main component, the conductivity of an oxide semiconductor is exhibited. Accordingly, when regions including $In_{x2}Zn_{y2}O_{Z2}$ or $InO_{X1}$ as a main component are distributed in an oxide semiconductor like a cloud, high field-effect mobility (g) can be achieved.

In contrast, the insulating property of a region including $GaO_{X3}$ or the like as a main component is higher than that of a region including $In_{x2}Zn_{y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{x2}Zn_{y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

The structure described in this embodiment can be combined with any of the structures described in the other embodiments as appropriate.

Embodiment 7

In this embodiment, examples of a package and a camera module each including an image sensor chip are described. For the image sensor chip, the structure of an imaging device of one embodiment of the present invention can be used.

Figure 39A:
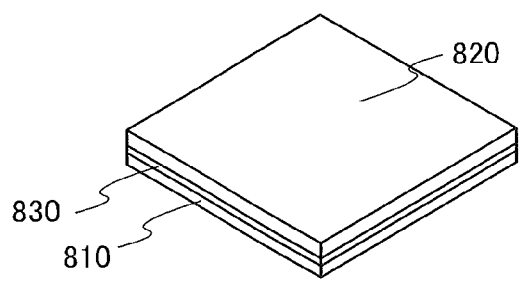
FIGS. 39A to 39D are perspective views and a cross-sectional view of a package including an imaging device.

FIG. 39A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 39B:
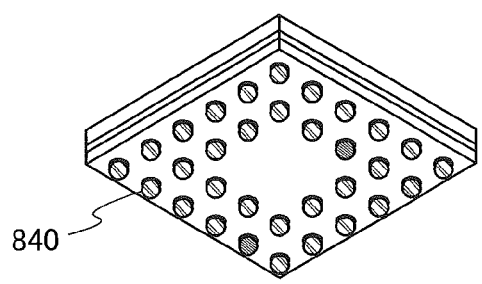

FIG. 39B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 39C:
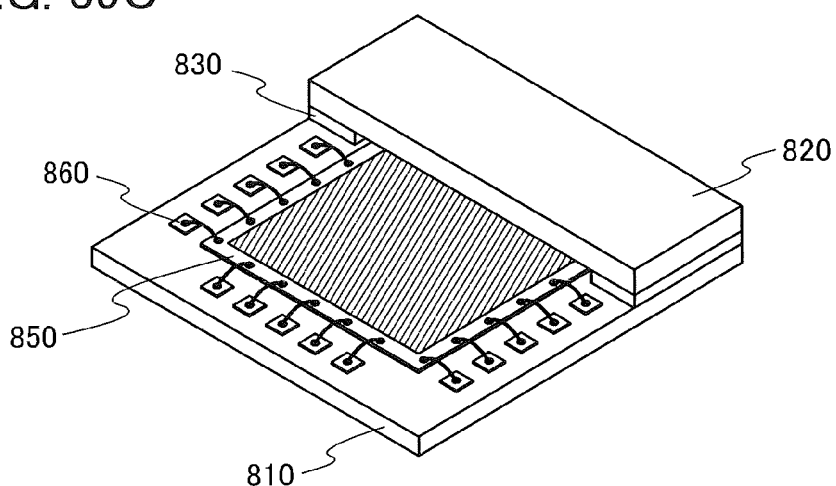
Figure 39D:
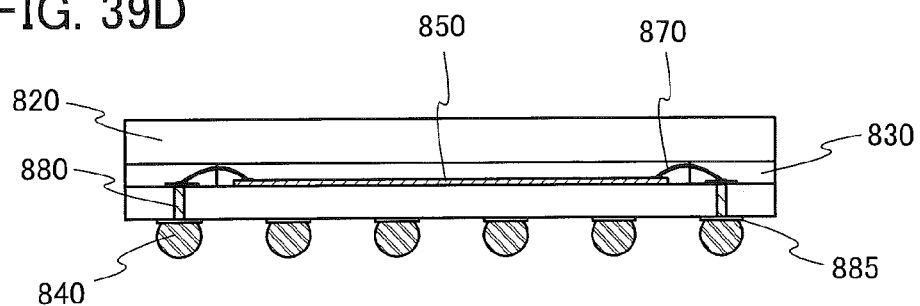

FIG. 39C is a perspective view of the package, in which the cover glass 820 and the adhesive 830 are partly illustrated. FIG. 39D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 40A:
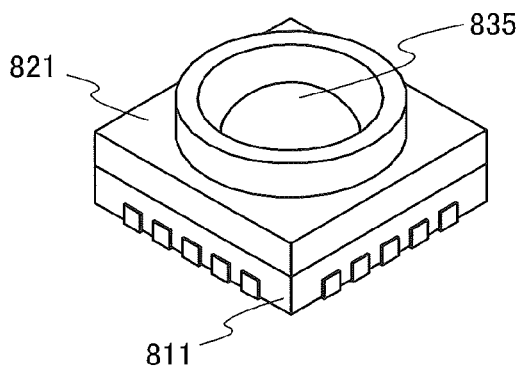
FIGS. 40A to 40D are perspective views and a cross-sectional view of a package including an imaging device.

FIG. 40A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 40B:
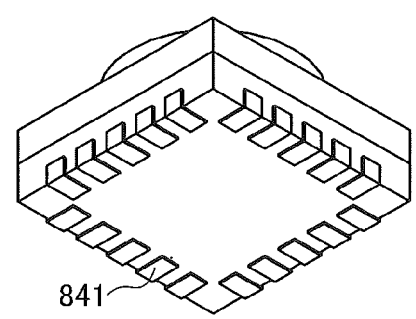

FIG. 40B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

Figure 40C:
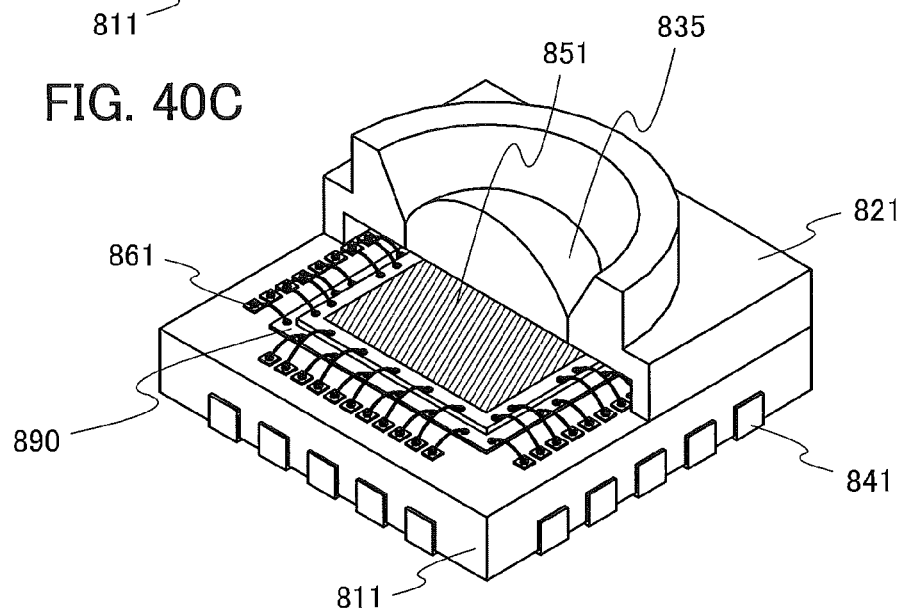
Figure 40D:
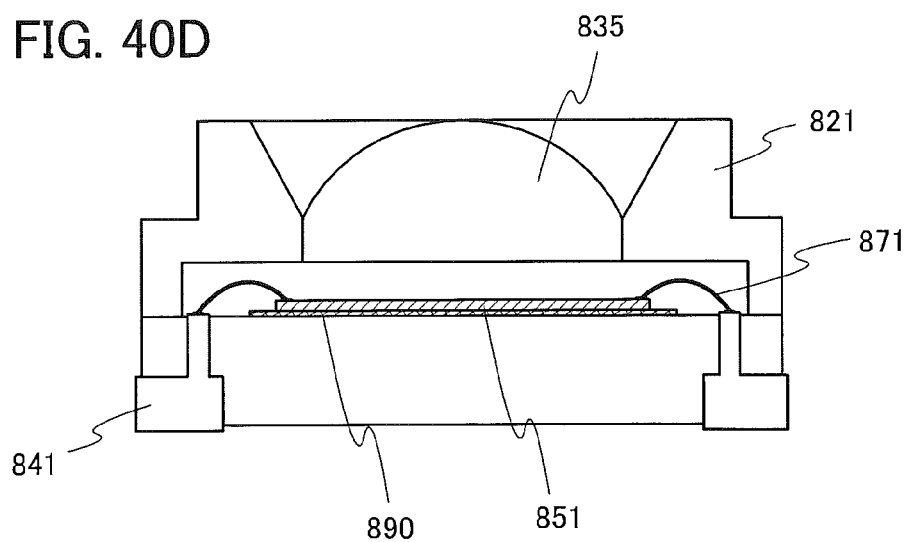

FIG. 40C is a perspective view of the module, in which the lens cover 821 and the lens 835 are partly illustrated. FIG. 40D is a cross-sectional view of the camera module. The lands 841 are partly used as electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of semiconductor devices and electronic devices.

The structure described in this embodiment can be combined with any of the structures described in the other embodiments as appropriate.

Embodiment 8

Examples of an electronic device that can use the imaging device according to one embodiment of the present invention, a display device, and a semiconductor device including both of them include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 41A to 41F illustrate specific examples of these electronic devices.

Figure 41A:
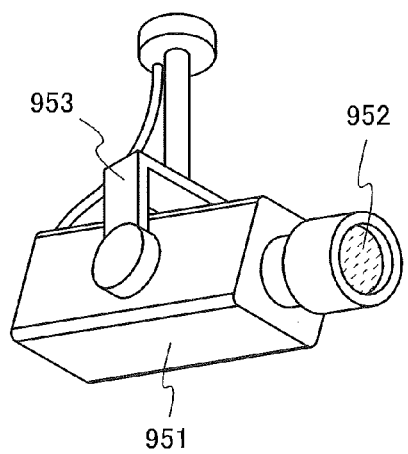
FIGS. 41A to 41F illustrate electronic devices.

FIG. 41A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 41B:
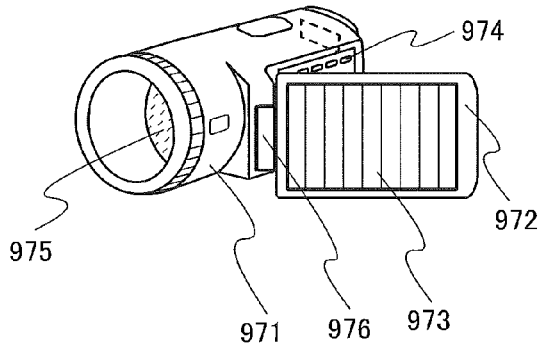

FIG. 41B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 41C:
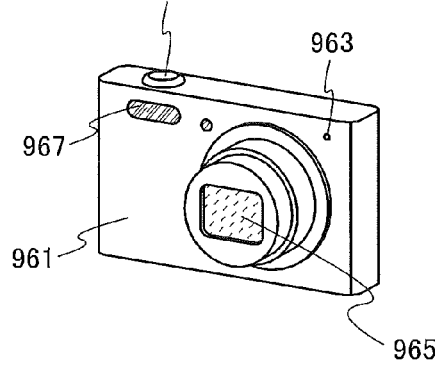

FIG. 41C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 41D:
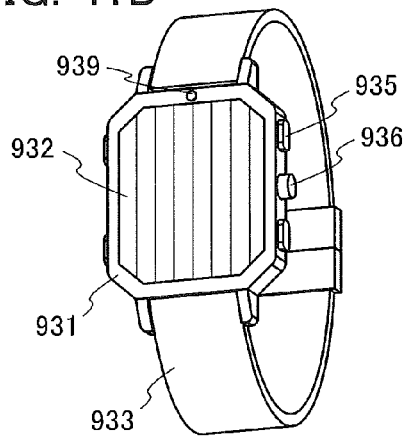

FIG. 41D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 41E:
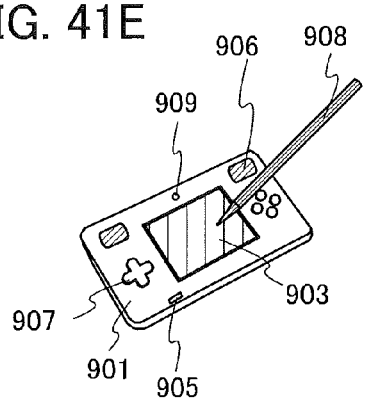

FIG. 41E illustrates a portable game machine, which includes a housing 901, a display portion 903, a microphone 905, speakers 906, an operation key 907, a stylus 908, a camera 909, and the like. Although the portable game machine in FIG. 41E has one display portion, the number of display portions included in a portable game machine is not limited to this. The imaging device of one embodiment of the present invention can be included as one component for obtaining an image in the portable game machine.

Figure 41F:
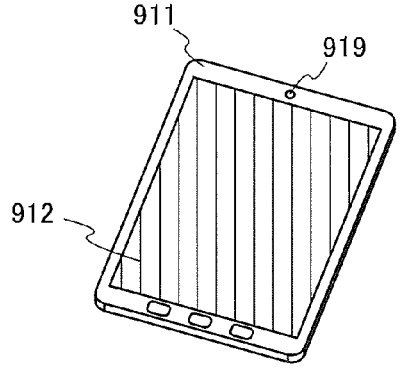

FIG. 41F illustrates a portable data terminal, which includes a housing 911, a display portion 912, a camera 919, and the like. A touch panel function of the display portion 912 enables input and output of information. The imaging device of one embodiment of the present invention can be included as one component for obtaining an image in the portable data terminal.

This embodiment can be combined with any of the other embodiments in this specification as appropriate.

This application is based on Japanese Patent Application serial No. 2016-019266 filed with Japan Patent Office on Feb. 3, 2016 and Japanese Patent Application serial No. 2016-020908 filed with Japan Patent Office on Feb. 5, 2016, the entire contents of which are hereby incorporated by reference.

What is claimed is:

1. A semiconductor device comprising:
a first layer; and
a second layer,
wherein the first layer comprises a first insulating layer, a second insulating layer, and a first transistor comprising a channel formation region in an oxide semiconductor layer,
wherein the first transistor is provided between the first insulating layer and the second insulating layer,
wherein the first transistor comprises a first conductive layer in contact with the oxide semiconductor layer,
wherein the second layer comprises a photodiode, and
wherein the first conductive layer is electrically connected to one of a cathode and an anode of the photodiode via a first conductor that penetrates the first insulating layer, the first conductive layer, and the second insulating layer.

2. The semiconductor device according to claim 1, wherein the photodiode is provided in a single crystal silicon substrate.

3. The semiconductor device according to claim 1, further comprising a third layer,
wherein the third layer comprises a third insulating layer, a fourth insulating layer, and a second transistor comprising silicon in a channel formation region,
wherein a top surface of a gate of the first transistor faces a top surface of a gate of the second transistor,
wherein a second conductive layer is embedded in the third insulating layer,
wherein a source, a drain, or a gate of the second transistor is electrically connected to the second conductive layer via a second conductor that penetrates the fourth insulating layer,
wherein a third conductive layer is provided on a light-receiving surface side of the photodiode in the single crystal silicon substrate, and
wherein the second conductive layer is electrically connected to the third conductive layer via a third conductor that penetrates the first to third insulating layers and the single crystal silicon substrate.

4. The semiconductor device according to claim 3,
wherein the first layer comprises the first transistor, the second transistor, a third transistor, a fourth transistor, a first wiring, and a second wiring,
wherein the first transistor is in a pixel circuit,
wherein the second transistor is in a row driver,
wherein the third transistor is in a column driver,
wherein the fourth transistor is in an analog switch, and
wherein each of the second to fourth transistors comprises a channel formation region in an oxide semiconductor layer.

5. The semiconductor device according to claim 4, further comprising an A/D converter,
wherein the analog switch is electrically connected to the first wiring and the second wiring,
wherein the first wiring is electrically connected to the pixel circuit,
wherein the second wiring is electrically connected to the A/D converter, and
wherein the A/D converter comprises a transistor comprising silicon in a channel formation region.

6. The semiconductor device according to claim 1, wherein the first conductor further penetrates the oxide semiconductor layer.

7. The semiconductor device according to claim 1, wherein the oxide semiconductor layer comprises In, Zn, and M, and
wherein M is at least one of Al, Ga, Y, and Sn.

8. A module comprising:
the semiconductor device according to claim 1; and
a lens.

9. An electronic device comprising:
the semiconductor device according to claim 1; and
a display device.

10. A semiconductor device comprising:
a first transistor;
a photoelectric conversion element;
a first insulating layer; and
a second insulating layer,
wherein the first transistor comprising a channel formation region in an oxide semiconductor layer,
wherein the first transistor is provided between the first insulating layer and the second insulating layer,
wherein the first transistor comprises a first conductive layer in contact with the oxide semiconductor layer, and
wherein the first conductive layer is electrically connected to an electrode of the photoelectric conversion element via a first conductor that penetrates the first insulating layer, the first conductive layer, and the second insulating layer.

11. The semiconductor device according to claim 10, wherein the photoelectric conversion element is provided in a single crystal silicon substrate.

12. The semiconductor device according to claim 10, further comprising a third insulating layer, a fourth insulating layer, and a second transistor comprising silicon in a channel formation region,
wherein a top surface of a gate of the first transistor faces a top surface of a gate of the second transistor,
wherein a second conductive layer is embedded in the third insulating layer,
wherein a source, a drain, or a gate of the second transistor is electrically connected to the second conductive layer via a second conductor that penetrates the fourth insulating layer,
wherein a third conductive layer is provided on a light-receiving surface side of the photoelectric conversion element in the single crystal silicon substrate, and
wherein the second conductive layer is electrically connected to the third conductive layer via a third conductor that penetrates the first to third insulating layers and the single crystal silicon substrate.

13. The semiconductor device according to claim 12, further comprising a third transistor, a fourth transistor, a first wiring, and a second wiring,
  wherein the first transistor is in a pixel circuit,
  wherein the second transistor is in a row driver,
  wherein the third transistor is in a column driver,
  wherein the fourth transistor is in an analog switch, and
  wherein each of the second to fourth transistors comprises a channel formation region in an oxide semiconductor layer.

14. The semiconductor device according to claim 13, further comprising an A/D converter,
  wherein the analog switch is electrically connected to the first wiring and the second wiring,
  wherein the first wiring is electrically connected to the pixel circuit,
  wherein the second wiring is electrically connected to the A/D converter, and
  wherein the A/D converter comprises a transistor comprising silicon in a channel formation region.

15. The semiconductor device according to claim 10,
  wherein the first conductor further penetrates the oxide semiconductor layer.

16. The semiconductor device according to claim 10,
  wherein the oxide semiconductor layer comprises In, Zn, and M, and
  wherein M is at least one of Al, Ga, Y, and Sn.

17. A module comprising:
  the semiconductor device according to claim 10; and
  a lens.

18. An electronic device comprising:
  the semiconductor device according to claim 10; and
  a display device.

* * * * *